United States Patent [19]
Kobayashi et al.

[11] Patent Number: 5,304,533
[45] Date of Patent: Apr. 19, 1994

[54] PROCESS FOR PRODUCING AN OXIDE SUPERCONDUCTOR FROM ALKOXIDES

[75] Inventors: Toshio Kobayashi; Fusaoki Uchikawa; Kenji Nomura; Fumio Fujiwara; Sigeru Matsuno; Masao Morita; Shouichi Yokoyama, all of Amagasaki, Japan

[73] Assignee: Mitsubishi Denki Kabushiki Kaisha, Tokyo, Japan

[21] Appl. No.: 235,551

[22] Filed: Aug. 24, 1988

[30] Foreign Application Priority Data

| Aug. 24, 1987 | [JP] | Japan | 210923 |
| Aug. 24, 1987 | [JP] | Japan | 210924 |
| Aug. 24, 1987 | [JP] | Japan | 210927 |
| Aug. 24, 1987 | [JP] | Japan | 210928 |
| Aug. 24, 1987 | [JP] | Japan | 210929 |
| Aug. 24, 1987 | [JP] | Japan | 210930 |
| Aug. 24, 1987 | [JP] | Japan | 210931 |
| Aug. 24, 1987 | [JP] | Japan | 210933 |
| Aug. 24, 1987 | [JP] | Japan | 210934 |
| Aug. 24, 1987 | [JP] | Japan | 210939 |
| Aug. 24, 1987 | [JP] | Japan | 210946 |
| Mar. 31, 1988 | [JP] | Japan | 81715 |
| Apr. 18, 1988 | [JP] | Japan | 96277 |

[51] Int. Cl.⁵ .............. C01B 33/12; B05D 5/12
[52] U.S. Cl. .................. 505/440; 505/734; 505/735; 505/445; 427/62; 427/126.3; 427/226; 423/593; 423/263; 423/604; 252/521
[58] Field of Search ............ 505/1, 734, 735; 427/62, 63, 126.3, 226; 252/521; 423/593, 263, 604

[56] References Cited

U.S. PATENT DOCUMENTS

| 3,647,374 | 3/1972 | Nomura et al. | 423/630 |
| 4,391,743 | 7/1983 | Maeda et al. | 427/108 |
| 4,636,378 | 1/1987 | Pastor et al. | 423/598 |
| 4,959,347 | 9/1990 | Kobayashi et al. | 505/1 |
| 5,004,720 | 4/1991 | Kobayashi et al. | 505/1 |
| 5,024,991 | 6/1991 | Tsunashima et al. | 505/1 |
| 5,135,907 | 8/1992 | Mazdiyasni et al. | 505/1 |

FOREIGN PATENT DOCUMENTS

| 58-199716 | 11/1983 | Japan . |
| 60-086026 | 5/1985 | Japan . |
| 61-053114 | 3/1986 | Japan . |
| 61-163118 | 7/1986 | Japan . |
| 62-027371 | 2/1987 | Japan . |
| 62-059529 | 3/1987 | Japan . |
| 62-113722 | 5/1987 | Japan . |
| 62-113723 | 5/1987 | Japan . |
| 62-113724 | 5/1987 | Japan . |
| 62-143825 | 6/1987 | Japan . |
| 62-143826 | 6/1987 | Japan . |

OTHER PUBLICATIONS

Maeda et al., "A new high-Tc oxide superconductor without a rare earth element", Jpn. J. Appl. Phys. 27(2) Feb. 1988, pp. L209–L210.

Sheng et al., "New 120K Tl-Ca-Ba-Cu-O superconductor", Appl. Phys. lett. 52(20) May 1988, pp. 1738–1740.

Sakka et al., "Preparation of Superconducting Oxide . . . ", Energy abstract 89(4):20819, Funtai Oyobi Fun. Jul. 25, 1988 35(5) pp. 43–47.

(List continued on next page.)

*Primary Examiner*—Roy King
*Attorney, Agent, or Firm*—Oblon, Spivak, McClelland, Maier & Neustadt

[57] ABSTRACT

A process for producing a superconductor of an oxide system, which comprises uniformly mixing metal elements for constituting the oxide system at least partly in the form of alkoxides having $CN^-$, $X^-$ wherein A is a halogen atom and/or an amine, with the rest, if any, being in the form of acetylacetonates, carboxylates and/or water-soluble inorganic compounds to obtain a homogeneous mixture, and sintering the mixture.

10 Claims, 23 Drawing Sheets

OTHER PUBLICATIONS

Kramer et al., "High Tc Superconducting Films and Powders...", High Temperature Superconductors II, Apr. 9, 1988, pp. 67–68.

Nonaka et al. "Ba–Y–Cu–O Thin Films Fabricated by...", Jpn. J. of Appl. Phy. vol. 27, No. 5, May 1988, pp. L867–L869.

Wu et al., "Snythesis of Superconducting $4Ba_2Cu_3O_7$–x...", High-Temperature Superconductors, Dec. 4, 1987, pp. 395–397.

Brahme et al. "Spectro Scopic Study of High Tc Superconductors...", High Temperature Superconductors II Apr. 9, 1988, pp. 289–291.

Uchikawa et al., "Fabrication of $YBa_2Cu_3O_7$–x Fibers nsing...", High Temperature Superconductors II Apr. 9, 1988, pp. 89–92.

Bradley et al., "Metal Alkoxides", 1978 Academic Press, New York, Chapter 6, pp. 334–339.

Johnston, "Metal Alkoxides For Sol–gel Applications", Dynamit Nobel Chemicals, pp. 1–13, Sep. 6, 1987.

Zeitschrift Fur Physik B–Condensed Matter vol. 64, pp. 189–193, 1986, J. G. Bednorz and K. A. Muller.

Japanese Journal of Applied Physics vol. 26, No. 3, Mar. 1987, pp. L196–L197 High-Tc Superconductivity of La–Ba (Sr)–Cu Oxides.

Japanese Journal of Applied Physics vol. 26, No. 4, Apr. 1987, pp. L314–L315 High Transition Temperature Superconductor.

PROCESS FOR PRODUCING AN OXIDE SUPERCONDUCTOR FROM ALKOXIDES

BACKGROUND OF THE INVENTION

1. FIELD OF THE INVENTION

The present invention relates to a process for producing a superconductor of an oxide system.

2. DISCUSSION OF BACKGROUND

Conventional superconductors are most commonly of a metallic type. Among them, $Nb_3Ge$ had the highest transition temperature (critical temperature) for superconductivity at a level of 23.2K.

On the other hand, with superconductors of a metal oxide system, the critical temperature was usually lower than the superconductor of a metallic system and was at a level of 13K even with $BaPb_{1-x}Bi_xO_3$ which had the highest critical temperature.

Recently, however, as a superconductor of an oxide system having a high critical temperature, a material of a La-Sr-Cu-O system (critical temperature: about 40K) and a material of a Y-Ba-Cu-O system (critical temperature: about 90K) have been discovered and have created a boom for the development of materials having high temperature superconductivity.

For the preparation of these superconductors of an oxide system, a so-called dry (powder) method and a coprecipitation method have been commonly and widely used as disclosed in Zeitschrift für Physik B-Condensed Matter, Vol. 64, p.189 (1986) and Japanese Journal of Applied Physics, Vol. 26, No. 3, PL 196 (1987) and ditto, Vol. 26, No. 4, PL 314 (1987).

The dry method is a method wherein powder materials of oxides or carbonates of e.g. La, Y, Ba, Sr and Cu are mechanically mixed by means of a mortar or a mill, followed by sintering to obtain a sintered product of oxides.

The coprecipitation method is a method wherein nitrates of the above-mentioned metals were uniformly mixed and dissolved in an aqueous medium, and then oxalic acid or ammonia is added to simultaneously form the respective precipitates in the form of a mixture.

Further, a study is being made on a method for preparing a superconductor of an oxide system by an alkoxide process wherein metal alkoxides are employed so that the respective elements may readily be uniformly mixed.

The conventional dry method as mentioned above has drawbacks such that even when guaranteed reagents are used as the respective powders, their purity is not so high at a level of from 98 to 99.9% by weight, and impurities are included in the superconductor after sintering. There is a limitation in the uniformity of the mixed state attainable by mere mechanical mixing of the respective powders, and it is impossible to uniformly mix them in a strict sense, whereby unwanted phases other than the high temperature superconductive phase are likely to be present in the superconductor after sintering. Accordingly, the superconductor of an oxide system prepared by such a dry method, is obliged to have poor superconducting characteristics such that the critical temperature is low, the transition temperature range is wide, and the critical current density is small. Further, the sintering temperature is required to be high, and it takes a long time for the sintering.

In the coprecipitation method, since alkaline earth metal ions hardly precipitate unless the aqueous solution of the mixture is made alkaline, ammonia or the like is added to facilitate the precipitation of alkaline earth metal ions. However, it has a drawback that if ammonia or the like is added, copper forms complex ions, which can hardly be precipitated. Therefore, it has been pointed out that the coprecipitation method is not suitable to obtain a superconductor of an oxide system having a specific desired composition (Applied Physics, Vol. 56, No. 5, p.606 (1987)). Thus, the coprecipitation method also has a problem in obtaining a sintered product having good superconducting characteristics.

Recenly, a new high temperature oxide superconductor (constituting elements: Bi-Sr-Ca-Cu-O) containing no rare earth elements has been reported at a press conference on Jan. 21, 1988 and published on Jan. 22, 1988 by Kinzoku Zairyo Gijutsu Kenkyusho, and has created a further drive for the research of new superconducting materials.

This superconductor has a superconductive phase with a critical temperature higher than the above-mentioned superconductor of a Y-Ba-Cu-O system discovered by professor Chu of Houston University and contains no rare earth elements, and it shows superconducting characteristics even when dipped in water and is stable and readily reproducible. Further, it does not contain Ba as opposed to the oxide superconductor of a YBCO system and is free from the possibility that Ba turns into $BaCO_3$ during the sintering. It is therefore possible to set the sintering temperature at a low level. Thus, it is considered to be a practical superconductor. However, this superconductor of a Bi-Sr-Ca-Cu-O system is also produced by a dry system having the above-mentioned problem.

Further, a new superconductor of an oxide system containing thallium has been discovered by professor Haman of Arkansas University in the United States, which has further promoted the research for new superconducting materials. This superconductor of a Tl-Ca-Ba-Cu-O system has a critical temperature higher than the superconductor of a Y-Ba-Cu-O system and can be regarded as a more practical superconducting material.

However, this superconductor was also prepared by a dry method wherein powder materials of oxides or carbonates of thallium, calcium, barium and copper were mixed by means of a mortar or a mill, followed by sintering to obtain a sintered product of oxides.

The alkoxide process has a difficulty that metal alkoxides are usually hardly soluble, and some of them are almost insoluble in a solvent. Particularly, alkoxides of Group IIa elements, IIIa elements and copper have a low solubility in a solvent. Therefore, it is difficult to handle them, and it is thereby difficult to obtain a homogeneous mixture.

SUMMARY OF THE INVENTION

The present invention has been made to overcome the above-mentioned problems.

More specifically, it is an object of the present invention to provide a process for producing a superconductor of an oxide system having excellent superconducting characteristics such that as compared with the conventional methods, the transition temperature (critical temperature) for superconductivity is high, the transition temperature range is narrow and the critical current density (current density at the critical temperature or below) can be made high.

Another object of the present invention is to improve the solubility of metal alkoxides useful for the production of a superconductor of an oxide system.

It is another object of the present invention to provide a process for producing an oxide superconductor of a Bi-Sr-Ca-Cu-O system having excellent superconducting characteristics, whereby the metal elements are homogeneously mixed as compared with the conventional method for the production of such a superconductor.

A further object of the present invention is to provide a process for producing a superconductor of a Tl-Ca-Ba-Cu-O system having excellent superconducting characteristics by a low temperature sintering.

The present invention provides a process for producing a superconductor of an oxide system, which comprises uniformly mixing metal elements for constituting the oxide system at least partly in the form of alkoxides in a solvent with the rest, if any, being in the form of acetylacetonates, carboxylates and/or water-soluble inorganic compounds to obtain a homogeneous mixture, and sintering the mixture.

DETAILED DESCRIPTION OF THE PREFERRED EMBODIMENTS

Figure 1:
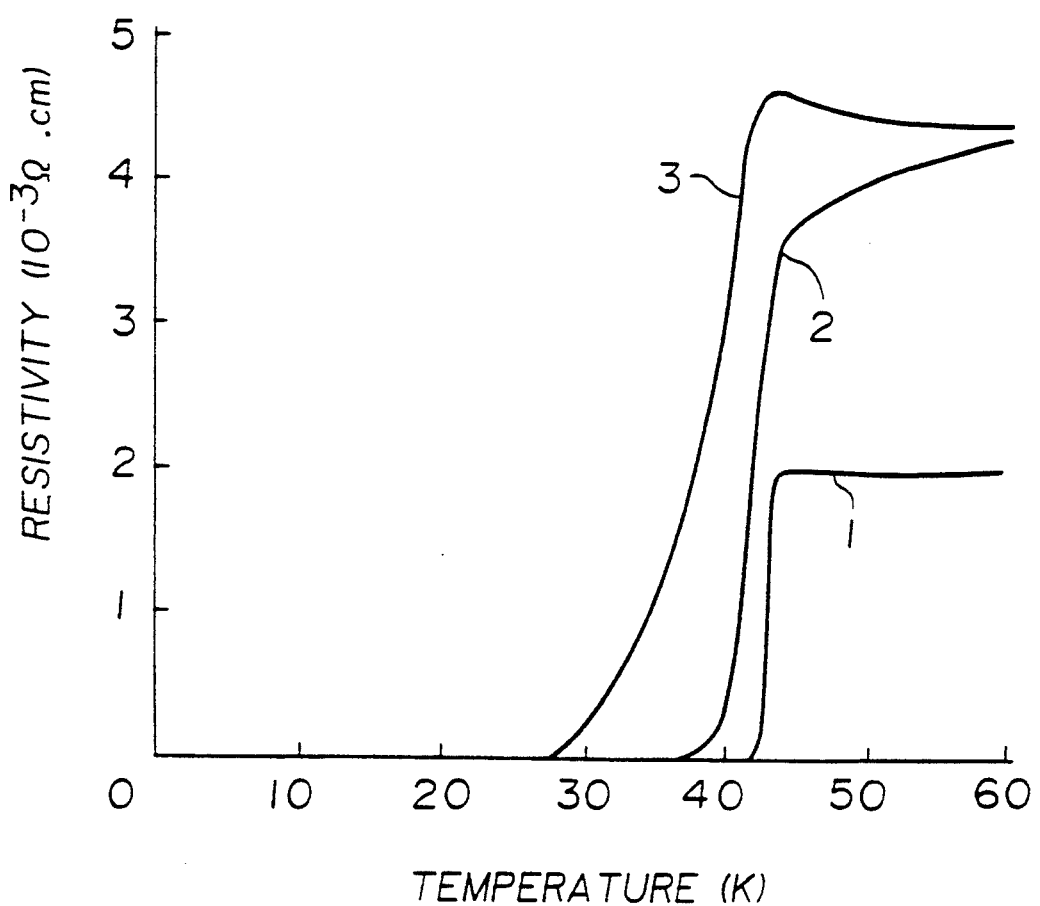
FIG. 1 is a graph showing the relation between the resistivity and the temperature of superconductors of an oxide system obtained in Example 1 (curve 1) and Comparative Examples 1 and 2 (curves 2 and 3).

In a first embodiment of the present invention, the metal elements for constituting the oxide system are three types of metal elements which are (1) at least one element selected from the group consisting of Mg, Ca, Sr and Ba of Group IIa of the Periodic Table, (2) at least one element selected from the group consisting of Sc, Y and lanthanoides of Group IIIa of the Periodic Table, and (3) Cu, and such metal elements are mixed wholly in the form of alkoxides. The homogeneous mixture of the alkoxides is then hydrolyzed to obtain a mixture of oxides or hydrates (hydroxides) of the metal elements. The mixture is then sintered to obtain the desired superconductor.

The alkoxides of the metal elements used in this embodiment are uniformly dissolved, dispersed or suspended in a solvent and then hydrolyzed by an addition of water, whereby they usually undergo a change from a sol to a gel and finally form the metal hydrates (hydroxides) or oxide particles. This method is a so-called alkoxide process and has such features that it is thereby possible to obtain super fine particles of metal hydrates (hydroxides) or oxides and that it is possible to obtain a homogeneous mixture of two or more different kinds of metal hydrates (hydroxides) or oxides.

The metal alkoxides can be prepared in a high purity usually at a level of from 99.999 to 99.99999%. By using such pure materials and highly pure water (such as deionized water or distilled water), it is possible to obtain metal hydrates (hydroxides) or oxide particles (powder) with a purity substantially higher than the case where inorganic reagents such as metal oxides or carbonates are employed (a dry method, or a coprecipitation method).

The present inventors have confirmed by experiments that high performance superconductors of an oxide system can be obtained by the process of the present invention wherein alkoxides of at least one element selected from the group consisting of Mg, Ca, Sr and Ba of Group IIa of the Periodic Table, at least one element selected from the group consisting of Sc, Y and lanthanoides of Group IIIa of the Periodic Table and Cu are used as the starting materials. The hydrolyzates obtained by this process are usually metal hydrates and amorphous as analyzed by the X-ray analysis. It has been confirmed by experiments that such metal hydrates can be all converted to metal oxides by sintering.

The metal alkoxides to be used in this embodiment are alkoxides of Mg, Ca, Sr, Ba, Sc, Y, lanthanoids and/or Cu. They may be of any structures or forms. Namely, the alkoxy group for the metal alkoxides may have any number of carbon atoms and may be an alkoxy group from a polyhydric alcohol. Preferred examples of such an alkoxy group include, for example, a methoxy group, an ethoxy group, a propoxy group, an isopropoxy group, a butoxy group, a tertiary butoxy group or a secondary butoxy group. However, the alkoxy group is not limited to such specific examples. There is no particular restriction to the number of alkoxy groups bonded to a metal element. At least one such a group may be bonded to a metal element.

There is no particular restriction as to the ratio in mixing an alkoxide of at least one element selected from the group consisting of Mg, Ca, Sr and Ba (hereinafter referred to as a Group IIa compound), an alkoxide of at least one element selected from the group consisting of Sc, Y and lanthanoids (hereinafter referred to as a Group IIIa compound) and an alkoxide of Cu (hereinafter referred to as a Cu compound). They may be mixed in any ratio so long as a desired superconductor of an oxide system can be obtained. However, when Y is used as the Group IIIa element, it is preferred to mix them in a ratio of the Group IIa compound/the Y-containing compound/the Cu compound=2-10/1/3-10 (atomic ratio of metals). When La is used as the Group IIIa element, it is preferred to mix them in a ratio of (the Group IIa compound+the La-containing compound)/the Cu compound 2/1 (atomic ratio of metals). There is no particular restriction as to the ratio between the Group IIa compound and the La-containing compound.

The above-mentioned metal alkoxides are uniformly dissolved, dispersed or suspended in a solvent such as methyl alcohol, ethyl alcohol, isopropyl alcohol, butyl alcohol, benzene, toluene, xylene, tetrahydrofuran, diethyl ether, diphenyl ether, anisole or ethyl acetate and then hydrolyzed. The hydrolyzates may be metal oxides depending upon the elements. However, the hydrolyzates are usually amorphous hydrates (inclusive of hydroxides) in many cases. Such hydrates can in most cases be converted to metal oxides at a relatively low temperature (200°–500° C.) by sintering.

In this specification, the term "uniformly mixed" is a concept which covers not only the uniformity like a solution but also a substantially uniformly mixed state of an emulsion or a dispersion.

There is no particular restriction as to the conditions for the hydrolysis such as the concentration of the metal alkoxides or the manner for the addition of water. The amount of water may be at any level in excess of the stoichiometric amount for the hydrolysis of the metal alkoxides and is preferably in large excess. The temperature is preferably at least 60° C.

The manner for the addition of water may be such that a large excess of water is dropwise added to the solution, dispersion or suspension of the metal alkoxides, or the solution, dispersion or suspension of the metal alkoxides is dropwise added to a large excess of water. The water to be used is the one containing no metal ions, etc., such as deionized water or distilled water.

When the mixture containing the resulting hydrolyzates (metal oxides or hydrates) is a fluid, it is subjected to filtration and drying, or to evaporation of the solvent, followed by sintering to obtain a superconductor of an oxide system.

There is no particular restriction as to the sintering conditions (such as the temperature, the number of times and the atmosphere). The sintering is conducted usually at a temperature of from 800° to 1,000° C., preferably from 900° to 950° C. for at least 2 hours, preferably at least 4 hours. At the time of sintering, the hydrolyzed mixture may be presintered at a temperature of from 800° to 1,000° C., preferably from 900° to 950° C. for at least 2 hours, preferably at least 4 hours, then pulverized and molded and finally sintered at a temperature of from 850° to 1,000° C., preferably from 900° to 950° C. for at least 2 hours, preferably at least 4 hours.

There is no particular restriction as to the pressure for molding. However, the pressure is preferably high and is usually preferably at least 0.5 kg/cm$^2$G. The atmosphere for sintering may be an oxygen atmosphere or air. However, in order to obtain a product having good superconductivity, it is preferred to employ an atmosphere rich in oxygen.

There is no particular restriction as to the cooling conditions after the sintering. The sintered products may be naturally cooled in air unless cracking occurs, or may be cooled in an oxygen stream over a period of about 5 hours.

A second embodiment of the present invention is based on a discovery that the solubility of metal alkoxides to be used for the preparation of a superconductor of an oxide system can be improved by a few hundred times or more by using metal alkoxides, at least a part of which is an alkoxide having CN$^-$, X$^-$ (wherein X is a halogen atom) and/or an amine.

Namely, in the second embodiment, a uniform solution, dispersion or suspension containing the same three types of metal elements as mentioned in the first embodiment in such a form that at least a part of at least one element of the three types of metal elements is in the form of a metal alkoxide having CN$^-$, X$^-$ (wherein X is a halogen atom) and/or an amine, and the rest of the metal elements are in the form of usual metal alkoxides, is subjected to the hydrolysis of all the alkoxides, and the resulting mixture is sintered to obtain a superconductor of an oxide system.

In this embodiment, at least a part of the alkoxides used is in the form of an alkoxide having $CN^-$, $X^-$ (wherein X is a halogen atom) and/or an amine (hereinafter referred to as a specific metal alkoxide), whereby the solubility of the metal alkoxides can be improved, and the alkoxides can uniformly be mixed in a solvent.

The alkoxy group for the metal alkoxide or the specific metal alkoxide may have any number of carbon atoms or may be an alkoxy group from a polyhydric alcohol. Preferred examples of such an alkoxy group may be those mentioned in the first embodiment, although the alkoxy group is not limited to such specific examples.

The specific metal alkoxide to be used in this embodiment may be prepared, for example, by mixing to the above-mentioned solution, dispersion or suspension of metal alkoxides a substance capable of forming $CN^-$ such as HCN or $(CN)_2$, a substance capable of forming $X^-$ such as HX or $X_2$, or ammonia or an amine such as methylamine, dimethylamine, trimethylamine, ethylamine, diethylamine, triethylamine, isopropylamine or butylamine in an amount of from 1 to 100% by weight, preferably from 20 to 50% by weight relative to the metal alkoxides at a temperature around room temperature, or by conducting the reaction of metals or metal chlorides with an alcohol such as methanol, ethanol, propanol, isopropanol, butanol, sec-butanol, pentanol or hexanol for the preparation of metal alkoxides in the presence of the above-mentioned HCN, HX or amines in an amount of not more than 2 times the weight of the alcohol.

There is no particular restriction as to the structure of the specific metal alkoxide, and any structure may be acceptable so long as at least one alkoxy group is attached to a metal atom and it has $CN^-$, $X^-$ and/or an amine.

As compared with the ordinary metal alkoxides, the specific metal alkoxide has a remarkably improved solubility in e.g. ethanol, isopropanol, butanol, methanol, tetrahydrofuran or ethyl ether, whereby the preparation of a homogeneous mixture can be facilitated. However, in the absence of an alkoxy group, the hydrolysis tends to be difficult.

Table 1 shows the solubilities of ordinary alkoxides and specific alkoxides of Yb, Ho, Ba, Sr and Cu, respectively.

TABLE 1

| Solubility (at 25° C. in 100 ml of an alcohol having the same alkoxy group as that of the metal alkoxide used) [g] | | | |
|---|---|---|---|
| Ordinary metal alkoxide | | Specific metal alkoxide* | |
| $Yb(OCH_3)_3$ | Insoluble | $Yb(OCH_3)_{3-x}(CN)_x$ | 0.10 |
| $Ho(OC_2H_5)_3$ | " | $Ho(OC_2H_5)_{3-x}(NH_2)_x$ | 0.25 |
| $Ba(OC_2H_5)_3$ | 0.002 | $Ba(OC_2H_5)_{2-x}(NH_2)_x$ | 0.36 |
| $Sr(OCH_3)_2$ | 0.001 | $Sr(OCH_3)_{2-x}(CN)_x$ | 0.18 |
| $Cu(OC_3H_7)_2$ | 0.03 | $Cu(OC_3H_7)_{2-x}Cl_x$ | 0.25 |

Note:
*The chemical formula for each specific metal alkoxide is a speculated or expected formula.

In this embodiment, at least one of the metal elements is incorporated in the form of the specific metal alkoxide.

There is no particular restriction as to which one of the metal elements should be incorporated in the form of the specific metal alkoxide. However, it is preferred to use a metal alkoxide having a low solubility in the form of the specific metal alkoxide, since the solubility is remarkably improved when an ordinary metal alkoxide is converted to the specific metal alkoxide.

There is no particular restriction as to the method for the preparation of a mixture containing the predetermined specific metal alkoxide. For example, when it is desired to use a certain metal in the form of the specific metal alkoxide, a dispersion or suspension of the alkoxide of that metal may be prepared, then a predetermined amount of HCN, HX or an amine may be added to form the specific metal alkoxide, and then other metal alkoxides may be added to prepare a mixture, or an alkoxide prepared to have a predetermined amount of a metal alkoxide converted to the specific metal alkoxide is dissolved, dispersed or suspended together with other metal alkoxides. Of course, alkoxides of all the metal elements may be dispersed or suspended and then HCN, HX or amine may be added thereto to obtain a solution, dispersion or suspension containing the specific metal alkoxide.

There is no particular restriction as to the ratio between the ordinary metal alkoxides and the specific metal alkoxides in the mixture, and any ratio may be employed so long as the mixture will be used as a homogeneous solution, dispersion or suspension. However, it is usually preferred that the ratio of the ordinary metal alkoxides/the specific metal alkoxides is not higher than 1/0.5 by molar ratio.

Further, there is no particular restriction as to the proportions of the three types of metal elements in the mixture, and such proportions may be as described above with respect to the first embodiment.

The solvent which may be used for the preparation of the above mixture includes, for example, methanol, ethanol, isopropanol, benzene, toluene, xylene, tetrahydrofuran, diethyl ether and diphenyl ether.

In this embodiment, a homogeneous solution, dispersion or suspension containing the predetermined ordinary metal alkoxides and specific metal alkoxides, is subjected to hydrolysis, whereby homogeneous particles of metal hydrates (hydroxides) or oxides can be obtained.

The hydrolysis, the treatment of the resulting hydrolyzate mixture and the sintering of the mixture can be conducted in the same manner as described above with respect to the first embodiment.

A third embodiment of the present invention is based on a discovery that the alkoxides of Sc, Y and lanthanoids can readily and uniformly be mixed when the carbon number of the alkoxy group is at least 3.

Namely, in this embodiment, alkoxides of at least one member selected from the group consisting of Mg, Ca, Sr and Ba and Cu, and alkoxides having an alkoxy group of at least 3 carbon atoms of at least one member selected from the group consisting of Sc, Y and lanthanoids are uniformly mixed in a solvent, followed by hydrolysis and sintering of the resulting hydrolyzate mixture to obtain a superconductor of an oxide system.

There is no particular restriction as to the alkoxides of Mg, Ca, Sr, Ba and Cu to be used in this embodiment. They may be the ones described above with respect to the first embodiment. Among them, particularly preferred is a metal alkoxide having a solubility of at least 1 g in 100 ml of a solvent.

The alkoxides of Sc, Y and lanthanoids to be used in this embodiment may be of any structures and forms so long as the alkoxy groups of the metal alkoxides have at least 3 carbon atoms. For example, the alkoxy groups may be those from polyhydric alcohols. There is no particular restriction as to the number of alkoxy groups bonded to a metal atom, and at least one such a group may be bonded to a metal element. Among such metal alkoxides, those having alkoxy groups having from 4 to 6 carbon atoms are preferred since they can be readily dissolved, dispersed or suspended and can relatively easily hydrolyzed. Specific examples of such preferred alkoxy groups include, for example, an isopropoxy group, a butoxy group and a pentoxy group.

When the carbon number of the alkoxy group of the metal alkoxide of Sc, Y or a lanthanoid is less than 3, it becomes extremely difficult to dissolve, disperse or suspend it, and it tends to be difficult to uniformly mix it with other components, whereby it tends to be difficult to obtain a superconductor of an oxide system having excellent characteristics. Table 2 shows the solubilities of various alkoxides of Y, Sm and Er when they were refluxed in ethanol at 100° C. for 30 minutes.

TABLE 2

| Solubility [g/100 ml] | | | | | |
|---|---|---|---|---|---|
| Y trimethoxide | Insoluble | Sm trimethoxide | Insoluble | Er trimethoxide | Insoluble |
| Y triethoxide | Insoluble | Sm triethoxide | Insoluble | Er triethoxide | Insoluble |
| Y tripropoxide | 0.8 | Sm tripropoxide | 0.6 | Er tripropoxide | 0.9 |
| Y tributoxide | 4.5 | Sm tributoxide | 4.8 | Er tributoxide | 3.6 |

There is no particular restriction as to the proportions of the alkoxides of the three types of metal elements. The proportions may be as described above with respect to the first embodiment. Such metal alkoxides are uniformly mixed in a solvent and hydrolyzed in the same manner as in the first embodiment. The treatment of the hydrolyzate mixture and the subsequent sintering of the mixture can be conducted also in the same manner and conditions as in the first embodiment.

A fourth embodiment of the present invention comprises a step of preparing a mixture of the alkoxides of the three types of metal elements as described in the first embodiment, a step of dissolving the alkoxides by adding an alcohol amine to the mixture, a step of hydrolyzing the dissolved alkoxides, and a step of sintering the hydrolyzate mixture to obtain a superconductor of an oxide system having excellent superconducting characteristics.

The metal alkoxides to be used in this embodiment may be those described above with respect to the first embodiment. The proportions of the alkoxides of the three types of metal elements are not critical, and may be as described with respect to the first embodiment.

The metal alkoxides are dispersed (partially dissolved) in a solvent such as methanol, ethanol, isopropanol, butanol, acetone, ethyl acetate, benzene, toluene, tetrahydrofuran or diacetone alcohol to prepare a mixture. By the subsequent addition of an alcohol amine, the metal oxides are completely dissolved in the solvent.

There is no particular restriction as to the alcohol amine, and it may be any alcohol amine so long as it has at least one hydroxyl group and at least one amino group (inclusive of a secondary amine and a tertiary amine). Preferred examples of such an alcohol amine include monoethanolamine, diethanolamine, triethanolamine, methanolamine and propanolamine. However, the alcohol amine is not restricted to such specific examples.

The amount of the alcohol amine is preferably from 20 to 500% by weight to the total weight of the metal alkoxides. If the amount is less than 20% by weight, the metal alkoxides tend to be hardly soluble, and if it exceeds 500% by weight, the dissolved metal alkoxides tend to be hardly hydrolyzed.

The reason why the insoluble or hardly soluble metal alkoxides can be soluble by the addition of such an alcohol amine has not yet been clearly understood. However, from the results of the study by the present inventors, it is considered that in the case of Y, Cu and Ba, a part of alkoxy groups of the metal alkoxides may be substituted by the alcohol amine, as shown by the following formulas.

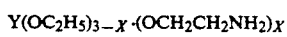

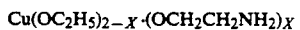

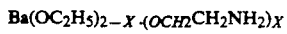

Then, the metal alkoxides dissolved in the solvent are hydrolyzed. The hydrolysis can be conducted in the same manner and conditions as described above with respect to the first embodiment.

The treatment of the resulting hydrolyzate mixture and the subsequent sintering of the mixture can be conducted also in the same manner and conditions as described with respect to the first embodiment.

A fifth embodiment of the present invention comprises a step of preparing a mixture of alkoxides of the three types of metal elements as described in the first embodiment, a step of completely dissolving the alkoxides by adding an acid to the mixture, a step of hydrolyzing the dissolved alkoxides by adding an alkali to the solution, a step of washing the resulting mixture, and a step of sintering the washed mixture to obtain a superconductor of an oxide system having excellent superconducting characteristics.

The metal alkoxides used in this embodiment may be the same as those described with respect to the first embodiment. The proportions of the alkoxides of the three types of metal elements are not critical, and may be as described above with respect to the first embodiment.

The metal alkoxides are mixed in a solvent such as methanol, ethanol, isopropanol, benzene, toluene, xylene, tetrahydrofuran, diethyl ether, diphenyl ether, anisole or ethyl acetate. Then, an acid is added, if necessary, together with water, to bring the pH of the solvent preferably to a level of from 2 to 5, whereby the metal alkoxides are completely dissolved in the solvent.

There is no particular restriction as to the acid, and any usual acid may be used. Specific examples of such an acid include a carboxylic acid such as acetic acid, sulfuric acid, carbonic acid, hydrochloric acid and nitric acid. Among such acids, acetic acid is particularly preferred since it contains no halogen atom and the subsequent hydrolysis will be easy.

There is no particular restriction as to the concentrations of the metal alkoxides in the solvent, the amount of the acid and the manner of the addition of the acid, so long as the metal alkoxides can be completely dissolved.

Then, the metal alkoxides in the solvent are subjected to hydrolysis. However, even when water is added to the solution, the metal alkoxides may not substantially be hydrolyzed. Therefore, an alkali is added, if necessary together with water, to bring the pH of the solution preferably to a level of from 7.5 to 11, whereby the hydrolysis proceeds.

There is no particular restriction as to the alkali. Specific examples of such an alkali include sodium hydroxide, potassium hydroxide, ammonia, lithium hydroxide, barium hydroxide and magnesium hydroxide.

There is no particular restriction as to the concentrations of the metal alkoxides at the time of hydrolysis, the amount of the alkali, the amount of water and the conditions for the hydrolysis. The hydrolysis may be conducted in the same manner as in the first embodiment.

The mixture of hydrolyzates thus prepared is then washed with distilled water or deionized water, or with a water-containing solvent wherein an organic solvent well missible with water, such as methanol, ethanol, propanol or acetone is added, to remove alkali metal ions and halogen ions which adversely affect the superconducting characteristics.

When the mixture of the hydrolyzates (metal oxides or hydrates) is in a liquid form, it is cleaned, for example, by filtration and drying followed by washing with water, by evaporating the solvent followed by washing, or by repeating the operation of centrifugal separation and addition of a solvent. When the hydrolyzate mixture is in a gel form, the alkali metal ions and halogen ions may be removed, for example, by washing it as it is, or in some cases, by washing it after evaporating the solvent or after filtration and drying. The washed mixture is then sintered to obtain a superconductor of an oxide system. The sintering can be conducted in the same manner as described above with respect to the first embodiment.

A sixth embodiment of the present invention comprises a step of mixing alkoxides of the three types of metal elements as described in the first embodiment in a solvent, a step of dissolving the alkoxides by adding an acid to the mixture, a step of hydrolyzing the dissolved alkoxides by adding at least one member selected from the group consisting of amines, ammonia and amino alcohols to the solution to such an extent that the pH of the solution does not exceed 10, and a step of sintering the hydrolyzate mixture to obtain a superconductor of an oxide system having excellent superconducting characteristics.

The metal alkoxides to be used in this embodiment may be the same as described in the first embodiment. The proportions of the alkoxides of the three types of metal elements in the mixture are not critical and may be the same as described in the first embodiment. The solvent may also be the same as described in the first embodiment.

In this embodiment, an acid is added to the mixture of the metal alkoxides, if necessary together with water, to completely dissolve the metal alkoxides in the solvent.

There is no particular restriction as to the acid, and the acid may be the same as mentioned in the fifth embodiment.

There is no particular restriction as to the amount of the acid, and it is added preferably in such an amount to bring the pH of the solvent to a level of from 2 to 5. There is no particular restriction as to the concentrations of the metal alkoxides and the manner for the addition of an acid so long as the metal alkoxides can be completely dissolved.

Even if a water is added to the solution of the metal alkoxides thus obtained, the metal alkoxides may not substantially be hydrolyzed. Therefore, at least one member selected from amines, ammonia and amino alcohols is then added, if necessary together with water, under such a condition that the pH of the solution does not exceed 10, preferably is within a range of from 8.0 to 9.5 whereby the hydrolysis proceeds. If the pH exceeds 10, copper ammonia complex ions tend to form, and they can hardly be hydrolyzed even when water is added, whereby the proportion of Cu in the hydrolyzate mixture will be extremely small.

Specific examples of the amines include primary amines, secondary amines, tertiary amines and quaternary ammonium bases such as $RNH_2$, $R_2NH$, $R_3N$ and $R_4NOH$ wherein R is a hydrocarbon group such as a methyl group, an ethyl group, a propyl group or an isopropyl group, and when two or more R exist, they may be of the same or different types. However, the amines are not restricted to such specific examples.

Specific examples of the amino alcohols include monomethanolamine, monoethanolamine, diethanolamine, triethanolamine, 1-amino-1-propanol, 1-amino-2-propanol, 2-amino-1-propanol and 3-amino-1-propanol. However, the amino alcohols are not restricted to such specific examples.

The hydrolysis can be conducted in the same manner and conditions as in the first embodiment. It is possible to improve the superconducting characteristics of the resulting superconductor by removing impurities such as halogen ions by washing prior to the sintering. Such washing can be conducted as described above with respect to the fifth embodiment.

The subsequent sintering can be conducted in the same manner and conditions as in the first embodiment.

A seventh embodiment comprises a step of uniformly dissolving, dispersing or suspending in a solvent alkoxides of the three types of metal elements as described in the first embodiment, with at least a part of the alkoxides being an alkoxide having $X^-$ wherein X is a halogen atom, a step of hydrolyzing the alkoxides by adding an alkali to the uniform solution, dispersion or suspension, a step of neutralizing the hydrolyzate mixture by adding an acid, a step of washing the mixture, and a step of sintering the washed mixture to obtain a superconductor of an oxide system having excellent superconducting characteristics.

In this embodiment, at least a part of the metal alkoxides are used in the form of metal alkoxides having $X^-$ (wherein X is a halogen atom), whereby the solubility of the metal alkoxides is improved, and they can uniformly be mixed in the organic solvent.

The metal alkoxides to be used in this embodiment are alkoxides of Mg, Ca, Sr, Ba, Sc, Y, lanthanoids and Cu, and at least a part of them are metal alkoxides having $X^-$ wherein X is a halogen atom (hereinafter referred to as a specific metal alkoxides).

The alkoxy group of such a metal alkoxide or specific metal alkoxide may have any number of carbon atoms, and may be the one derived from a polyhydric alcohol. Such an alkoxy group may be the same as mentioned in the first embodiment.

The specific metal alkoxides in this embodiment may be prepared, for example, by adding to the above-mentioned solution, dispersion or suspension of the metal alkoxides a substance capable of forming $X^-$ such as HX or $X_2$ in an amount of from 10 to 100 mol %, preferably from 20 to 80 mol %, relative to the molar amount of the metal alkoxides, followed by mixing at a temperature around room temperature, or by conducting the reaction of a metal or a metal chloride with an alcohol such as methanol, ethanol, propanol, isopropanol, butanol, sec-butanol, pentanol or hexanol to produce a metal alkoxide in the presence of the $X^-$-forming substance such as HX or $X_2$ in an amount not exceeding ½ time relative to the weight of the alcohol.

There is no particular restriction as to the structure, etc. of such a specific metal alkoxide, and any alkoxide may be used so long as at least one alkoxy group is bonded to an metal atom and it has $X^-$.

The specific metal alkoxides obtained as above are considered to have the following formulas:

$$Y(OCH_3)_{3-x}Cl_x$$

$$La(OCH_3)_{3-x}Br_x$$

$$Ba(OC_2H_5)_{2-x}Br_x$$

$$Sr(OC_2H_5)_{2-x}Cl_x$$

$$Cu(OCH_3)_{2-x}Cl_x$$

As compared with the ordinary metal alkoxides, the specific metal alkoxides have a remarkably improved solubility in ethanol, isopropanol, butanol, methanol, tetrahydrofuran or ethyl ether, whereby the preparation of the homogeneous mixture is facilitated. However, in the absence of an alkoxy group, the hydrolysis tends to be difficult.

There is no particular restriction as to which metal elements should be incorporated in the form of the specific metal alkoxides. However, it is preferred to use metal alkoxides having a low solubility in the form of the specific metal alkoxides, since the solubility is remarkably improved when they are converted to such specific metal alkoxides.

There is no particular restriction as to the method for the preparation of a mixture containing the predetermined specific metal alkoxides. For example, when a certain metal is to be used in the form of the specific metal alkoxide, a dispersion or suspension of the alkoxide of that metal is first prepared, and then a $X^-$-forming substance such as HX or $X_2$ is added in a predetermined amount to form the specific metal alkoxide. Then, other metal alkoxides are added thereto to obtain a mixture. Otherwise, an alkoxide prepared to have a certain predetermined amount of the metal alkoxide converted to the specific metal alkoxide, may be dissolved, dispersed or suspended together with other metal alkoxides. Of course, all the metal alkoxides may first be dispersed or suspended, and then a $X^-$-forming substance such as HX or $X_2$ may be added to obtain a solution, dispersion or suspension containing the specific metal alkoxides.

There is no particular restriction as to the ratio between the ordinary metal alkoxides and the specific metal alkoxides in the mixture, and any ratio may be employed so long as the mixture is useful as a homogeneous solution, dispersion or suspension. Usually, however, the ratio of the ordinary metal alkoxides/the specific metal alkoxides is preferably at most 1/1 in molar ratio.

There is no particular restriction as to the proportions of the alkoxides of the three types of metal elements, and such proportions may be as described above with respect to the first embodiment.

The solvent which can be used for the preparation of the solution, dispersion or suspension includes, for example, methanol, ethanol, isopropanol, benzene, toluene, xylene, tetrahydrofuran, diethyl ether and diphenyl ether. In this embodiment, the metal alkoxides and the specific metal alkoxides in the solution, dispersion or suspension are then hydrolyzed by adding an alkali, if necessary, together with water. There is no particular restriction as to the addition of the alkali. The alkali is preferably added in such an amount that the pH of the solution, dispersion or suspension will be from 7 to 13, more preferably from 8 to 9.5.

There is no particular restriction as to the alkali. The alkali may be as mentioned in the fifth embodiment. The hydrolysis can be conducted in the same manner and conditions as in the fifth embodiment.

The hydrolyzate mixture thus obtained is neutralized by an addition of an acid, if necessary together with water and then washed in the same manner as described above in the fifth embodiment to remove alkali metal ions and halogen ions which adversely affect the superconducting characteristics.

By the addition of an acid for neutralization prior to the washing, inclusion of the impurities such as halogen ions and alkali metal ions in the finally sintered product can be further reduced as compared with the case where the washing is conducted without addition of such an acid.

There is no particular restriction as to such an acid. Specific examples of such an acid include a carboxylic acid such as acetic acid, sulfuric acid, carbonic acid, hydrochloric acid and nitric acid. Among them, acetic acid is particularly preferred since it contains no halogen atoms or sulfur atoms and it has no oxidizing effect.

The washing can be conducted in the same manner and conditions as described above with respect to the fifth embodiment.

The washed mixture is then sintered to obtain a superconductor of an oxide system. The sintering can be conducted in the same manner and conditions as described above with respect to the first embodiment.

In an eighth embodiment of the present invention, at least one of alkoxides of the three types of metal elements as described in the first embodiment is dissolved, dispersed or suspended in a solvent, and at least a part thereof is hydrolyzed in the presence of an acid or an alkali. Then, the rest of the alkoxides are uniformly dissolved, dispersed or suspended in the hydrolyzate thus obtained, and the homogeneous mixture is then sintered to obtain a superconductor of an oxide system having excellent superconducting characteristics.

Namely, in this embodiment, at least one of the metal alkoxides is dissolved, dispersed or suspended in the solvent, and then at least part thereof is hydrolyzed in the presence of an acid or an alkali, whereby particles of the metal hydrates (hydroxides) or oxides will be formed. The rest of the metal alkoxides are added thereto, whereby the added metal oxides are uniformly mixed with the hydrolyzates by the action of the water and the acid or the alkali present in the water contained in the hydrolyzates. By using such a uniform mixture, a high performance superconductor of an oxide system in the form of a homogeneous sintered product can be obtained.

The metal alkoxides used in this embodiment may be the same as described in the first embodiment.

In this embodiment, at least one of the predetermined metal alkoxides is dissolved, dispersed or suspended in a solvent such as methyl alcohol, ethyl alcohol, isopropyl alcohol, butyl alcohol, acetone, ethyl acetate, butyl acetate, benzene, toluene, xylene, tetrahydrofuran or diacetone alcohol. At least a part thereof is hydrolyzed in the presence of an acid or an alkali, and to the hydrolyzed product, the rest of the metal alkoxides are dissolved, dispersed or suspended to obtain a homogeneous mixture.

There is no particular restriction as to which metal alkoxides among the predetermined metal alkoxides should be hydrolyzed and which should be mixed later. However, as the metal alkoxides to be hydrolyzed, it is preferred to employ metal alkoxides which have a relatively good solubility in the organic solvent and which can readily be uniformly dissolved, dispersed or suspended in the solvent, so that a homogeneous mixture can easily be obtained. As such metal alkoxides, alkoxides of Mg, Ca, Sr, Ba and Cu may be mentioned.

There is no particular restriction as to the conditions for hydrolysis so long as a homogeneous mixture can subsequently be prepared. For example, the amount of water for the hydrolysis and the temperature may be as described in the first embodiment.

The term "in the presence of an acid or an alkali" means that an acid or an alkali may be present in a sufficient amount so that it serves as a catalyst for the hydrolysis. For example, the acid or the alkali may be added in an amount of from 0.5 to 10 g per mol of the metal alkoxides to be hydrolyzed, if necessary together with water, to the solvent in which the metal alkoxides are dissolved, dispersed or suspended.

There is no particular restriction as to the acid. Specific examples thereof include a carboxylic acid such as acetic acid, sulfuric acid, carbonic acid, hydrochloric acid and nitric acid.

There is no particular restriction as to the alkali. Specific examples thereof may be the same as mentioned in the fifth embodiment.

There is no particular restriction as to the manner for the addition of the subsequently added metal alkoxides. For example, after removing the solvent from the gelled product obtained by the hydrolysis of at least one metal alkoxide, e.g. by filtration, the subsequently added metal alkoxides are dissolved, dispersed or suspended in the same solvent as used for the hydrolysis and added to the gelled product in a predetermined amount, followed by stirring, whereby a uniform mixture can readily be obtained. Otherwise, subsequently added metal alkoxides may directly be added in the form of powder to the gelled hydrolyzate to obtain a homogeneous mixture.

By employing the above method, even when the subsequently added metal alkoxides are of the type having a relatively poor solubility, they can uniformly be dissolved, dispersed or suspended in the hydrolyzate by the action of the acid or the alkali contained in water in the hydrolyzate.

The ratio between the metal alkoxides to be hydrolyzed and the metal alkoxides to be subsequently added varies depending upon the types of the metal elements. There is no particular restriction as to the ratio so long as a homogeneous mixture can be prepared. However the proportion of the metal alkoxides to be hydrolyzed in the entire metal alkoxides used is preferably at a level of from 30 to 80 atomic % (atomic ratio of metals), whereby a homogeneous mixture can readily be prepared. More preferably, the proportion is within a range of from 50 to 80 atomic % (atomic ratio of metals).

There is no particular restriction as to the proportions of the alkoxides of the three types of metal elements, and such proportions may be as described in the first embodiment.

The homogeneous mixture may be sintered as it is, or in some cases after the evaporation of the solvent or after the filtration and drying, to obtain a superconductor of an oxide system.

The sintering can be conducted in the same manner and conditions as in the first embodiment.

In a ninth embodiment of the present invention, a fluid containing a hydrolyzate obtained by hydrolyzing alkoxides of metal elements of at least one of the three types of metal elements described in the first embodiment and a fluid containing a hydrolyzate obtained by hydrolyzing acetylacetonates of metal elements of at least the rest of the three types of metal elements, are uniformly mixed to form a homogeneous mixture, and the homogeneous mixture is then sintered to obtain a superconductor of an oxide system having excellent superconducting characteristics.

In this embodiment, a part of the metal elements to be employed are used in the form of metal alkoxides and the rest are used in the form of metal acetylacetonates, whereby the compounds containing the metal elements can readily and homogeneously be dissolved, dispersed or suspended in the solvent.

Besides, such metal compounds are hydrolyzed in the separate fluids separately, whereby the hydrolyses can be conducted under separate hydrolytic conditions suitable for the respective fluids. Such fluids containing the respective hydrolyzates in a super fine particle state respectively are then mixed, whereby a mixture of hydrolyzates uniformly mixed can readily be prepared. The sintered product obtainable from such a hydrolyzate mixture will be homogeneous, and a high performance superconductor of an oxide system can be obtained.

The metal alkoxides useful for this embodiment are as described above with respect to the first embodiment.

There is no particular restriction as to the metal acetylacetonates to be used in this embodiment. They may be of any structures or forms so long as they have at least one acetylacetonate group bonded to a metal atom and they are hydrolyzable.

In this embodiment, at least one type of metal elements among the three types of metal elements are used in the form of metal alkoxides, and the rest of the metal elements are used in the form of metal acetylacetonates.

There is no particular restriction as to which metal elements among the three types of metal elements should be used in the form of metal alkoxides, and which should be used in the form of metal acetylacetonates. However, metals which can readily be uniformly dissolved, dispersed or suspended in the solvent in the form of metal alkoxides, such as Mg, Ca, Sr, Ba or Cu may preferably be used in the form of metal alkoxides. Whereas, metal elements which are hardly dissolved, dispersed or suspended in the form of metal alkoxides, such as Y or a lanthanoid, may preferably be used in the form of metal acetylacetonates. Such selection is preferred from the viewpoint of the operation efficiency and the uniformity of the resulting mixture. Of course, it is unnecessary to use all of a certain metal in the form of the alkoxide. Namely, a part of a metal may be used in the form of the metal alkoxide, and the rest may be used in the form of the metal acetylacetonate.

There is no particular restriction as to how much among the total metal atoms should be in the form of metal alkoxides or how much should be in the form of metal acetylacetonates. They may be used in any optional proportions so long as a uniform mixture of hydrolyzates can be obtained. However, the proportion of metal atoms to be used as metal alkoxides is preferably at a level of from 20 to 80 atomic % based on the total metal atoms with a view to obtaining a uniform mixture of hydrolyzates. More preferably, the proportion is within a range of from 30 to 70 atomic %.

Further, there is no particular restriction as to the proportions of the three types of metal elements used. Such proportions may be as described above with respect to the first embodiment.

The solvent to be used may be, for example, methyl alcohol, ethyl alcohol, isopropyl alcohol, butyl alcohol, benzene, toluene, xylene, tetrahydrofuran or diethyl ether.

There is no particular restriction as to the conditions for hydrolysis of the metal alkoxides or metal acetylacetonates, such as the concentrations of the metal alkoxides or the metal acetylacetonates, the amount of water and the temperature. For example, the amount of water, the type of water and the temperature for hydrolysis may be as described above with respect to the first embodiment of the present invention.

There is no particular restriction as to the method of mixing the fluid containing the hydrolyzates of the metal alkoxides and the fluid containing the metal acetylacetonates. Any method may be employed so long as the proportions of the metal elements in the mixture will be as predetermined, and a homogeneous mixture can be obtained.

The metal acetylacetonates are readily hydrolyzed in the presence of an alkali. However, if an alkali is merely added for the hydrolysis of the metal acetylacetonates, such an alkali tends to remain in the hydrolyzates. Therefore, it is preferred that while hydrolyzing the metal acetylacetonates in the presence of an alkali, the metal alkoxides are hydrolyzed in the presence of an acid, and the both fluids are mixed to be neutralized. Then, the mixed hydrolyzates are washed and sintered to obtain a homogeneous sintered product having a low content of impurities, whereby a product having excellent superconducting characteristics is obtainable.

When an acid is used for the hydrolysis of the metal alkoxides, there is no particular restriction as to the conditions such as the concentrations of the metal alkoxides in the solvent, the amount of water, the temperature and the amount of the acid so long as the metal alkoxides can be hydrolyzed and preferably dissolved. It is usually preferred to bring the pH to a level of from 1 to 5, whereby the metal alkoxides can completely be dissolved in the solvent.

There is no particular restriction as to the type of such an acid, and a usual acid may be employed. Specific examples thereof include carboxylic acids such as acetic acid and trifluoroacetic acid, sulfuric acid, carbonic acid, hydrochloric acid and nitric acid. Among these acids, acetic acid is particularly preferred, since it contains no halogen atom and the hydrolysis can thereby be readily conducted.

When an alkali is used for the hydrolysis of the metal acetylacetonates, there is no particular restriction as to the conditions such as the concentrations of the metal acetylacetonates in the solvent, the amount of water, the temperature and the amount of the alkali, so long as the metal acetylacetonates can be hydrolyzed and preferably uniformly dissolved, dispersed or suspended. However, the hydrolysis is conducted preferably at a pH of from 7.5 to 13.

There is no particular restriction as to the type of such an alkali, and any alkali may be used so long as an excess element does not remain. Specific examples thereof include sodium hydroxide, potassium hydroxide, ammonia, lithium hydroxide, barium hydroxide and magnesium hydroxide.

The resulting mixture of hydrolyzates is washed with distilled water or deionized water, or with an water-containing solvent in which an organic solvent well missible with water such as methanol, ethanol, propanol or acetone is added, to remove alkali metal ions and halogen ions which adversely affect the superconducting characteristics. The hydrolyzates thus obtained may be metal oxides depending upon the elements. However, the hydrolyzates are usually amorphous hydrates (inclusive of hydroxides) in many cases. Such hydrates can in most cases be converted to metal oxides at a relatively low temperature (200°–500° C.) by sintering.

Preferred examples for the combination of the metal alkoxides, the metal acetylacetonates and the solvent to be used, include a combination of $Cu(OCH_3)_2$, yttrium acetylacetonate, barium acetylacetonate and methanol, a combination of $Ba(n\text{-}OC_4H_9)_2$, $Y(n\text{-}OC_4H_9)_3$, copper acetylacetonate and butanol, and a combination of $La(n\text{-}OC_4H_9)_3$, $Ba(n\text{-}OC_4H_9)_2$, europium actylacetonate, copper acetylacetonate and butanol.

The homogeneous mixture thus obtained can be treated and sintered in the same manner as described above with respect to the first embodiment.

In a tenth embodiment of the present invention, a part of the three types of metal elements as described in the first embodiment are dissolved, dispersed or suspended in the form of alkoxides with the rest being in the form of carboxylates, and the alkoxides in the solution, dispersion or suspension are hydrolyzed to obtain a homogeneous mixture, which is then sintered to obtain a superconductor of an oxide system having excellent superconducting characteristics.

In this embodiment, alkoxides and carboxylates of the metal elements used are uniformly dissolved, dispersed or suspended in a solvent, and then the metal alkoxides are hydrolyzed to undergo a change via a sol to a gelled mixture of hydroxides or oxides (alkoxide process). Into the gel formed by the hydrolysis of the metal alkoxides, the metal carboxylates (metal ions) in the solution, dispersion or suspension are taken in and homogeneously mixed, whereby a sintered product obtainable from such a mixture will be also uniform.

The metal alkoxides used in this embodiment may be as described above with respect to the first embodiment.

The carboxylates used in this embodiment are carboxylates of Mg, Ca, Sr, Ba, Sc, Y, lanthanoids and Cu and may be of any structures or forms. Namely, the carboxylic acid to form the carboxylate may have any number of carbon atoms. Preferred examples of such a carboxylic acid include acetic acid, butyric acid, stearic acid, oleic acid, valeric acid, propionic acid, benzoic acid, isobutyric acid and acrylic acid. However, the carboxylic acid is not limited to such specific examples. There is no particular restriction as to the number of carboxylic acid residues bonded to a metal atom. At least one such a group may be bonded to a metal atom.

There is no particular restriction as to the manner of mixing an alkoxide or carboxylate of at least one element selected from the group consisting of Mg, Ca, Sr and Ba (a Group IIa compound), an alkoxide or carboxylate of at least one element selected from the group consisting of Sc, Y and lanthanoids (a Group IIIa compound) and a copper alkoxide or carboxylate (a Cu compound), so long as at least a part of the above metal elements is contained in the form of a metal alkoxide, and the solution, dispersion or suspension will be gelled by the hydrolysis of the metal alkoxide. Therefore, if it is difficult to prepare a certain metal alkoxide to be used in the present invention, or if a certain metal alkoxide has a relatively low solubility to the solvent, the carboxylate of said metal may be employed instead of such metal alkoxide, and vice versa.

There is no particular restriction as to the ratio of the metal alkoxides/the metal carboxylates in the solvent. However, the ratio is preferably at least 1/10 by molar ratio from such a viewpoint that the solution, dispersion or suspension is gelled by the hydrolysis of the metal alkoxides.

There is no particular restriction as to the proportions of the Group IIa compound, the Group IIa compound and the Cu compound. Such proportions may be as described above with respect to the first embodiment.

The metal alkoxides are together with the metal carboxylates uniformly dissolved, dispersed or suspended in a solvent such as methanol, ethanol, isopropanol, tetrahydrofuran, ethyl ether, benzene or toluene and then hydrolyzed to form a gel. The hydrolyzates of the metal alkoxides may be metal oxides depending upon the elements. However, in most cases, they are amorphous hydrates (inclusive of hydroxides), which can be converted in most cases to metal oxides at a relatively low temperature (200°–500°).

There is no particular restriction as to the conditions for hydrolysis such as the concentrations of the metal alkoxides or carboxylates at the time of the hydrolysis or the manner for the addition of water. The amount of the water, the manner for the addition of water and the type of water to be used for the hydrolysis may be as described above with respect to the first embodiment. The resulting gelled mixture may be sintered as it is, or in some cases after the evaporation of the solvent or after the filtration and drying, to obtain a superconductor of an oxide system.

The sintering conditions are not critical, and may be the same as described with respect to the first embodiment.

There is no particular restriction as to the pressure for molding. However, the higher the better. Usually, the pressure is preferably at least 0.1 kg/cm$^2$G.

In a eleventh embodiment of the present invention, a part of the three types of the metal elements as described in the first embodiment are uniformly dissolved, dispersed or suspended in the form of alkoxides in a solvent and the alkoxides are hydrolyzed, and the rest of the metal elements are dissolved, dispersed or suspended in the form of water-soluble inorganic compounds in the hydrolyzate, and the resulting homogeneous mixture is sintered to obtain a superconductor of an oxide system having excellent superconducting characteristics.

In this embodiment, at least a part of the metal elements are uniformly dissolved, dispersed or suspended in a solvent, and then hydrolyzed by an addition of water to obtain a homogeneous dispersion of particles of the metal hydrates (hydroxides) or oxides. To this dispersion, the rest of the metal elements are dissolved, dispersed or suspended in the form of water-soluble inorganic compounds to obtain a mixture, whereby a homogeneous mixture can be obtained. Accordingly, a sintered product obtainable from such a mixture will also be homogeneous, and thus a high performance superconductor of an oxide system can be obtained. The hydrolyzates obtained by this process are usually amorphous hydrates as analyzed by the X-ray analysis, and it has been confirmed by experiments that such hydrates can all be converted to metal oxides by sintering.

The metal alkoxides used in this embodiment may be the same as described with respect to the first embodiment. Among the metal alkoxides, alkoxides of Mg, Ca, Sr, Ba and Cu are preferred since they are excellent in the solubility or dispersibility in the solvent.

The water soluble inorganic compounds of metals used in this embodiment are those having good solubility in water, among the salts of Mg, Ca, Sr, Ba, Sc, Y, lanthanoids and Cu with an acid such as nitric acid, hydrochloric acid, carbonic acid or sulfuric acid and the hydroxides and sulfides of such metals, particularly those having a solubility in water of at least 0.5% by weight.

Preferred examples of such water-soluble inorganic compounds include nitrates and chlorides of Cu, Sr, Ca, Ba, La and Y.

In this embodiment, at least a part of at least one of the metal alkoxides is dissolved, dispersed or suspended in a solvent such as methyl alcohol, ethyl alcohol, isopropyl alcohol, butyl alcohol, acetone, ethyl acetate, butyl acetate, benzene, toluene, xylene, tetrahydrofuran or diacetone alcohol and then hydrolyzed by an addition of water. Then, water-soluble inorganic compounds of the rest of metal elements are dissolved, dispersed or suspended to the hydrolyzate to obtain a homogeneous mixture.

There is no particular restriction as to which metal elements among those used in this embodiment should be used in the form of alkoxides and which should be used in the form of water-soluble inorganic compounds. From the operation efficiency and the uniformity of the resulting mixture, it is preferred to use metal alkoxides which can readily be uniformly dissolved, dispersed or suspended in the solvent in the form of alkoxides and to use those which can hardly be dissolved, dispersed or suspended in the form of alkoxides in the form of water-soluble inorganic compounds. Of course, it is unnecessary to use all of a certain metal element in the form of its alkoxide. Namely, a part of it may be used in the form of an alkoxide and the rest may be used in the form of a water-soluble inorganic compound.

There is no particular restriction as to the proportion of the metals used in the form of metal alkoxides in the total metals to be employed, the manner for mixing, the manner for hydrolysis and the manner for the addition of the water-soluble inorganic compounds. Any manners may be employed so long as a homogeneous mixture can be obtained. For example, the proportion of the metal atoms used in the form of metal alkoxides is preferably at a level of from 30 to 90 atomic % in the total metal atoms, whereby a homogeneous mixture can readily be obtained. It is further preferred to employ a proportion of from 50 to 90 atomic %.

As such a specific method, there may be mentioned a method wherein a predetermined amount of copper methoxide is dispersed (partially dissolved) in methyl alcohol and then hydrolyzed preferably at a temperature of 60° C. or higher by an addition of water in an amount in excess of the stoichiometric amount for the hydrolysis, preferably in large excess to obtain gelled brown precipitates, and then predetermined amounts of strontium nitrate and yttrium nitrate are added thereto in the form of powders or aqueous solutions to obtain a mixture, or a method in which predetermined amounts of $Ba(n-OC_5H_{11})_2$ and $Y(n-OC_4H_9)_3$ are dissolved in butyl alcohol by refluxing under heating (100° C.) and then hydrolyzed by an addition of a large excess of water, and then a predetermined amount of copper chloride is added thereto in the form of a powder or an aqueous or alcohol solution to obtain a mixture. The hydrolyzates may be metal oxides depending upon the elements. However, they are usually amorphous hydrates (inclusive of hydroxides) in many cases. Such hydrates can mostly be converted to metal oxides by sintering at a relatively low temperature (200°-500° C.).

There is no particular restriction as to the proportions of the three types of metal elements in the mixture. Such proportions may be the same as described with respect to the first embodiment.

The treatment of the mixture and the subsequent sintering can be conducted in the same manner and conditions as described in the first embodiment.

In a twelfth embodiment of the present invention, the metal elements for constituting the oxide system are Bi, Sr, Ca and Cu, and they are dissolved, dispersed or suspended in a solvent wholly in the form of alkoxides, followed by removal of the solvent to obtain a homogeneous mixture, which is then sintered to obtain a superconductor of a Bi-Sr-Ca-Cu-O system. The uniformly dissolved, dispersed or suspended mixture may be hydrolyzed prior to the removal of the solvent.

The metal alkoxides to be used in this embodiment can be prepared usually in a high purity of from 99.999 to 99.99999%. By using such pure materials and by uniformly mixing them in a solvent, it is possible to obtain a homogeneous superconductor having a high purity.

The alkoxides of Bi, Sr, Ca and Cu to be used in this embodiment may be of any structures or forms. Namely, the alkoxy group for such a metal alkoxide may have any number of carbon atoms and may be an alkoxy group from a polyhydric alcohol. Preferred specific examples of such an alkoxy group include a methoxy group, an ethoxy group, a propoxy group, an isopropoxy group, a butoxy group, a t-butoxy group, a sec-butoxy group and ethylene glycol. However, the alkoxy group is not limited to such specific examples. Further, there is no particular restriction to the number of alkoxy groups bonded to a metal element, and at least one alkoxy group may be bonded to a metal element.

There is no particular restriction as to the ratio of Bi, Sr, Ca and Cu. They may be used in any ratio so long as the desired superconductor of an oxide system can be obtained. However, it is preferred to use them in a compositional ratio to form a high Tc phase (Tc=about 120K (onset)). Usually, a compositional ratio of $Bi_1Sr_{0.5-3}Ca_{0.5-3}Cu_{0.5-3.5}$ is preferred.

In this embodiment, the metal alkoxides are uniformly dissolved, dispersed or suspended in a solvent such as methyl alcohol, ethyl alcohol, isopropyl alcohol, butyl alcohol, benzene, toluene, xylene, tetrahydrofuran, diethyl ether, diphenyl ether or DMF. Then, the solvent is removed directly or after the hydrolysis, and the resulting homogeneous mixture is sintered.

There is no particular restriction as to the concentration of the metal alkoxides in the above solvent, so long as such metal compounds can be uniformly dissolved, dispersed or suspended in the solvent.

When metal alkoxides of Ba, Sr, Ca and Cu dissolved, dispersed or suspended in the solvent are subjected to hydrolysis, they undergo a change from a sol to a gel and finally form particles of the metal hydrates (hydroxides) or oxides. This method is a so-called sol-gel method and has features such that it is thereby possible to obtain super fine particles of the metal hydrates (hydroxides) or oxides and that it is thereby possible to obtain a homogeneous mixture of two or more metal hydrates (hydroxides) or oxides. Further, it is thereby possible to set the sintering temperature at a level lower than the dry method and the sintering time at a level shorter than the dry method.

By using highly pure metal alkoxides as mentioned above and highly pure water (such as deionized water or distilled water), it is possible to obtain particles (powder) of the metal hydrates (hydroxides) or oxides having a purity substantially higher than that attainable by the dry method.

The resulting sol and gel are usually amorphous as analyzed by X-ray analysis. However, it has been confirmed by experiments that they will be all readily converted to the corresponding metal oxides by sintering.

There is no particular restriction as to the concentration of the metal alkoxides during the hydrolysis, the manner of addition of water or the conditions for the hydrolysis. The amount of water added for the hydrolysis may be at any level in excess of the stoichiometric amount for the hydrolysis of the metal alkoxides, but is preferably in large excess. The reaction temperature is preferably at a level of the boiling point of the solvent, and the reaction time is preferably from 5 to 15 hours.

For the hydrolysis, an acid or a base, such as methoxy ethanol, ethanolamine, n-methyl ethanolamine, triethylamine, HCl, $HNO_3$ or $H_2SO_4$, may be added in amount, preferably in an amount of from 0.1 to 10 times the molar amount of the total of the starting materials to regulate the rate of the hydrolysis, to facilitate the sol-gel transformation or to increase the solubility prior to the hydrolysis.

The resulting hydrolyzates may be composed solely of metal oxides, but they may usually be amorphous hydrates (inclusive of hydroxides) in many cases, which can readily be converted to metal oxides by sintering at a relatively low temperature (200°-500 ° C.)

There is no particular restriction as to the manner of removing the solvent. The solvent may be removed by evaporation or filtration followed by drying.

There is no particular restriction as to the sintering conditions (such as the temperature, the number of times and the atmosphere). However, it is usual to employ a temperature of from 700° to 950° C., preferably from 800° to 900° C. and a time of from 1 to 20 hours, preferably from 1 to 8 hours, whereby the sintering can be conducted at a low temperature for a short period of time as compared with the conventional dry method.

In a thirteenth embodiment of the present invention, the metal elements for constituting the oxide system are Tl, Ca, Ba and Cu, and they are dissolved, dispersed or suspended in a solvent wholly in the form of alkoxides, followed by removal of the solvent to obtain a homogeneous mixture, which is then sintered to obtain a superconductor of a Tl-Ca-Ba-Cu-O system. The uniformly dissolved, dispersed or suspended mixture may be hydrolyzed prior to the removal of the solvent.

The alkoxides of the metal elements to be used in this embodiment are uniformly dissolved, dispersed or suspended in a solvent and then hydrolyzed by an addition of water, whereby they undergo a change from a sol to a gel and finally form particles of the metal hydrates (hydroxides) or oxides. This method is a so-called sol-gel method, which has been described in the foregoing twelfth embodiment.

As mentioned above, the metal alkoxides may usually be obtained in a high purity at a level of from 99.999 to 99.99999%. Therefore, by using such high purity metal compounds and highly pure water (such as deionized water or distilled water), it is possible to obtain particles (powder) of metal hydrates (hydroxides) or oxides having a purity substantially higher than that attainable by the conventional dry method. Further, since uniformly mixed super fine particles are obtainable, there is a merit such that the sintering temperature can be made low and the reaction time can be made short as compared with the dry method.

The sol and the gel obtained by this method are usually amorphous as analyzed by the X-ray analysis, and it has been confirmed by experiments that they will be all converted to the metal oxides by sintering.

The alkoxides of thallium, calcium, barium and copper used in this embodiment may be of any structures or forms. Namely, the alkoxy group constituting such a metal alkoxide may have any number of carbon atoms, and may be an alkoxy group from a polyhydric alcohol. Preferred specific examples of such an alkoxy group include a methoxy group, an ethoxy group, a propoxy group, an isopropoxy group, a butoxy group, a t-butoxy group, a sec-butoxy group and ethylene glycol. However, the alkoxy group is not limited to such specific examples.

Further, there is no particular restriction as to the number of alkoxy groups bonded to a metal element. At least one such group may be bonded to a metal element.

The solvent useful in this embodiment includes, for example, methyl alcohol, ethyl alcohol, isopropyl alcohol, butanol, benzene, toluene, xylene, tetrahydrofuran, diethyl ether, diphenyl ether, DMF, a primary amine, a secondary amine and a tertiary amine.

The hydrolysis and the sintering can be conducted in the same manner as described in the foregoing embodiments.

Now, the present invention will be described in further detail with reference to Examples. However, it should be understood that the present invention is by no means restricted to such specific Examples.

EXAMPLE 1 and COMPARATIVE EXAMPLES 1 and 2

So as to bring the composition of the desired superconductor of an oxide system to $(La_{0.9}Sr_{0.1})_2CuO_4$, isopropoxides of La, Sr and Cu (each having a purity of at least 99.999%) were added in a predetermined ratio in a total amount of 8 g in 1 liter of isopropyl alcohol, and uniformly dispersed (partially dissolved). This dispersion was adjusted to 80° C. and subjected to hydrolysis by a dropwise addition of a large excess amount of deionized water (200 ml) over a period of 1 hour, whereby gelled blackish brown precipitates were formed. The precipitates were collected by filtration, then dried and analyzed by an X-ray diffraction apparatus, whereby the precipitates were found to be composed mainly of a mixture of hydroxides of La, Sr and Cu and contain an amorphous substance of the respective oxides.

The dried product of the precipitates were presintered in an oxygen stream at 900° C. for 4 hours to obtain a porous presintered product. The presintered product was pulverized in a mortar and then formed into a pellet having a diameter of 10 mm and a thickness of 1.5 mm by means of a pelletizer. This pellet was again sintered in an oxygen stream at 900° C. for 8 hours to obtain a densely sintered product.

For the purpose of comparison, the above precipitates without being subjected to washing and a mixture of $La_2O_3$, $SrCO_3$ and CuO powders and a precipitate formed by adding small amounts of ammonia and oxalic acid to an aqueous solution of nitrates of Y, Ba and Cu, each prepared by using guaranteed reagents, were, respectively, presintered and sintered in the same manner as above to obtain sintered products according to the conventional dry method and coprecipitation method.

With respect to three types of samples, the temperature dependency of the resistivity was measured by a four terminal method by placing each sample provided with four indium electrodes with a space of 1.5 mm from an another in a criostat and gradually cooling it with a liquefied helium. The results are shown in FIG. 1.

In FIG. 1, curve 1 shows the characteristics of the sample prepared by the process of the present invention, curve 2 shows the characteristics of the sample according to the conventional dry method, and curve 3 shows the characteristics of the sample according to the conventional coprecipitation method.

From the results of FIG. 1, it is evident that as compared with the products of the conventional methods, the superconductor of an oxide system prepared by the process of the present invention undergoes a quick transition to the superconducting state with an abrupt drop of the resistivity to 0 when cooled. The onset temperature at which the resistivity of each sample has started to rapidly decrease to the superconducting state, the offset temperature at which the resistivity has become 0 and the difference between the two temperatures (the transition temperature range) are shown in Table 3. Further, at the superconducting state (4.3 K), the voltage applied to each sample was raised to gradually increase the current, and the critical current density at which the superconducting state has been broken and turns to a normal conducting state, was measured and shown in Table 3.

TABLE 3

| Example No. | Method for the preparation of the sample | Onset temp. (K.) | Offset temp. (K.) | Transition temperature range (K.) | Critical current density (A/cm$^2$) |
|---|---|---|---|---|---|
| Example 1 | Process of the present invention | 43.8 | 41.8 | 2.0 | 102.5 |

TABLE 3-continued

| Example No. | Method for the preparation of the sample | Onset temp. (K.) | Offset temp. (K.) | Transition temperature range (K.) | Critical current density (A/cm$^2$) |
|---|---|---|---|---|---|
| Comparative Example 1 | Dry method | 43.6 | 37.3 | 6.3 | 27.4 |
| Comparative Example 2 | Coprecipitation method | 42.7 | 26.9 | 15.8 | 15.1 |

From the results of Table 3, it is evident that the superconductor of an oxide system prepared by the process of the present invention has practically excellent superconducting characteristics such that as compared with the products obtained by the conventional methods, not only the temperature at which the resistivity becomes 0 is high, but also the range for transition from the normal conducting state to the superconducting state is narrow, and the critical current density is high. Whereas, with the products prepared by the conventional two methods, particularly by the coprecipitation method, the offset temperature, the transition temperature range and the critical current density are all inadequate for practical application.

With respect to the three types of the sintered samples, the structural analysis was conducted by e.g. the X-ray diffraction, whereby the sample by the process of the present invention was found to be a sintered product comprising a substantially unifom single phase of so-called K$_2$NiF$_4$ type (La$_{0.9}$Sr$_{0.1}$)$_2$CuO$_4$. On the other hand, the samples prepared by the conventional dry method and coprecipitation method were found to contain a perovskite structure of ABO$_3$ type (wherein A and B are metal elements) and relatively many other phases in addition to the K$_2$NiF$_4$ type phase. Especially the product by the coprecipitation method was found to have the ratio of elements substantially deviated from the desired composition. Thus, the poor characteristics of the superconductors of an oxide system prepared by the conventional methods as shown in FIG. 1 and Table 3, are considered to be attributable to the presence of such other phases and such compositional deviation.

The gelled hydrolyzate composed mainly of a mixture of hydroxides of La, Sr and Cu formed by the hydrolysis according to the process of the present invention and the sintered product thereof obtained by sintering it at a temperature of from 200° to 500° C., were found to be composed of pure and unifom super fine particles at a level of from a few tens to few hundreds Å, respectively, by the analysis (observation by means of a scanning type electron microscope). Namely, such a nature is considered to effectively serve to obtain the sintered product of the desired composition.

EXAMPLE 2 and COMPARATIVE EXAMPLE 3

By using alkoxides of at least one element selected from the group consisting of Mg, Ca, Sr and Ba of Group IIa of the Periodic Table, at least one element selected from the group consisting of Sc, Y and lanthanoids of Group IIIa of the Periodic Table and Cu, experiments were conducted in the same manner as in Example 1. The combinations used include, for example, La-Sr-Ba-Cu, Y-La-Ba-Ca-Cu, Sc-Ba-Cu, Y-La-Ba-Cu, Y-Ba-Mg-Cu, Ho-Ba-Cu (Ho is holmium), Er-Ba-Cu (Er is erbium) and Yb-Ba-Cu (Yb is ytterbium).

At the same time, for the purpose of the comparison, sintered products having the same intended compositions as above were prepared by the conventional dry method and the coprecipitation method and evaluated.

As a result, it has been found that in each of the above combinations, a superconductor of an oxide system having a critical temperature of from 20 to 95 K can be prepared by the process of the present invention. In each case, the product by the process of the present invention had superior superconductivity as compared with the products by the conventional methods, as shown by the comparison between Example 1 and Comparative Examples 1 and 2.

With respect to each of the samples used in Examples 1 and 2, the susceptibility was measured, whereby in each case, Meissner effects were observed at a temperature of not higher than the temperature at which the resistivity became 0.

EXAMPLE 3 and COMPARATIVE EXAMPLES 4 and 5

To a dispersion of 10 mmol of yttrium methoxide in ethanol (500 ml), 30%, relative to the ytterbium methoxide, of HCN was added to obtain an ethanol solution (partly dispersed). Separately, to a dispersion (partly dissolved) of 20 mmol of barium ethoxide in ethanol (200 ml), 20%, relative to the barium ethoxide, of methylamine was added to obtain an ethanol solution (partly dispersed). Further, to a dispersion (partly dissolved) of 30 mmol of Copper propoxide in ethanol (200 ml) 10%, relative to the Copper propoxide, of concentrated hydrochloric acid (36%) was added to obtain an ethanol solution (partly dispersed).

So as to bring the composition of the desired superconductor of an oxide system to YbBa$_2$Cu$_3$O$_{7-\delta}$, the three types of ethanol solutions (partly dispersed) thus obtained were uniformly mixed in a predetermined ratio. The total amount of the alkoxides was 60 mmol, and the total amount of ethanol solvent was 900 ml. This mixed solution (partly dispersed) was adjusted to 80° C. and subjected to hydrolysis by a dropwise addition of deionized water (140 ml) over a period of 0.3 hour, whereby gelled blackish brown precipitates were formed. The precipitates were collected by filtration, dried and analyzed by an X-ray diffraction apparatus, whereby the precipitates were found to be composed mainly of a mixture of hydroxides of Yb, Ba and Cu and contain an amorphous substance of the respective oxides.

The dried product of the precipitates were presintered in an oxygen stream at 900° C. for 4 hours to obtain a porous presintered product. The presintered product was pulverized in a mortar and then formed into a pellet having a diameter of 10 mm and a thickness of 1.5 mm by means of a pelletizer. This pellet was again sintered in an oxygen stream at 900° C. for 8 hours to obtain a densely sintered product.

For the purpose of comparison, a mixture of Yb$_2$O$_3$, BaCO$_3$ and CuO powders and a precipitate formed by adding small amounts of ammonia and exalic acid to an aqueous solution of nitrates of Yb, Ba and Cu, each prepared by using guaranteed reagents, were, respectively, presintered and sintered in the same manner as above, to obtain sintered products by the conventional dry method and the coprecipitation method (Comparative Examples 4 and 5).

With respect to three types of samples, the temperature dependency of the resistivity was measured in the same manner as in Example 1 by a four terminal method. The results are shown in FIG. 2.

Figure 2:
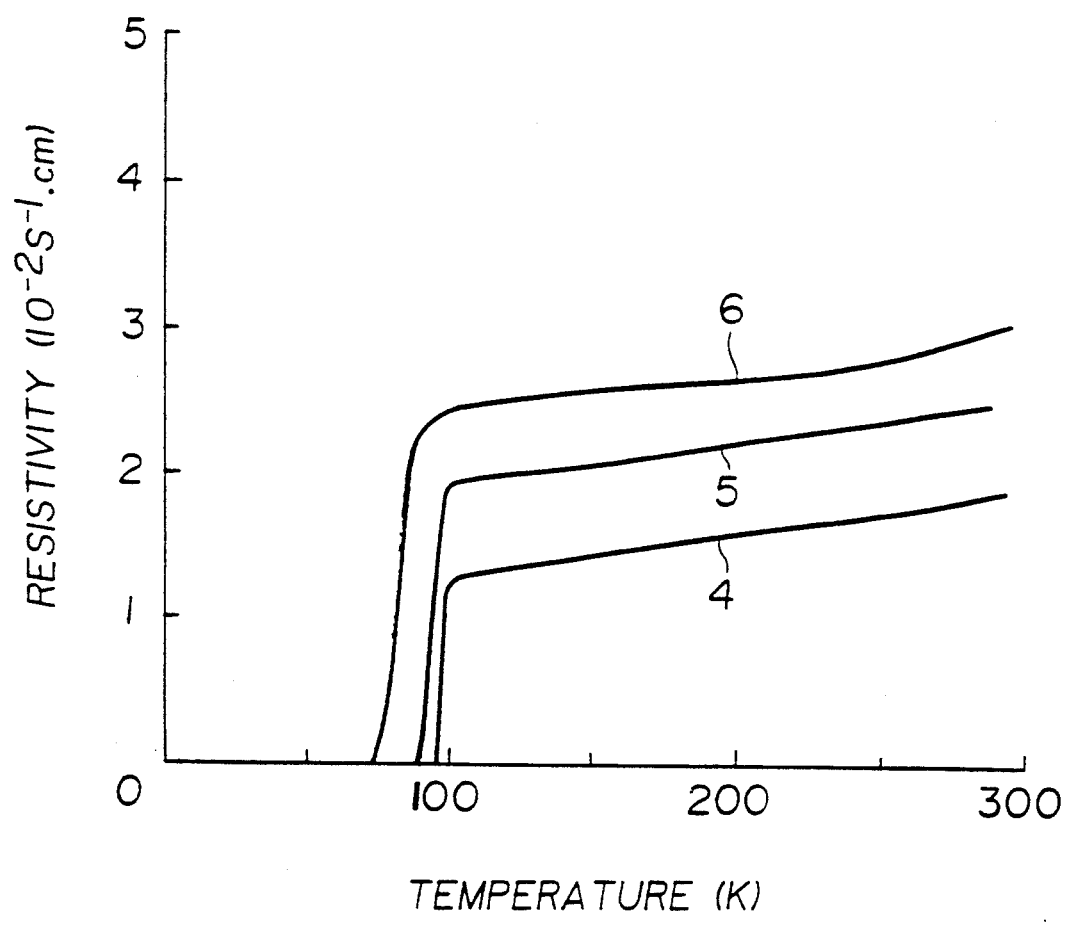
FIG. 2 is a graph showing the relation between the resistivity and the temperature of superconductors of an oxide system obtained in Example 3 (curve 4) and Comparative Examples 4 and 5 (curves 5 and 6).

In FIG. 2, curve 4 shows the characteristics of the sample prepared by the process of the present invention, curve 5 shows the characteristics of the sample according to the conventional dry method, and curve 6 shows the characteristics of the sample according to the conventional coprecipitation method.

From the results of FIG. 2, it is evident that as compared with the products of the conventional methods, the superconductor of an oxide system prepared by the process of the present invention undergoes a quick transition to the superconducting state with its resistivity rapidly droping to 0. The onset temperature, the offset temperature and the transition temperature range are shown in Table 4. Further, the critical current density of each sample at the liquefied nitrogen temperature (77.4 K) was obtained and shown in Table 4.

TABLE 4

| Example No. | Method for the preparation of the sample | Onset temp. (K.) | Offset temp. (K.) | Transition temperature range (K.) | Critical current density (A/cm$^2$) |
| --- | --- | --- | --- | --- | --- |
| Example 3 | Process of the present invention | 99.2 | 98.1 | 1.1 | 127 |
| Comparative Example 4 | Dry method | 94.5 | 89.9 | 4.6 | 47.0 |
| Comparative Example 5 | Coprecipitation method | 90.1 | 82.4 | 7.7 | 40.3 |

From the results in Table 4, it is evident that as compared with the products by the conventional methods, the superconductors of an oxide system prepared by the process of the present invention have practically excellent superconducting characteristics such that not only the temperature at which the resistivity drops completely to 0 is high, but also the range for the transition from the normal conducting state to the superconducting state is narrow, and the critical current density is very high. Whereas, with the products prepared by the conventional methods, particularly by the coprecipitation method, the offset temperature, the transition temperature range and the critical current density are all inadequate for practical application.

With respect to each of the three types of sintered product samples, the structural analysis was conducted by e.g. the X-ray diffraction method, whereby each of the products obtained by the process of the present invention was found to be a sintered product composed of a substantially unifom single phase of a so-called oxygen-deficient type perovskite structure. On the other hand, the products by the conventional dry method and the coprecipitation method were found to contain relatively large proportions of other phases in addition to the superconductive phase. Especially the product by the coprecipitation method was found to have the ratio of elements deviated from the desired composition. Thus, the poor characteristics of the superconductors of an oxide system according to the conventional methods as shown in FIG. 2 and Table 4, are considered to be attributable to the deviation of the composition and the like.

It has been found by the analysis (observation by means of a scanning type electron microscope) that in the process of the present invention, the gelled hydrolyzate composed mainly of ytteribium hydroxide, barium hydroxide, copper hydroxide and the sintered product thereof, are composed of pure unifom super fine particles of a few tens to a few hundreds Å. Namely, such a nature is considered to effectively serve to obtain the sintered product of the desired composition.

EXAMPLE 4 and COMPARATIVE EXAMPLES 6 and 7

To a dispersion of 10 mmol of holmium ethoxide in ethanol (400 ml), 20%, relative to the holmium ethoxide, of methylamine was added to obtain an ethanol solution (partly dispersed). Separately, to a dispersion (partly dissolved) of 20 mmol of strontium methoxide in ethanol (400 ml), 10%, relative to the strontium methoxide, HCN was added to obtain an ethanol solution (partly dispersed). Further, to a dispersion (partly dissolved) of 30 mmol of copper propoxide in ethanol (400 ml), 10%, relative to the copper propoxide, of concentrated hydrochloric acid (36%) was added to obtain an ethanol solution.

So as to bring the composition of the desired superconductor of an oxide system to $HoSr_2Cu_3O_{7\delta}$, the three types of ethanol solutions (partly dispersed) thus obtained were uniformly mixed. The total amount of the alkoxides was 60 mmol, and the total amount of ethanol solvent was 1.2 liter. This mixed solution (partly dispersed) was adjusted to 80° C. and subjected to hydrolysis by a dropwise addition of deionized water (500 ml) over a period of 1 hour, whereby a gel of a mixture of hydrolyzates was obtained.

The gel thus obtained, was preliminarily baked in air at 500° C. for 2 hours and then presintered in an oxygen stream at 950° C. for 3 hours to obtain a coarse presintered product. The presintered product was pulverized and formed into a pellet in the same manner as in Example 3. This pellet was sintered in the same manner as in Example 3 in an oxygen stream at 950° C. for 8 hours to obtain a densely sintered product.

For the purpose of comparison, samples by the conventional dry method and by the coprecipitation method were prepared in the same manner as in Example 3 by using a mixture of $Ho_2O_3$, $SrCO_3$ and CuO powders and nitrates of Ho, Sr and Cu, and they were, respectively, presintered and sintered in the same manner as above to obtain two types of sintered products.

With respect to the three types of samples, the temperature dependency of the resistivity and the critical current density were measured in the same manner as in Example 3. The results are shown in FIG. 3 and Table 5.

Figure 3:
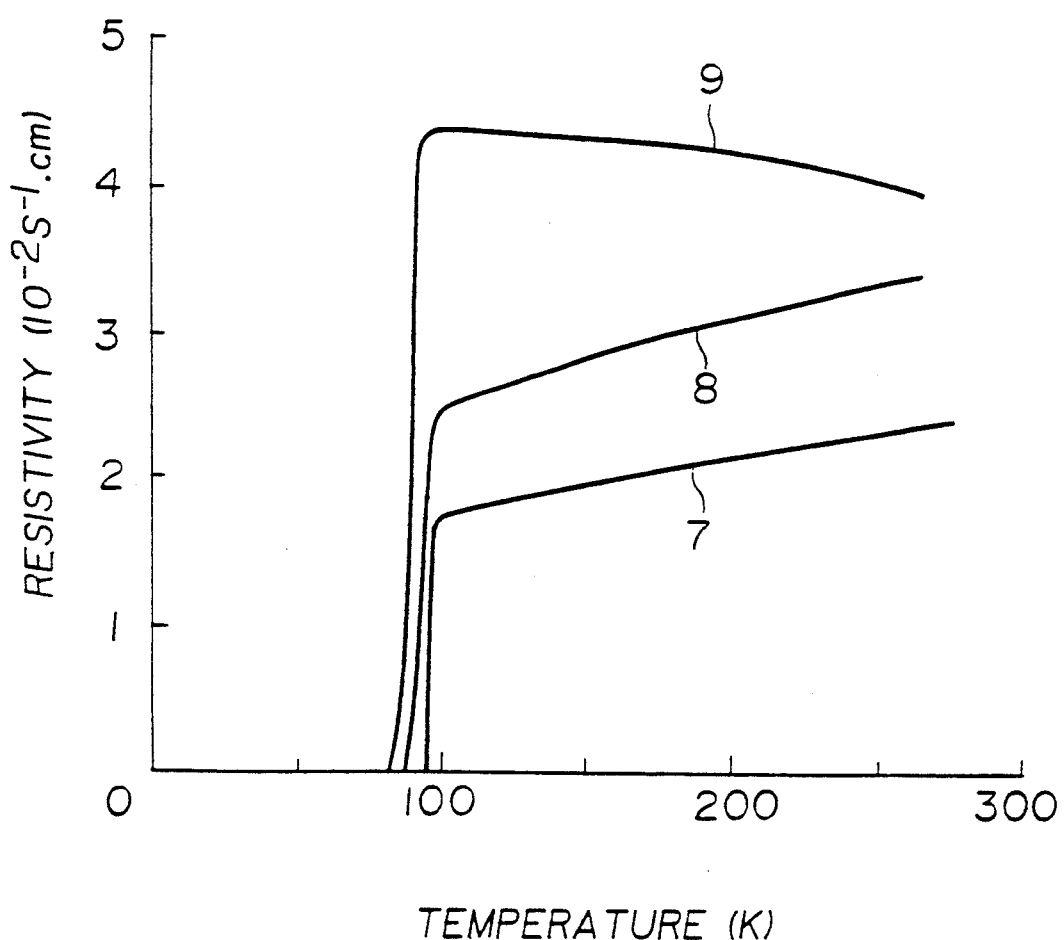
FIG. 3 is a graph showing the relation between the resistivity and the temperature of superconductors of an oxide system obtained in Example 4 (curve 7) and Comparative Examples 6 and 7 (curves 8 and 9).

In FIG. 3, curve 7 shows the characteristics by the process of the present invention, curve 8 shows the characteristics by the conventional dry method, and curve 9 shows the characteristics by the conventional coprecipitation method. The critical current density is a value measured at the liquefied nitrogen temperature (77.4 K).

TABLE 5

| Example No. | Method for the preparation of the sample | Onset temp. (K.) | Offset temp. (K.) | Transition temperature range (K.) | Critical current density (A/cm$^2$) |
| --- | --- | --- | --- | --- | --- |
| Example 4 | Process of the present invention | 96.2 | 94.1 | 2.1 | 87.6 |
| Comparative Example 6 | Dry method | 94.8 | 92.0 | 2.8 | 47.3 |
| Comparative Example 7 | Coprecipitation method | 93.8 | 87.5 | 6.3 | 30.1 |

From the results in FIG. 3 and Table 5, it is evident that as compared with the products of the conventional methods, the superconductor of an oxide system prepared by the process of the present invention has practically excellent superconducting characteristics such that the critical temperature for the transition to the superconducting state is high, the transition temperature range is narrow, and the critical current density is high. Whereas, with the products prepared by the conventional two methods, the critical temperature, the transition temperature range and the critical current density are inadequate for practical application. Especially the product by the coprecipitation method did not show superconductivity at the liquefied nitrogen temperature (77.4 K) although the composition was the same as the other two samples. The poor characteristics of the superconductors of an oxide system according to the conventional methods were found to be attributable to relatively many unwanted phases present in addition to the high temperature superconductive phase, as a result of the analysis such as X-ray diffraction.

Further, with respect to each of the samples obtained in Examples 3 and 4, the susceptibility was measured, whereby in each case Meissner effects were observed at a temperature of not higher than the temperature at which the resistivity became 0.

EXAMPLE 5 and COMPARATIVE EXAMPLES 8 and 9

So as to bring the composition of the desired superconductor of an oxide system to $Sm_{0.3}Ba_{0.6}CuO_3$, samarium butoxide, barium ethoxide and copper ethoxide (each having a purity of at least 99.999%) were added in a predetermined ratio in a total amount of 8 g in 1 liter of butylalcohol, and uniformly dissolved (partially dispersed). This solution was adjusted to 80° C. and subjected to hydrolysis by an addition of a large excess amount of deionized water (200 ml) over a period of one hour, whereby gelled blackish brown precipitates were formed. The precipitates were collected by filtration, then dried and analyzed by an X-ray diffraction apparatus, whereby the precipitates were found to be composed mainly of a mixture of hydroxides of Sm, Ba and Cu and contain an amorphous substance of the respective oxides.

The dried product of the precipitates were presintered in an oxygen stream at 900° C. for 4 hours to obtain a porous presintered product. The presintered product was pulverized in a mortar and then formed into a pellet having a diameter of 10 mm and a thickness of 1.5 mm by means of a pelletizer. This pellet was again sintered in an oxygen stream at 900° C. for 8 hours to obtain a densely sintered product.

For the purpose of comparison, the above precipitates without being subjected to washing and a mixture of $Sm_2O_3$, $BaCO_3$ and CuO powders and a precipitate formed by adding small amounts of ammonia and oxalic acid to an aqueous solution of nitrates of Sm, Ba and Cu, each prepared by using guaranteed reagents, were; respectively, presintered and sintered in the same manner as above to obtain pellets according to the conventional dry method and coprecipitation method, respectively.

With respect to three types of samples, the temperature dependency of the resistivity was measured by a four terminal method. The results are shown in FIG. 4.

Figure 4:
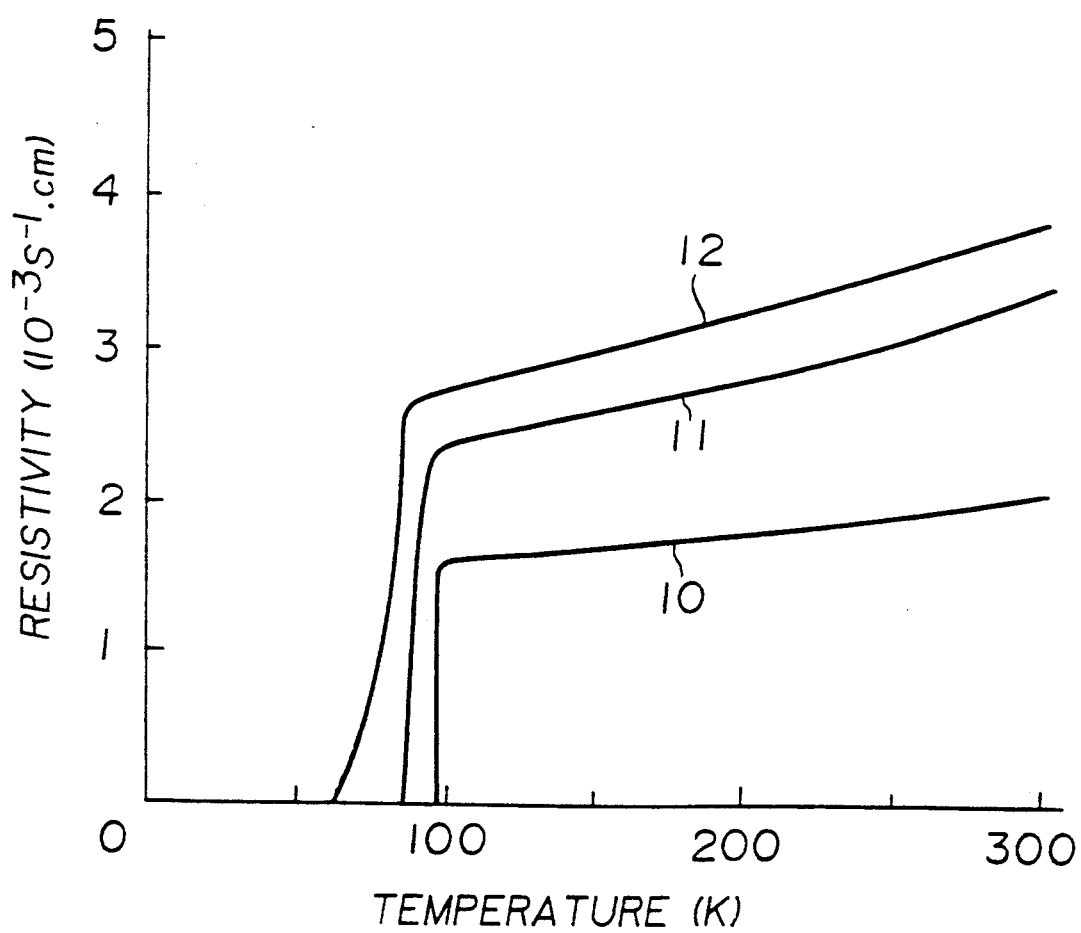
FIG. 4 is a graph showing the relation between the resistivity and the temperature of superconductors of an oxide system obtained in Example 5 (curve 10) and Comparative Examples 8 and 9 (curves 11 and 12).

In FIG. 4, curve 10 shows the characteristics of the sample prepared by the process of the present invention, curve 11 shows the characteristics of the sample according to the conventional dry method and curve 12 shows the characteristics of the sample according to the conventional coprecipitation method.

From the results of FIG. 4, it is evident that as compared with the product of the conventional methods, the superconductor of an oxide system prepared by the process of the present invention undergoes a quick transition to the superconducting state with its resistivity rapidly droping to 0 when cooled. With respect to each sample, the onset temperature, the offset temperature and the transition temperature range were measured and shown in Table 6. Further, the critical current density of each sample at the liquefied nitrogen temperature (77.4 K) was measured and shown in Table 6.

TABLE 6

| Example No. | Method for the preparation of the sample | Onset temp. (K.) | Offset temp. (K.) | Transition temperature range (K.) | Critical current density (A/cm$^2$) |
| --- | --- | --- | --- | --- | --- |
| Example 5 | Process of the present invention | 98.5 | 96.3 | 2.2 | 223.6 |
| Comparative Example 8 | Dry method | 96.8 | 85.0 | 11.8 | 44.3 |

TABLE 6-continued

| Example No. | Method for the preparation of the sample | Onset temp. (K.) | Offset temp. (K.) | Transition temperature range (K.) | Critical current density (A/cm$^2$) |
|---|---|---|---|---|---|
| Comparative Example 9 | Coprecipitation method | 88.7 | 63.6 | 25.1 | — |

From the results in Table 6, it is evident that as compared with the products by the conventional methods, the superconductors of an oxide system prepared by the process of the present invention have practically excellent superconducting characteristics such that not only the temperature at which the resistivity drops completely to 0 is high, but also the range for the transition from the normal conducting state to the superconducting state is narrow, and the critical current density is very high. Whereas, with the products prepared by the conventional methods, particularly by the coprecipitation method, the offset temperature, the transition temperature range and the critical current density are all inadequate for practical application.

With respect to each of the three types of sintered product samples, the structural analysis was conducted by e.g. the X-ray diffraction method, whereby each of the products obtained by the process of the present invention was found to be a sintered product composed of a substantially unifom single phase of a so-called three-layer oxygen-deficient type perovskite structure. On the other hand, the products by the conventional dry method and the coprecipitation method were found to contain relatively large proportions of other phases in addition to the three-layer oxygen-deficient type perovskite structure. Especially the product by the coprecipitation method was found to have the ratio of elements deviated from the desired composition. Thus, the poor charεcteristics of the superconductors of an oxide system according to the conventional methods as shown in FIG. 4 and Table 6, are considered to be attributable to the deviation of the composition and the like.

It has been found by the analysis (observation by means of a scanning type electron microscope) that in the process of the present invention, the gelled hydrolyzate composed mainly of samarium hydroxide, barium hydroxide and copper hydroxide formed by the hydrolysis and the sintered product thereof obtained by sintering at a temperature of from 200° to 500° C., are composed of pure unifom super fine particles of a few tens to a few hundreds Å. Namely, such a nature is considered to effectively serve to obtain the sintered product of the desired composition.

EXAMPLE 6 and COMPARATIVE EXAMPLES 10 and 11

So as to bring the composition of the desired superconductor of an oxide system to YBa$_2$Cu$_3$O$_7$, yttrium butoxide, barium ethoxide and copper ethoxide (each having a purity of at least 99.999%) were uniformly dissolved (partly dispersed) in a total amount of 6 g in 500 ml of butyl alcohol at 80° C. To this suspension, 500 ml of distilled water containing 5 ml of ammonia was dropwise added over a period of one hour to conduct the hydrolysis, whereby precipitates of the mixture of products was obtained.

The precipitates thus obtained, was preliminarily baked in air at 500° C. for 2 hours and then presintered in an oxygen stream at 950° C. for 3 hours to obtain a coarse presintered product. The presintered product was pulverized and formed into a pellet in the same manner as in Example 5. This pellet was again sintered in an oxygen stream at 960° C. for 6 hours to obtain a densely sintered product.

For the purpose of comparison, samples by the conventional dry method and by the coprecipitation method were prepared by using a mixture of Y$_2$O$_3$, BaCO$_3$ and CuO powders and nitrates of Y, Ba and Cu, which were all guaranteed reagents, respectively, and they were, respectively, presintered and sintered in the same manner as above to obtain two types of sintered products.

With respect to the three types of samples, the temperature dependency of the resistivity and the critical current density were measured in the same manner as in Example 5. The results are shown in FIG. 5 and Table 7.

Figure 5:
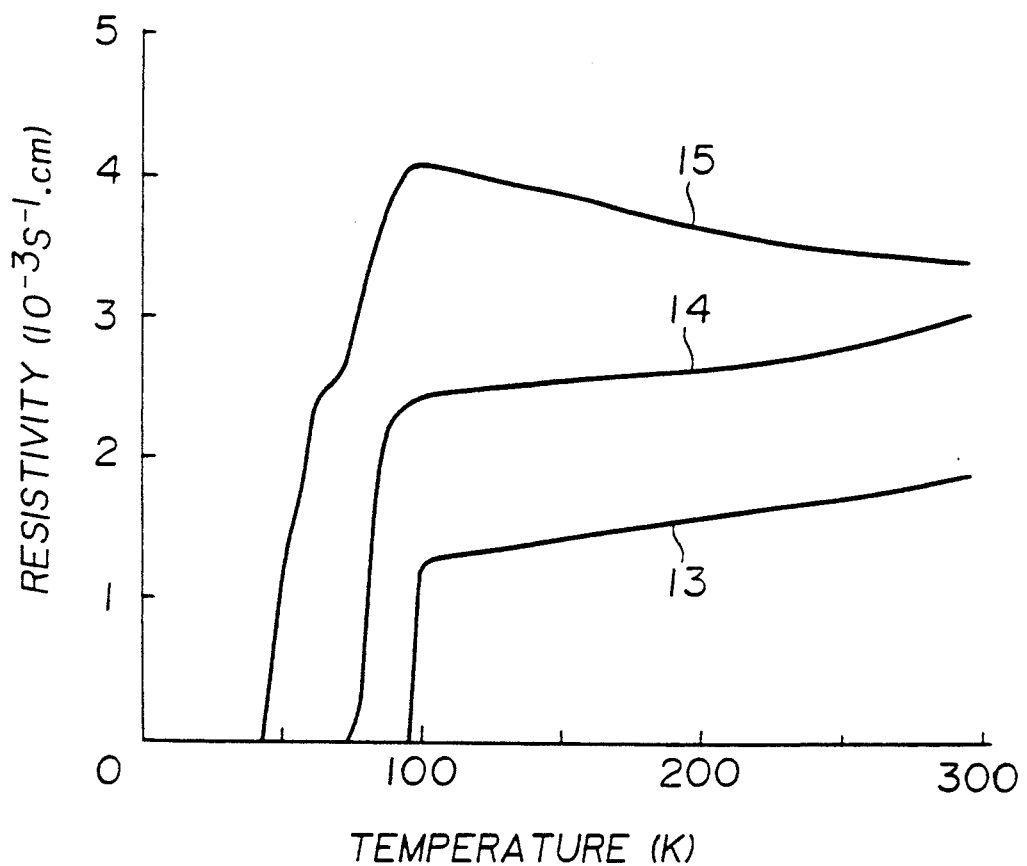
FIG. 5 is a graph showing the relation between the resistivity and the temperature of superconductors of an oxide system obtained in Example 6 (curve 13) and Comparative Examples 10 and 11 (curves 14 and 15).

In FIG. 5, curve 13 shows the characteristics by the process of the present invention, curve 14 shows the characteristics by the conventional dry method, and curve 15 shows the characteristics by the conventional coprecipitation method. The critical current density is a value measured at the liquefied nitrogen temperature (77.4 K).

TABLE 7

| Example No. | Method for the preparation of the sample | Onset temp. (K.) | Offset temp. (K.) | Transition temperature range (K.) | Critical current density (A/cm$^2$) |
|---|---|---|---|---|---|
| Example 6 | Process of the present invention | 99.8 | 96.6 | 3.2 | 174.1 |
| Comparative Example 10 | Dry method | 98.0 | 80.9 | 17.1 | 30.7 |
| Comparative Example 11 | Coprecipitation method | 93.0 | 41.6 | 51.4 | — |

From the results in FIG. 5 and Table 7, it is evident that as compared with the products of the conventional methods, the superconductor of an oxide system prepared by the process of the present invention has practically excellent superconducting characteristics such that the critical temperature for the transition to the superconducting state is high, the transition temperature range is narrow, and the critical current density is high. Whereas, with the products prepared by the conventional two methods, the critical temperature, the transition temperature range and the critical current density are inadequate for practical application. Especially the product by the coprecipitation method did not show superconductivity at the liquefied nitrogen temperature (77.4 K) although the composition was the same as the other two samples. The poor characteristics of the superconductors of an oxide system according to the conventional methods were found to be attributable to relatively many unwanted phases present in addition to the high temperature superconductive phase, as a result of the analysis such as X-ray diffraction.

With respect to each of the samples used in Examples 5 and 6, the susceptibility was measured, whereby in each case, Meissner effects were observed at a temperature of not higher than the temperature at which the resistivity became 0.

EXAMPLE 7 and COMPARATIVE EXAMPLES 12 and 13

So as to bring the composition of the desired superconductor of an oxide system to $(La_{0.9}Sr_{0.1})_2CuO_4$, lanthanum ethoxide, strontium methoxide and copper ethoxide (each having a purity of at least 99.999%) were added in a predetermined ratio in a total amount of 10 g in 200 ml of ethanol, and uniformly dispersed (partly dissolved). Then, 30 g of monoethanolamine was added to this dispersion to completely dissolve the metal alkoxides. This solution was adjusted to 80° C. and subjected to hydrolysis by a dropwise addition of a large excess amount of deionized water (200 ml) over a period of one hour, whereby gelled blackish brown precipitates were formed. The precipitates were collected by filtration, then dried and analyzed by an X-ray diffraction apparatus, whereby the precipitates were found to be composed mainly of a mixture of hydroxides of La, Sr and Cu and contain an amorphous substance of the respective oxides.

The dried product of the precipitates were presintered in an oxygen stream at 900° C. for 4 hours to obtain a porous presintered product. The presintered product was pulverized in a mortar and then formed into a pellet having a diameter of 10 mm and a thickness of 1.5 mm by means of a pelletizer. This pellet was again sintered in an oxygen stream at 900° C. for 8 hours to obtain a densely sintered product.

For the purpose of comparison, a mixture of $La_2O_3$, $SrCO_3$ and CuO powders and a precipitate formed by adding small amounts of ammonia and oxalic acid to an aqueous solution of nitrates of La, Ba and Cu, each prepared by using guaranteed reagents, were, respectively, presintered and sintered in the same manner as above to obtain pellets according to the conventional dry method and coprecipitation method, respectively.

With respect to three types of samples, the temperature dependency of the resistivity was measured by a four terminal method. The results are shown in FIG. 6.

Figure 6:
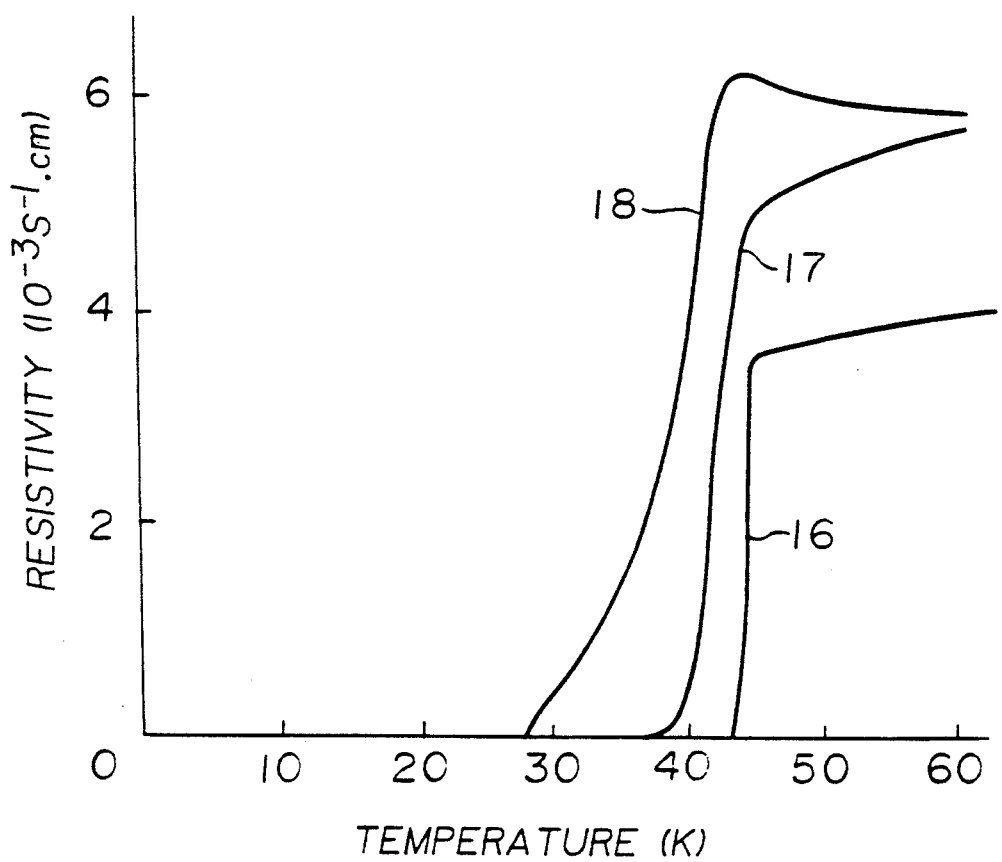
FIG. 6 is a graph showing the relation between the resistivity and the temperature of superconductors of an oxide system obtained in Example 7 (curve 16) and Comparative Examples 12 and 13 (curves 17 and 18).

In FIG. 6, curve 16 shows the characteristics of the sample prepared by the process of the present invention, curve 17 shows the characteristics of the sample according to the conventional dry method, and curve 18 shows the characteristics of the sample according to the conventional coprecipitation.

From the results of FIG. 6, it is evident that as compared with the product of the conventional methods, the superconductor of an oxide system prepared by the process of the present invention undergoes a quick transition to the superconducting state with its resistivity rapidly droping to 0. With respect to each sample, the onset temperature, the offset temperature and the transition temperature range are shown in Table 8. Further, the critical current density of each sample in the superconducting state (4.3 K) was obtained and shown in Table 8.

TABLE 8

| Example No. | Method for the preparation of the sample | Onset temp. (K.) | Offset temp. (K.) | Transition temperature range (K.) | Critical current density (A/cm$^2$) |
|---|---|---|---|---|---|
| Example 7 | Process of the present invention | 44.7 | 43.4 | 1.3 | 145.9 |
| Comparative Example 12 | Dry method | 43.6 | 37.3 | 6.3 | 27.4 |
| Comparative Example 13 | Coprecipitation method | 42.7 | 26.9 | 15.8 | 15.1 |

From the results in Table 8, it is evident that as compared with the products by the conventional methods, the superconductor of an oxide system prepared by the process of the present invention has practically excellent superconducting characteristics such that the temperature at which the resistivity drops to 0 is high, the range for the transition from the normal conducting state to the superconducting state is very narrow and the critical current density is very high. Whereas, with the products by the conventional methods, particularly by the coprecipitation method, the offset temperature, the transition temperature range and the critical current density are all inadequate for practical application.

With respect to each of the above three types of sintered product samples, the structural analysis was conducted by e.g. the X-ray diffraction method, whereby the product prepared by the process of the present invention was found to be composed of a substantially unifom single phase of a so-called $K_2NiF_4$ type $(La_{0.9}Sr_{0.1})_2CuO_4$. On the other hand, the products by the conventional dry method and the coprecipitation method were found to contain relatively large proportions of a perovskite structure of $ABO_3$ type (wherein A and B are metal elements) and other phases in addition to the $K_2NiF_4$ type phase. Especially the product by the coprecipitation method was found to have the ratio of elements substantially deviated from the desired composition. Thus, the poor characteristics of the superconductors of an oxide system prepared by the conventional methods as shown in FIG. 6 and Table 8, are considered to be attributable to e.g. such compositional deviation.

The gelled hydrolyzate composed mainly of a mixture of hydroxides of La, Sr and Cu formed by the hydrolysis according to the process of the present invention and the sintered product thereof obtained by sintering it were found to be composed of pure and unifom super fine particles at a level of from a few tens to few hundreds Å, respectively, by the analysis (observation by means of a scanning type electron microscope). Namely, such a nature is considered to effectively serve to obtain the sintered product of the desired composition.

EXAMPLE 8 and COMPARATIVE EXAMPLES 14 and 15

So as to bring the composition of the desired superconductor of an oxide system to $YBa_2Cu_3O_7$, yttrium ethoxide, barium methoxide and copper ethoxide were uniformly dispersed (partly dissolved) in a total amount of 10 g in 200 ml of ethanol at 80° C. Then, 40 g of monoethanolamine was added to this dispersion to completely dissolve the metal alkoxides. To this solution, 500 ml of distilled water was dropwise added over a period of one hour to conduct the hydrolysis, whereby a gel of a mixture of the reaction products was obtained.

The gel thus obtained was preliminarily calcined in air at 500° C. for 2 hours. Then, the calcined product was presintered in an oxygen stream at 950° C. for 3 hours to obtain a coarse presintered product. The presintered product was pulverized and then formed into a pelletized sample in the same manner as in Example 7. This pellet was sintered in an oxygen stream at 950° C. for 8 hours in the same manner as in Example 7 to obtain a densely sintered product.

For the purpose of comparison, samples were prepared by using a mixture of $Y_2O_3$, $BaCO_3$ and CuO powders and nitrates of Y, Ba and Cu, respectively in the same manner as in Example 7 and subjected to the presintering and the sintering in the same manner as above to obtain two types of sintered products.

With respect to the three types of samples thus obtained, the temperature dependency of the resistivity and the critical current density were measured in the same manner as in Example 7. The results are shown in FIG. 7 and Table 9.

Figure 7:
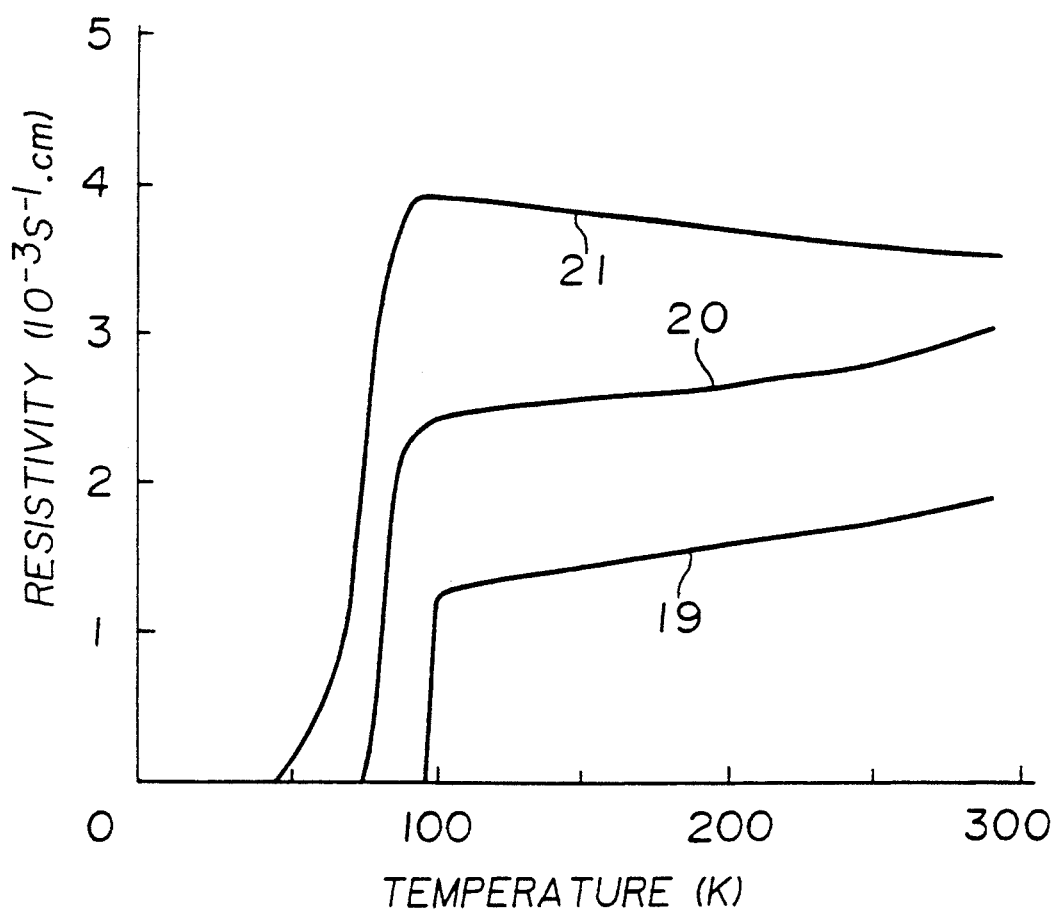
FIG. 7 is a graph showing the relation between the resistivity and the temperature of superconductors of an oxide system obtained in Example 8 (curve 19) and Comparative Examples 14 and 15 (curves 20 and 21).

In FIG. 7, curve 19 shows the characteristics by the process of the present invention, curve 20 shows the characteristics by the conventional dry method, and curve 21 shows the characteristics by the conventional coprecipitation method. The critical current density is the value measured at liquefied nitrogen temperature (77.4 K).

that the critical temperature for the transition to the superconducting state is high, the transition temperature range is narrow, and the critical current density is high. Whereas, with the products prepared by the conventional two methods, the critical temperature, the transition temperature range and the critical current density are inadequate for practical application. Especially the product by the coprecipitation method did not show superconductivity at the liquefied nitrogen temperature (77.4K) although the composition was the same as the other two samples. The poor characteristics of the superconductors of an oxide system according to the conventional methods were found to be attributable to relatively many unwanted phases present in addition to the high temperature superconductive phase, as a result of the analysis such as X-ray diffraction method as used in Example 7.

With respect to each of the samples used in Examples 7 and 8, the susceptibility was measured, whereby in each case, Meissner effects were observed at a temperature of not higher than the temperature at which the resistivity became 0.

EXAMPLE 9 and COMPARATIVE EXAMPLES 16 AND 17

So as to bring the composition of the desired superconductor of an oxide system to $(La_{0.9}Sr_{0.1})_2CuO_4$, ethoxides of La, Sr and Cu (each having a purity of at least 99.999%) were added in a predetermined ratio in a total amount of 6 g in 100 ml of ethanol, and mixed. Then, 10 ml of concentrated hydrochloric acid (36%) was added thereto to dissolve all the metal alkoxides. This solution was adjusted to 80° C. and subjected to hydrolysis by a dropwise addition of a large excess amount of deionized water (100 ml) containing 15 g of KOH over a period of one hour, whereby gelled blackish brown precipitates were formed. The precipitates were collected by filtration, then washed with deionized water until the water used for the washing was substantially neutral, dried and analyzed by an X-ray diffraction apparatus, whereby the precipitates were found to be composed mainly of a mixture of hydroxides of La, Sr and Cu and contain an amorphous substance of the respective oxides.

The dried product of the precipitates were presintered in a oxygen stream at 920° C. for 3 hours to obtain a porous presintered product. The presintered product was pulverized in a mortar and the formed into a pellet having a diameter of 10 mm and a thickness of 1.5 mm by means of a pelletizer. This pellet was again sintered in an oxygen stream at 920° C., for 7 hours to obtain a densely sintered product.

For the purpose of comparison, a mixture of $La_2O_3$, $SrCO_3$ and CuO powders and a precipitate formed by adding small amounts of ammonia and oxalic acid to an

TABLE 9

| Example No. | Method for the preparation of the sample | Onset temp. (K.) | Offset temp. (K.) | Transition temperature range (K.) | Critical current density (A/cm$^2$) |
|---|---|---|---|---|---|
| Example 8 | Process of the present invention | 99.0 | 95.8 | 3.2 | 164.6 |
| Comparative Example 14 | Dry method | 97.5 | 77.5 | 20.0 | 37.6 |
| Comparative Example 15 | Coprecipitation method | 92.7 | 42.5 | 50.2 | — |

From the results in FIG. 7 and Table 9, it is evident that as compared with the products of the conventional methods, the superconductor of an oxide system prepared by the process of the present invention has practically excellent superconducting characteristics such aqueous solution of nitrates of La, Sr and Cu, each prepared by using guaranteed reagents, were, respectively, presintered and sintered in the same manner as above, to obtain sintered products by the conventional dry method and the coprecipitation method (Comparative Examples 16 and 17).

With respect to three types of samples, the temperature dependency of the resistivity was measured by a four terminal method. The results are shown in FIG. 8.

Figure 8:
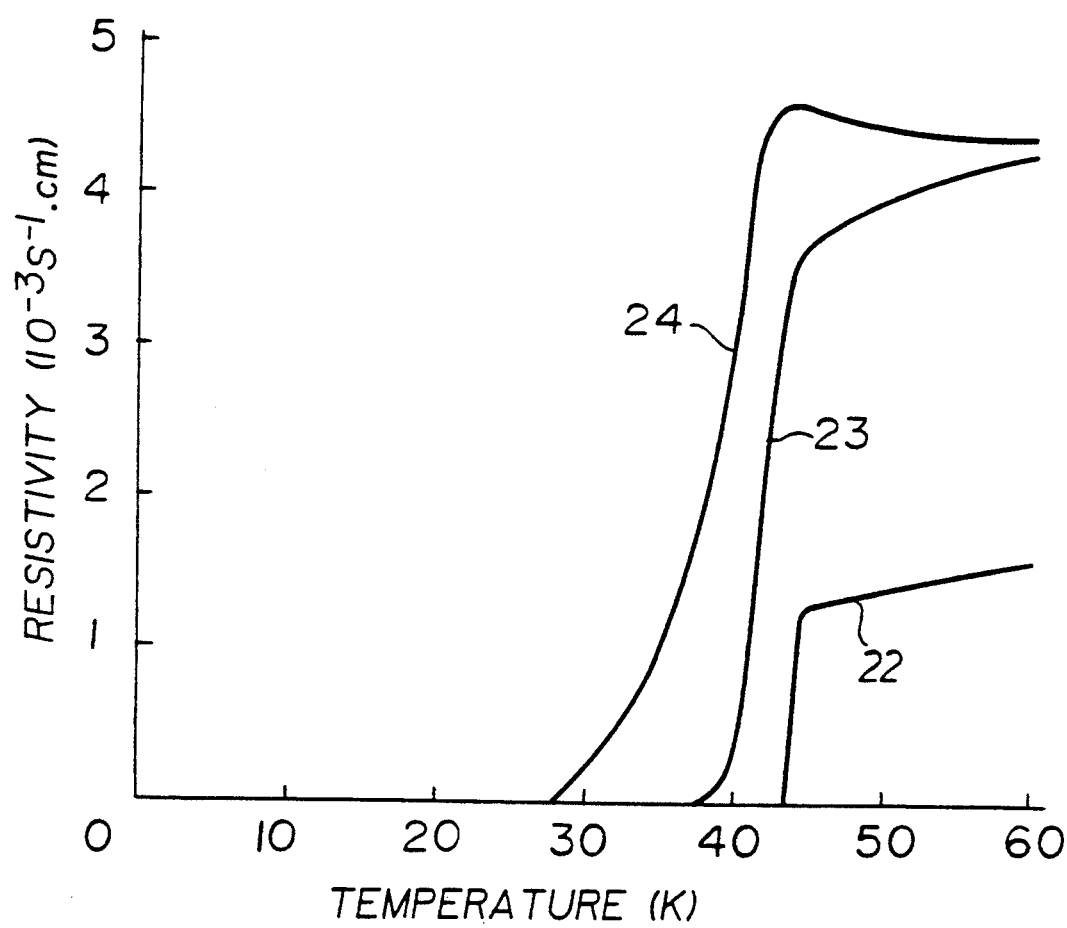
FIG. 8 is a graph showing the relation between the resistivity and the temperature of superconductors of an oxide system obtained in Example 9 (curve 22) and Comparative Examples 16 and 17 (curves 23 and 24).

In FIG. 8, curve 22 shows the characteristics of the sample prepared by the process of the present invention, curve 23 shows the characteristics of the sample according to the conventional dry method, and curve 24 shows the characteristics of the sample according to the conventional coprecipitation method.

With respect to each sample, the onset temperature, the offset temperature and the transition temperature range are shown in Table 10. Further, the critical current density of each sample in the superconducting state (4.3 K) was obtained and shown in Table 10.

oxide system according to the conventional methods as shown in FIG. 8 and Table 10, are considered to be attributable to the deviation of the composition and the like.

The gelled hydrolyzate composed mainly of a mixture of hydroxides of La, Sr and Cu formed by the hydrolysis according to the process of the present invention and the sintered product thereof obtained by sintering it at a temperature of from 200° to 500°, were found to be composed of pure and uniform super fine particles at a level of from a few tens to few hundreds Å, respectively, by the analysis (observation by means of a scanning type electron microscope). Namely, such a nature is considered to effectively serve to obtain the sintered product of the desired composition.

EXAMPLES 10 and 11 and COMPARATIVE EXAMPLE 18

So as to bring the composition of the desired superconductor of an oxide system to $YBa_2Cu_3O_7$, methox-

TABLE 10

| Example No. | Method for the preparation of the sample | Onset temp. (K.) | Offset temp. (K.) | Transition temperature range (K.) | Critical current density (A/cm$^2$) |
| --- | --- | --- | --- | --- | --- |
| Example 9 | Process of the present invention | 44.9 | 43.7 | 1.2 | 182.4 |
| Comparative Example 16 | Dry method | 43.4 | 37.2 | 6.2 | 12.8 |
| Comparative Example 17 | Coprecipitation method | 42.4 | 27.2 | 15.2 | 6.8 |

From FIG. 8, it is evident that as compared with the products by the conventional methods, the superconductor of an oxide system prepared by the process of the present invention undergoes a sharp transition to the superconducting state with the resistivity abruptly dropping to 0 when cooled.

From the results in Table 10, it is evident that as compared with the products by the conventional methods, the superconductors of an oxide system prepared by the process of the present invention have practically excellent superconducting characteristics such that not only the temperature at which the resistivity drops completely to 0 is high, but also the range for the transition from the normal conducting state to the superconducting state is narrow, and the critical current density is very high. Whereas, with the products prepared by the conventional methods, particularly by the coprecipitation method, the offset temperature, the transition temperature range and the critical current density are all inadequate for practical application.

With respect to each sintered product samples of Example 9 and Comparative Examples 16 and 17, the structural analysis was conducted by e.g. the X-ray diffraction method, whereby each of the products obtained by the process of the present invention was found to be a sintered product composed of a substantially uniform single phase of a so-called $K_2NiF_4$ type $(La_{0.9}Sr_{0.1})_2CuO_4$. On the other hand, the products by the conventional dry method and the coprecipitation method were found to contain a perovskite structure of $ABO_3$ type (wherein A and B are metal elements) and relatively large proportions of other phases in addition to the $K_2NiF_4$ type phase. Especially the product by the coprecipitation method was found to have the ratio of elements deviated from the desired composition. Thus, the poor characteristics of the superconductors of an ides of Y, Ba and Cu were uniformly mixed in a total amount of 5 g in 100 ml of methanol at 80° C. Then, 10 ml of nitric acid was added thereto to dissolve all the metal methoxides. To this solution, 100 ml of distilled water containing 15 g of NaOH was dropwise added over a period of one hour to conduct the hydrolysis, whereby a gel of the hydrolyzate was obtained.

The gel thus obtained was washed with distilled water until the water used for washing was substantially neutral, and was preliminarily calcined in air at 500° C. for 2 hours. Then, the calcined product was presintered in an oxygen stream at 950° C. for 3 hours to obtain a coarse presintered product. The presintered product was pulverized and then formed into a pelletized sample in the same manner as in Example 9. This pellet was sintered in an oxygen stream at 920° C. for 7 hours in the same manner as in Example 9 to obtain a densely sintered product (Example 10).

A sintered product was obtained in the same manner as in Example 10 except that 10 ml of acetic acid was used instead of 10 ml of nitric acid (Example 11).

For the purpose of comparison, a sample was prepared by using a mixture of $Y_2O_3$, $BaCO_3$ and CuO powders in the same manner as in Example 9 and subjected to the presintering and the sintering in the same manner as above to obtain a sintered product according to the conventional dry method (Comparative Example 8).

With respect to the three types of samples, the temperature dependency of the resistivity and the critical current density were measured in the same manner as in Example 9. The results are shown in FIG. 9 and Table 11.

Figure 9:
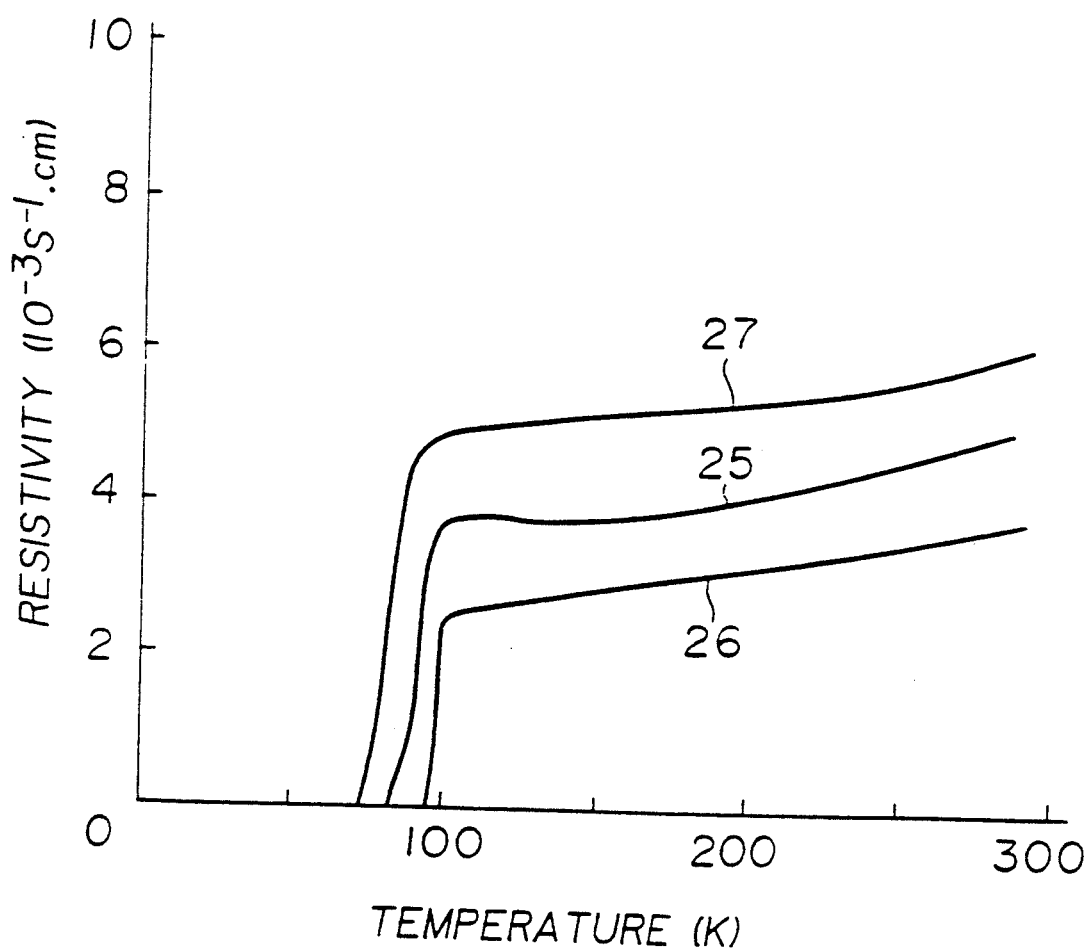
FIG. 9 is a graph showing the relation between the resistivity and the temperature of superconductors of an oxide system obtained in Examples 10 and 11 (curves 25 and 26) and Comparative Example 18 (curve 27).

In FIG. 9, curves 25 and 26 show the characteristics by the process of the present invention (Example 10 and 11, respectively), and curve 27 shows the characteristics by the conventional dry method. The critical current density is the value measured at liquefied nitrogen temperature (77.4 K).

TABLE 11

| Example No. | Method for the preparation of the sample | Onset temp. (K.) | Offset temp. (K.) | Transition temperature range (K.) | Critical current density (A/cm$^2$) |
|---|---|---|---|---|---|
| Example 10 | Process of the present invention | 98.6 | 83.6 | 15.0 | 123.5 |
| Example 11 | Process of the present invention | 98.4 | 96.0 | 2.4 | 198.7 |
| Comparative Example 2 | Dry method | 97.3 | 80.3 | 17.0 | 27.9 |

From the results in FIG. 9 and Table 11, it is evident that as compared with the product by the conventional method, the superconductors of an oxide system prepared by the process of the present invention have practically excellent superconducting characteristics such that the critical temperature is high, the transition temperature range is narrow and the critical current density is high. Whereas, with the product prepared by the conventional dry method, the critical temperature, the transition temperature range and the critical current density are all inadequate for practical application.

The poor characteristics of the superconductor of an oxide system prepared by the conventional dry method have been found to be attributable to the relatively large content of unwanted phases other than the high temperature superconductive phase.

Further, with respect to each of the samples obtained in Examples 9 to 11, the susceptibility was measured, whereby in each case Meissner effects were observed at a temperature of not higher than the temperature at which the resistivity became 0.

EXAMPLES 12 and 13 and COMPARATIVE EXAMPLE 19

So as to bring the composition of the desired superconductor of an oxide system to $(La_{0.88}Sr_{0.12})_2CuO_4$, methoxides of La, Sr and Cu (each having a purity of at least 99.999%) were added in a total amount of 8 g in 200 ml of methyl alcohol and mixed. Then, 5 g of acetic acid was added thereto to completely dissolve all the metal alkoxides. This solution was adjusted to pH 9.0 by an addition of 10 g of ammonia. This solution was adjusted to 80° C. and subjected to hydrolysis by a dropwise addition of a large excess amount of deionized water (100 ml) over a period of one hour at 80° C., whereby gelled brown precipitates were formed. The precipitates were collected by filtration, and washed with deionized water until the water used for the washing was substantially neutral, then dried, and analyzed by an X-ray diffraction apparatus, whereby the precipitates were found to be composed mainly of a mixture of hydroxides of La, Sr and Cu and contain an amorphous substance of the respective oxides.

The dried product of the precipitates were presintered in an oxygen stream at 900° C. for 4 hours to obtain a porous presintered product. The presintered product was pulverized in a mortar and then formed into a pellet having a diameter of 10 mm and a thickness of 1.5 mm by means of a pelletizer. This pellet was again sintered in an oxygen stream at 910° C. for 6 hours to obtain a densely sintered product (Example 12).

Further, a sintered product was prepared in the same manner as in Example 12 except that the washing with deionized water prior to the sintering was omitted (Example 13).

For the purpose of comparison, a mixture of $La_2O_3$, $SrCO_3$ and CuO powders which were all guaranteed reagents, were, respectively, presintered and sintered in the same manner as above to obtain a pellet according to the conventional dry method (Comparative Example 19).

With respect to three types of samples, the temperature dependency of the resistivity was measured by a four terminal method. The results are shown in FIG. 10.

Figure 10:
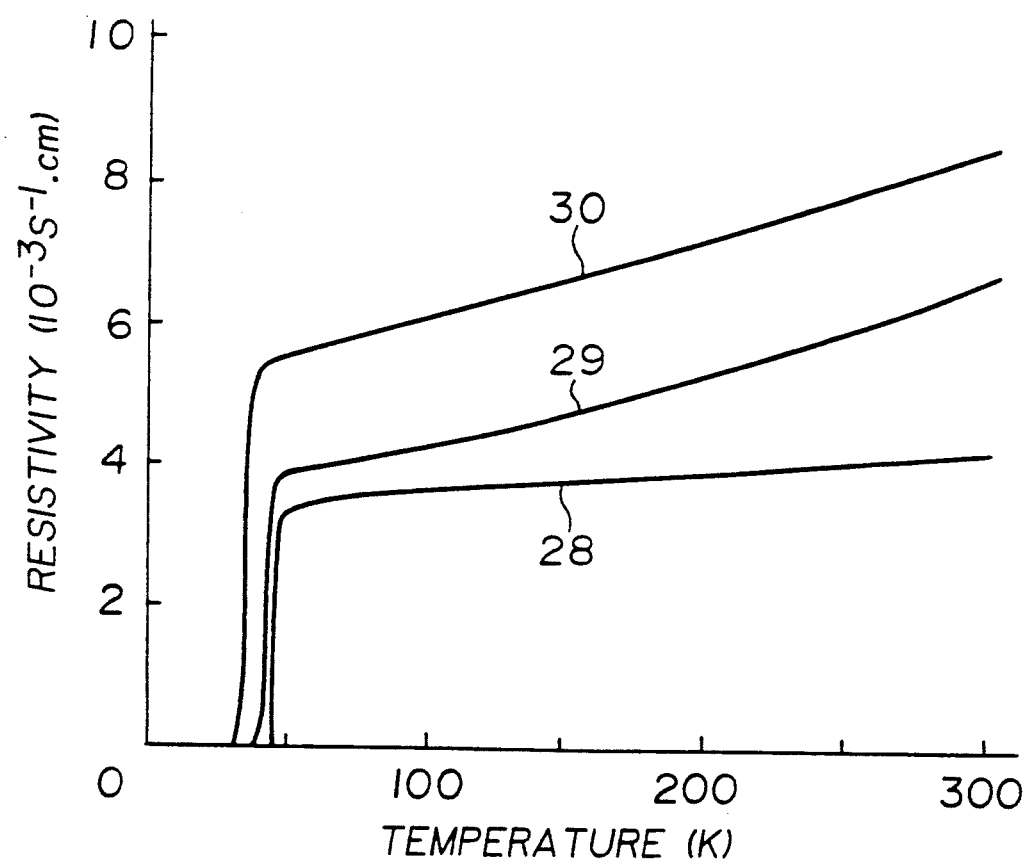
FIG. 10 is a graph showing the relation between the resistivity and the temperature of superconductors of an oxide system obtained in Examples 12 and 13 (curves 28 and 29) and Comparative Example 19 (curve 30).

In FIG. 10, curves 28 and 29 show the characteristics of the samples prepared by the process of the present invention and curve 30 shows the characteristics of the sample by the conventional dry method.

With respect to each sample, the onset temperature, the offset temperature and the transition temperature range are shown in Table 12. Further, the critical current density of each sample in the superconducting state (4.3 K) was obtained and shown in Table 12.

TABLE 12

| Example No. | Method for the preparation of the sample | Onset temp. (K.) | Offset temp. (K.) | Transition temperature range (K.) | Critical current density (A/cm$^2$) |
|---|---|---|---|---|---|
| Example 12 | Process of the present invention | 46.6 | 44.0 | 2.6 | 156.3 |
| Example 13 | Process of the present invention | 46.5 | 38.8 | 7.7 | 112.3 |
| Comparative Example 19 | Dry method | 41.2 | 30.0 | 11.2 | 26.1 |

From FIG. 10, it is evident that as compared with the product by the conventional method, the superconductor of an oxide system prepared by the process of the present invention undergoes a sharp transition to a superconducting state with an abrupt drop of the resistivity to 0 when cooled, as shown by curves 28 and 29.

From the results of Table 12, it is evident that the superconductor of an oxide system prepared by the process of the present invention has practically excellent superconducting characteristics such that as compared with the product having the washing step omitted and the product obtained by the conventional dry method, not only the critical temperature at which the resistivity becomes 0 is high, but also the range for transition from the normal conducting state to the superconducting state is narrow, and the critical current density is high.

With respect to the three types of the sintered samples, the structural analysis was conducted by e.g. the X-ray diffraction, whereby the sample by the process of the present invention was found to be a sintered product comprising a substantially uniform single phase of so-called $K_2NiF_4$ type $(La_{0.88}Sr_{0.12})_2CuO_4$. On the other hand, the sample prepared by the conventional dry method was found to contain a CuO phase, $(La_{0.88}Sr_{0.12})CuO_3$ phase and other phases in addition to the $K_2NiF_4$ type phase. Thus, the poor characteristics of the superconductors of an oxide system according to the conventional methods as shown in FIG. 10 and Table 12, are considered to be attributable to the deviation of the composition and the like.

The gelled hydrolyzate composed mainly of a mixture of hydroxides of La, Sr and Cu formed by the hydrolysis according to the process of the present invention and the sintered product thereof obtained by sintering it at a temperature of from 200° to 500°, were found to be composed of pure and uniform super fine particles at a level of from a few tens to few hundreds Å, respectively, by the analysis (observation by means of a scanning type electron microscope). Namely, such a nature is considered to effectively serve to obtain the sintered product of the desired composition.

EXAMPLES 14 and 15 and COMPARATIVE EXAMPLE 20

So as to bring the composition of the desired superconductor of an oxide system to $Y_{0.3}Ba_{0.6}CuO_3$, yttrium ethoxide, barium methoxide and copper ethoxide (each having a purity of at least 99.999%) were mixed in a total amount of 8 g in 300 ml of ethyl alcohol. Then, 3 ml of nitric acid was added thereto to completely dissolve all the metal alkoxides. This solution was adjusted to 80° C. and subjected to hydrolysis by a dropwise addition of 100 ml of distilled water containing 5 g of diethylamine at 80° C., whereby a gel of a mixture of the hydrolyzates was obtained. The fluid containing the gel was found to be pH 8.8.

The gel was washed with deionized water until the water used for the washing was substantially neutral, preliminary calcined in air at 500° C. for 2 hours, and then presintered in an oxygen atmosphere at 950° C. for 3 hours to obtain a coarse presintered product. The presintered product thus obtained was pulverized and formed into a pelletized sample in the same manner as in Example 12. Then, the pelletized sample was sintered in the same manner as in Example 12 in an oxygen stream at 950° C. for 8 hours to obtain a densely sintered product (Example 14).

Further, a sintered product was prepared in the same manner as in Example 14 except that the washing with deionized water prior to the sintering was omitted (Example 15).

For the purpose of comparison, a sample by the conventional dry method was prepared by using $Y_2O_3$, $BaCO_3$ and CuO powders in the same manner as in Examples 12 and 13 and presintered and sintered in the same manner as above to obtain a sintered product (Comparative Example 20).

With respect to the three types of samples, the temperature dependency of the resistivity and the critical current density were measured in the same manner as in Example 12. The results are shown in FIG. 11 and Table 13.

Figure 11:
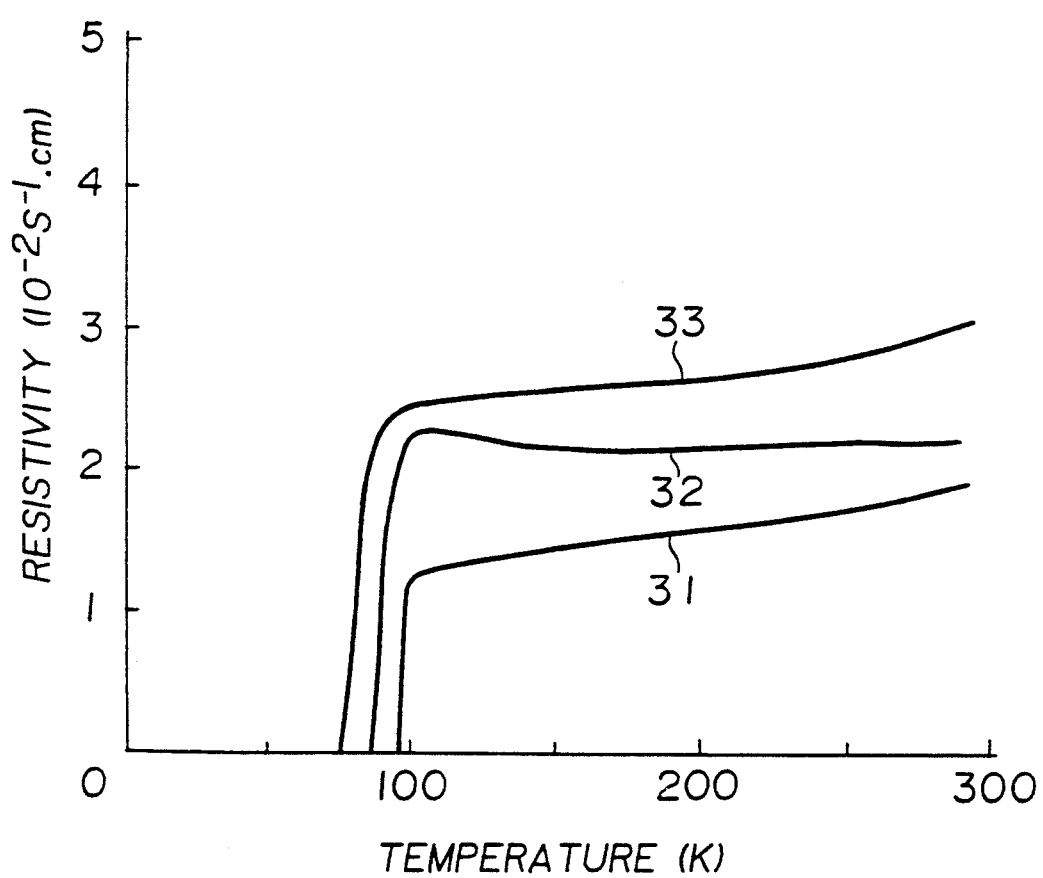
FIG. 11 is a graph showing the relation between the resistivity and the temperature of superconductors of an oxide system obtained in Examples 14 and 15 (curves 31 and 32) and Comparative Example 20 (curve 33).

In FIG. 11, curves 31 and 32 show the characteristics by the process of the present invention and curve 33 shows the characteristics by the conventional dry method. The critical current density is the value measured at the liquefied nitrogen temperature (77.4 K).

TABLE 13

| Example No. | Method for the preparation of the sample | Onset temp. (K.) | Offset temp. (K.) | Transition temperature range (K.) | Critical current density (A/cm$^2$) |
|---|---|---|---|---|---|
| Example 14 | Process of the present invention | 97.6 | 95.0 | 2.6 | 146.9 |
| Example 15 | Process of the present invention | 96.1 | 86.3 | 9.8 | 98.3 |
| Comparative Example 20 | Dry method | 96.1 | 77.5 | 18.6 | 1.3 |

From the results in FIG. 11 and Table 13, it is evident that as compared with the product by the conventional method, the superconductors of an oxide system prepared by the process of the present invention have practically excellent superconducting characteristics such that the critical temperature is high, the transition temperature range is narrow and the critical current density is high. Whereas, with the product prepared by the conventional dry method, the critical temperature, the transition temperature range and the critical current density are all inadequate for practical application.

The poor characteristics of the superconductor of an oxide system prepared by the conventional dry method have been found to be attributable to the relatively large content of unwanted phases other than the high temperature superconductive phase, as a result of the analysis by e.g. the same X-ray diffraction method as used in Example 12.

Further, with respect to each of the samples obtained in Examples 12 to 15, the susceptibility was measured, whereby in each case Meissner effects were observed at a temperature of not higher than the temperature at which the resistivity became 0.

EXAMPLE 16 and COMPARATIVE EXAMPLE 21

To 18 mmol of lanthanum propoxide, 9 ml of a 1N HBr isopropanol solution was added to obtain 100 ml of an isopropanol solution (partly dispersed). Separately, to 2 mmol of strontium ethoxide, 1 ml of a 1N HCl ethanol solution was added to obtain 100 ml of an ethanol solution (partly dispersed). Further, to 10 mmol of copper methoxide, 5 ml of a 1N HI methanol solution was added to obtain 100 ml of a methanol solution (partly dispersed).

So as to bring the composition of the desired superconductor of an oxide system to $(La_{0.9}Sr_{0.1})_2CuO_4$, the three solutions were uniformly mixed. The total amount of the metal alkoxides was 30 mmol, and the total amount of the solvent was 300 ml. This solution (partly dispersed was adjusted to 80° C., and then, the hydrolysis was conducted by dropwise adding deionized water containing 1 g of NaOH in large excess (100 ml) over a period of 1 hour, whereby gelled blackish brown precipitates were formed. Then, acetic acid was added thereto until the solution containing the gelled precipitates became neutral. The precipitates were thoroughly washed with deionized water until the water used for the washing no longer showed a flame reaction of Na, and then dried. The dried product was analyzed by an X-ray diffraction apparatus, whereby the precipitates were found to be composed mainly of a mixture of hydroxides of La, Sr and Cu and contain an amorphous substance of the respective oxides.

The dried product of the precipitates was presintered in oxygen at 910° C. for 2 hours to obtain a porous presintered product. The presintered product was pulverized in a mortar and formed into a pellet having a diameter of 10 mm and a thickness of 1.5 mm by means of a pelletizer. This pellet was again sintered in an oxygen stream at 920° C. for 7 hours to obtain a densely sintered product.

For the purpose of comparison, a mixture of $La_2O_3$, $SrCO_3$ and CuO powders which were all guaranteed reagents, was presintered and sintered in the same manner as above to obtain a sintered product by the conventional dry method (Comparative Example 21).

With respect to each of the two types of samples thus obtained, the temperature dependency of the resistivity was measured by a four terminal method. The results are shown in FIG. 12.

Figure 12:
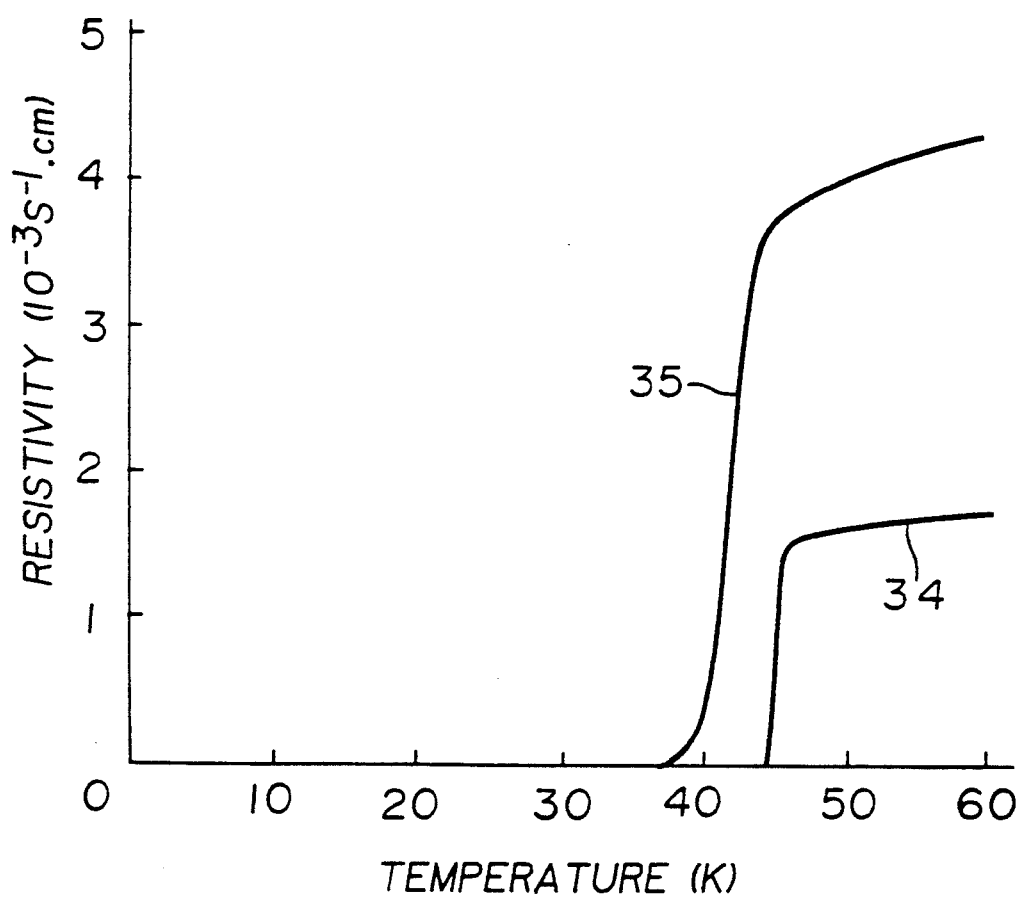
FIG. 12 is a graph showing the relation between the resistivity and the temperature of superconductors of an oxide system obtained in Example 16 (curve 34) and Comparative Example 21 (curve 35).

In FIG. 12, curve 34 shows the characteristics of the sample prepared by the process of the present invention and curve 35 shows the characteristics of the sample prepared by the conventional dry method.

With respect to each sample, the onset temperature, the offset temperature and the transition temperature range were measured and shown in Table 14. Further, the critical current density of each sample at the superconducting state (4.3 K) was obtained and shown in Table 14.

From FIG. 12, it is evident that as compared with the products by the conventional methods, the superconductor of an oxide system prepared by the process of the present invention undergoes a sharp transition to a superconducting state with the resistivity abruptly dropping to 0 when cooled.

From the results of Table 14, it is evident that the superconductor of an oxide system prepared by the process of the present invention has practically excellent superconducting characteristics such that as compared with the product having the washing step omitted and the product obtained by the conventional dry method, not only the critical temperature at which the resistivity becomes 0 is high, but also the range for transition from the normal conducting state to the superconducting state is narrow, and the critical current density is high. Whereas, with the product prepared by the conventional dry method, the critical temperature, the transition temperature range and the critical current density are all inadequate for practical application.

With respect to the sintered samples of Example 16 and Comparative Example 21, the structural analysis was conducted by e.g. the X-ray diffraction, whereby the sample by the process of the present invention was found to be a sintered product comprising a substantially uniform single phase of so-called $K_2NiF_4$ type $(La_{0.9}Sr_{0.1})_2CuO_4$. On the other hand, the sample prepared by the conventional dry method was found to contain a perovskite structure of $ABO_3$ type (wherein A and B are metal elements) and relatively many other phases in addition to the $K_2NiF_4$ type phase. Thus, the poor characteristics of the superconductor of an oxide system according to the conventional dry method as shown in FIG. 12 and Table 14, are considered to be attributable to the deviation of the composition and the like.

The gelled hydrolyzate composed mainly of a mixture of hydroxides of La, Sr and Cu formed by the hydrolysis according to the process of the present invention and the sintered product thereof obtained by sintering it at a temperature of from 200° to 500°, were found to be composed of pure and uniform super fine particles at a level of from a few tens to few hundreds Å, respectively, by the analysis (observation by means of a scanning type electron microscope). Namely, such a nature is considered to effectively serve to obtain the sintered product of the desired composition.

EXAMPLE 17 and COMPARATIVE EXAMPLE 22

To 10 mmol of yttrium methoxide, 3 ml of a 1N HCl methanol solution was added to obtain 100 ml of a methanol solution (partly dispersed). Separately, to 20 mmol of barium ethoxide, 10 ml of a 1N HBr ethanol solution was added to obtain 100 ml of an ethanol solution (partly dispersed). Further, to 30 mmol of copper methoxide, 15 ml of a 1N HCl methanol solution was added to obtain 200 ml of a methanol solution (partly dispersed).

So as to bring the composition of the desired superconductor of an oxide system to $YBa_2Cu_3O_7$, the three solutions were uniformly mixed. The total amount of

TABLE 14

| Example No. | Method for the preparation of the sample | Onset temp. (K.) | Offset temp. (K.) | Transition temperature range (K.) | Critical current density (A/cm$^2$) |
|---|---|---|---|---|---|
| Example 16 | Process of the present invention | 45.8 | 44.3 | 1.5 | 127.4 |
| Comparative Example 21 | Dry method | 43.6 | 37.3 | 6.3 | 27.4 | the metal alkoxides was 60 mmol, and the total amount of the solvent was 400 ml. This solution (partly dispersed) was adjusted to 80° C. and hydrolyzed by a dropwise addition of 200 ml of a large excess of distilled water containing 1 g of KOH over a period of 1 hour, whereby a gel of a hydrolyzate mixture was obtained. Then, nitric acid was added until the solution containing this gel became neutral, and then the gel was thoroughly washed with distilled water (i.e the gel collected by filtration was repeatedly washed with 3 liters of water).

The gel thus washed with water was preliminarily calcined in air at 500° C. for 2 hours. Then, the calcined product was presintered in an oxygen stream at 950° C. for 3 hours to obtain a coarse presintered product. The presintered product was pulverized and then formed into a pelletized sample in the same manner as in Example 16. This pellet was sintered in an oxygen stream at 950° C. for 7 hours to obtain a densely sintered product.

For the purpose of comparison, a sample was prepared by using $Y_2O_3$, $BaCO_3$ and CuO in the same manner as in Example 16 and subjected to the presintering and the sintering in the same manner as above to obtain a sintered product according to the conventional dry method (Comparative Example 22).

With respect to the two types of samples, the temperature dependency of the resistivity and the critical current density were measured in the same manner as in Example 16. The results are shown in FIG. 13 and Table 15.

Figure 13:
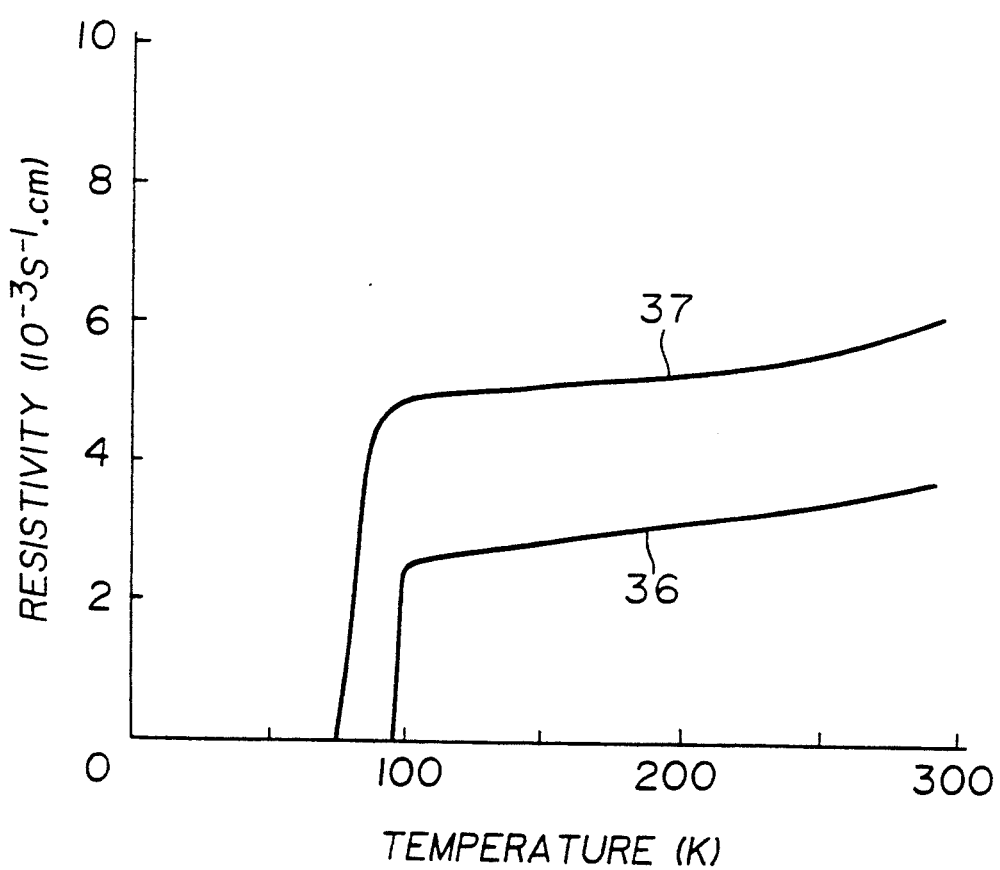
FIG. 13 is a graph showing the relation between the resistivity and the temperature of superconductors of an oxide system obtained in Example 17 (curve 36) and Comparative Example 22 (curve 37).

In FIG. 13, curve 36 shows the characteristics by the process of the present invention and curve 37 shows the characteristics by the conventional dry method. The critical current density is the value measured at liquefied nitrogen temperature (77.4 K).

Further, with respect to each of the samples used in Examples 16 and 17, the susceptibility was measured, whereby in each case, Meissner effects were observed at a temperature of not higher than the temperature at which the resistivity became 0.

EXAMPLE 18 and COMPARATIVE EXAMPLE 23

A superconductor was prepared in the following manner by using $La(n-OC_4H_9)_3$, $Ba(OC_2H_5)_2$ and $Cu(OC_2H_5)_2$ (each having a purity of at least 99.999%) to bring the composition of the desired superconductor of an oxide system to $(La_{0.9}Ba0.1)_2CuO_4$.

18 mmol of $La(n-OC_4H_9)_3$ was added to 200 ml of butanol and uniformly dispersed (partly dissolved). This dispersion was adjusted to 80° C. and hydrolyzed by a dropwise addition of 100 ml of deionized water containing 0.1 g of $HNO_3$ over a period of 1 hour, whereby a slightly white gel was formed. The gel was separated by filtration. Two mmol of $Ba(OC_2H_5)_2$ and 10 mmol of $Cu(OC_2H_5)_2$ in powder form were directly added to the above gel and uniformly mixed.

The mixture thereby obtained was dried, and then, presintered in an oxygen stream at 900° C. for 4 hours to obtain a porous presintered product. The presintered product was pulverized in a mortar and formed into a pellet having a diameter of 10 mm and a thickness of 1.5 mm by means of a pelletizer. This pellet was sintered again in an oxygen stream at 900° C. for 8 hours to obtain a densely sintered product (Example 18).

For the purpose of comparison, a mixture of $La_2O_3$, $BaCO_3$ and CuO powders which were all guaranteed reagents, was presintered and sintered in the same manner as above, to obtain sintered products by the conventional dry method (Comparative Example 23).

With respect to each of the two types of samples, the

TABLE 15

| Example No. | Method for the preparation of the sample | Onset temp. (K.) | Offset temp. (K.) | Transition temperature range (K.) | Critical current density (A/cm$^2$) |
| --- | --- | --- | --- | --- | --- |
| Example 17 | Process of the present invention | 100.1 | 96.0 | 4.1 | 168.3 |
| Comparative Example 22 | Dry method | 98.1 | 78.9 | 19.2 | 18.9 |

From the results in FIG. 13 and Table 15, it is evident that as compared with the products by the conventional dry method, the superconductor of an oxide system prepared by the process of the present invention have practically excellent superconducting characteristics such that the critical temperature for the transition to the superconducting state is high, the transition temperature range is narrow and the critical current density is high. Whereas, with the product prepared by the conventional dry method, the critical temperature, the transition temperature range and the critical current density are all inadequate for practical application.

The poor characteristics of the superconductors of an oxide type by the conventional methods were found to be attributable to the relatively large content of unwanted phases other than the high temperature superconductive phase, as a result of the analysis by e.g. the X-ray diffraction method as in Example 16.

temperature dependency of the resistivity was measured by a four terminal method. The results are shown in FIG. 14.

Figure 14:
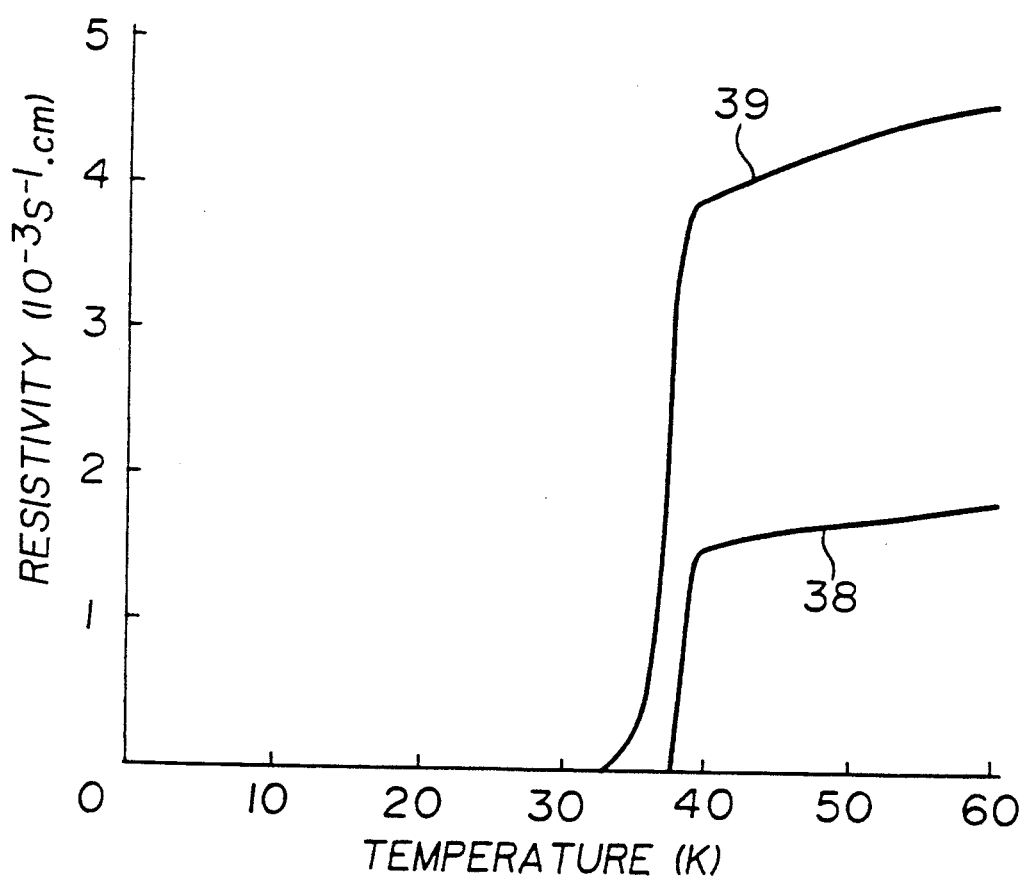
FIG. 14 is a graph showing the relation between the resistivity and the temperature of superconductors of an oxide system obtained in Example 18 (curve 38) and Comparative Example 23 (curve 39).

In FIG. 14, curve 38 shows the characteristics of the sample prepared by the process of the present invention and curve 39 shows the characteristics of the sample by the conventional dry method.

From FIG. 14, it is evident that as compared with the products by the conventional methods, the superconductor of an oxide system prepared by the process of the present invention undergoes a sharp transition to a superconducting state with the resistivity abruptly dropping to 0 when cooled. With respect to each sample, the onset temperature, the offset temperature and the transition temperature range are shown in Table 16. Further, the critical current density of each sample in the superconducting state (4.3 K) was obtained and shown in Table 16.

TABLE 16

| Example No. | Method for the preparation of the sample | Onset temp. (K.) | Offset temp. (K.) | Transition temperature range (K.) | Critical current density (A/cm$^2$) |
|---|---|---|---|---|---|
| Example 18 | Process of the present invention | 39.0 | 37.9 | 1.1 | 119.3 |
| Comparative Example 23 | Dry method | 38.4 | 32.5 | 5.9 | 17.9 |

From the results of Table 16, it is evident that the superconductor of an oxide system prepared by the process of the present invention has practically excellent superconducting characteristics such that as compared with the product obtained by the conventional dry method, not only the critical temperature at which the resistivity becomes 0 is high, but also the range for transition from the normal conducting state to the superconducting state is narrow, and the critical current density is high.

With respect to the two types of the sintered samples, the structural analysis was conducted by e.g. the X-ray diffraction, whereby the sample by the process of the present invention was found to be a sintered product comprising a substantially uniform single phase of so-called $K_2NiF_4$ type ($La_{0.9}Sr_{0.1})_2CuO_4$. On the other hand, the sample prepared by the conventional dry method was found to contain a perovskite structure of $ABO_3$ type (wherein A and B are metal elements) and relatively many other phases in addition to the $K_2NiF_4$ type phase. Thus, the poor characteristics of the superconductor of an oxide system according to the conventional dry method as shown in FIG. 14 and Table 16, are considered to be attributable to the deviation of the composition and the presence of other phases than the high temperature superconductive phase.

EXAMPLES 19 and 20 and COMPARATIVE EXAMPLE 24

A superconductor was prepared in the following manner by using $Yb(n-OC_4H_9)_3$, $Ba(OCH_3)_2$ and $Cu(OCH_3)_2$ (each having a purity of at least 99.999%), to bring the composition of the desired superconductor of an oxide system to $YbBa_2Cu_3O_7$.

Ten mmol of $Yb(n-OC_4H_9)_3$ and 20 mmol of $Ba(OCH_3)_2$ were added to 200 ml of butanol and uniformly dispersed (partly dissolved). This dispersion was adjusted to 80° C. and then hydrolyzed by a dropwise addition of 50 ml of distilled water containing 0.5 g of ammonia over a period of 20 minutes, whereby a white gel was formed. The gel was separated by filtration. Then, 30 mmol of $Cu(OCH_3)_2$ in powder form was directly added to the gel and uniformly mixed.

The mixture thus obtained was dried and then, preliminarily calcined in air at 500° C. for 2 hours. Then, the calcined product was presintered in an oxygen stream at 950° C. for 5 hours to obtain a coarse presintered product. The presintered product was pulverized and then formed into a pelletized sample in the same manner as in Example 18. This pellet was sintered in an oxygen stream at 950° C. for 10 hours to obtain a densely sintered product (Example 19).

Further, as Example 20, a superconductor was prepared in the following manner, by using $Y(n-OC_4H_9)_3$, $Cu(i-OC_3H_7)_2$, $Sr(OC_2H_5)_2$ and $Ca(OC_2H_5)_2$ (each having a purity of at least 99.999%) to bring the composition of the desired superconductor of an oxide system to $Y(Sr_{0.5}Ca_{0.5})_2Cu_3O_7$.

Ten mmol of $Y(n-OC_4H_9)_3$ and 30 mmol of $Cu(i-OC_3H_7)_2$ were added to 200 ml of isopropanol and uniformly dispersed (partly dissolved). This dispersion was adjusted to 80° C. and then hydrolyzed by a dropwise addition of 50 ml of distilled water containing 0.5 g of acetic acid over a period of 30 minutes, whereby a brown gel was formed. Then, the gel was separated by filtration. A dispersion of 10 mmol of $Sr(OC_2H_5)_2$ and 10 mmol of $Ca(OC_2H_5)_2$ in 100 ml of ethanol and the above gel were uniformly mixed.

The mixture thus obtained was dried and then, preliminarily calcined in air at 500° C. for 2 hours. Then, the calcined product was presintered in an oxygen stream at 950° C. for 5 hours to obtain a coarse presintered product. The presintered product was pulverized and then formed into a pelletized sample in the same manner as in Example 18. This pellet was sintered in an oxygen stream at 950° C. for 10 hours to obtain a densely sintered product (Example 20).

For the purpose of comparison, a sample by the conventional dry method was prepared by using a mixture of $Yb_2O_3$, $BaCO_3$ and CuO powders in the same manner as in Example 18 and presintered and sintered in the same manner as above to obtain a sintered product according to the conventional dry method (Comparative Example 24).

Figure 15:
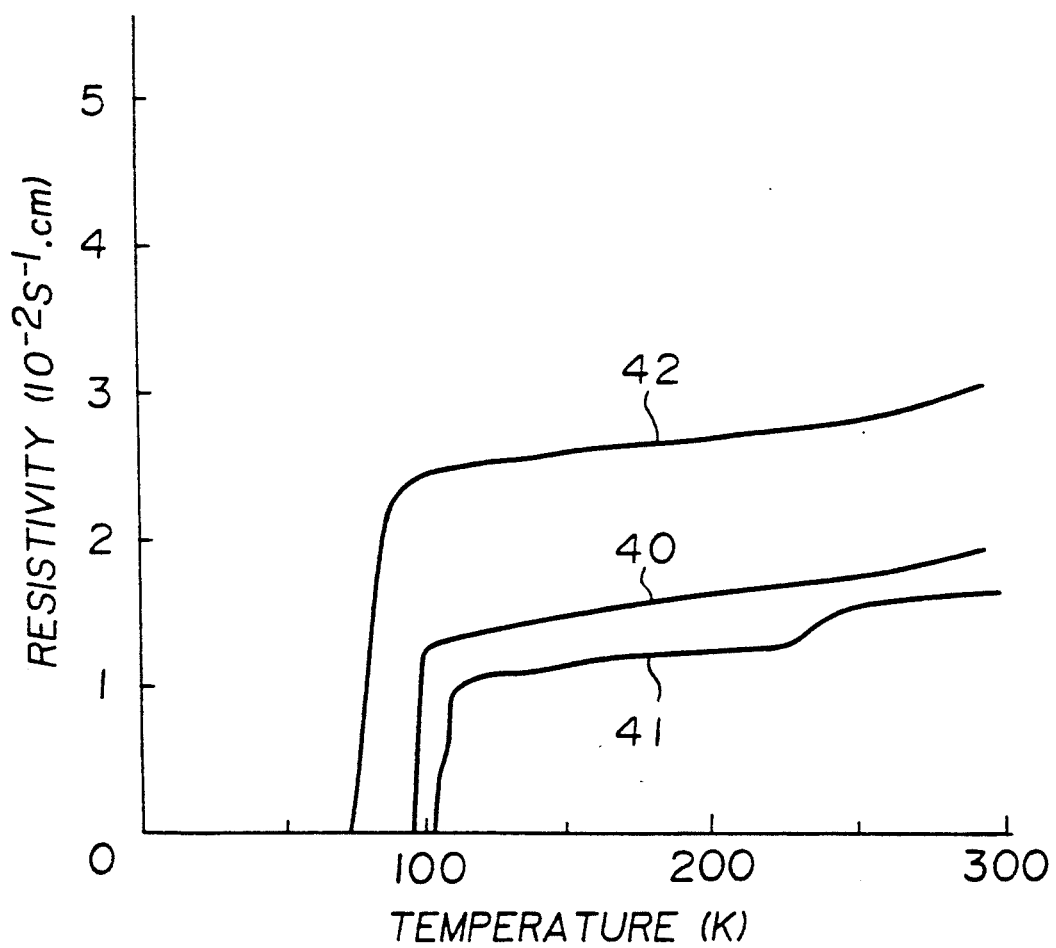
FIG. 15 is a graph showing the relation between the resistivity and the temperature of superconductors of an oxide system obtained in Examples 19 and 20 (curves 40 and 41) and Comparative Example 24 (curve 42).

With respect to the three types of samples, the temperature dependency of the resistivity and the critical current density were measured in the same manner as in Example 18. The results are shown in FIG. 15 and Table 17. In FIG. 15, curves 40 and 41 show the characteristics by the process of the present invention and curve 42 shows the characteristics by the conventional dry method. Further, the critical current density is the value as measured at the liquefied nitrogen temperature (77.4 K).

TABLE 17

| Example No. | Method for the preparation of the sample | Onset temp. (K.) | Offset temp. (K.) | Transition temperature range (K.) | Critical current density (A/cm$^2$) |
|---|---|---|---|---|---|
| Example 19 | Process of the present invention | 99.8 | 95.0 | 4.8 | 173.8 |
| Example 20 | Process of the present invention | 109.0 | 102.8 | 6.2 | 204.3 |

TABLE 17-continued

| Example No. | Method for the preparation of the sample | Onset temp. (K.) | Offset temp. (K.) | Transition temperature range (K.) | Critical current density (A/cm$^2$) |
|---|---|---|---|---|---|
| Comparative Example 24 | Dry method | 97.3 | 79.0 | 18.3 | 11.9 |

From the results in FIG. 15 and Table 17, it is evident that as compared with the product by the conventional dry method, the superconductors of an oxide system prepared by the process of the present invention have practically excellent superconducting characteristics such that the critical temperature is high, the transition temperature range is narrow and the critical current density is high. Whereas, with the product prepared by the conventional dry method, the critical temperature, the transition temperature range and the critical current density are all inadequate for practical application.

The poor characteristics of the superconductor of an oxide system prepared by the conventional dry method have been found to be attributable to the relatively large content of unwanted phases other than the high temperature superconductive phase.

Further, with respect to each of the samples obtained in Examples 18 to 20, the susceptibility was measured, whereby in each case Meissner effects were observed at a temperature of not higher than the temperature at which the resistivity became 0.

EXAMPLE 21 and COMPARATIVE EXAMPLE 25

A superconductor was prepared in the following manner by using La(n-OC$_4$H$_9$)$_3$, Ba(n-OC$_4$H$_9$)$_2$, europium acetylacetonate and copper acetylacetonate (each having a purity of at least 99.999%), to bring the composition of the desired superconductor of an oxide system to (La$_{0.85}$Eu$_{0.05}$Ba$_{0.1}$)$_2$CuO.

17 mmol of La(n-OC$_4$H$_9$)$_3$ and 2 mmol of Ba(n-OC$_4$H$_9$)$_2$ were added to 200 ml of butanol and uniformly dispersed (partly dissolved). This dispersion was adjusted to 80° C., and then hydrolyzed by a dropwise addition of 20 ml of deionized water containing 1 ml of 0.1N HCl over a period of 1 hour, whereby a blackish brown gel was formed. Separately, 1 mmol of europium acetylacetonate and 10 mmol of copper acetylacetonate were added to 200 ml of butanol and uniformly dispersed (partly dissolved). This dispersion was adjusted to 80° C., and then hydrolyzed by a dropwise addition of a large excess amount of deionized water (20 ml) containing 1 ml of 0.1 N NaOH over a period of time, whereby a blackish brown gel was formed. The fluids containing the respective hydrolyzates thus obtained were uniformly mixed, and then, butanol and water were distilled off by heating at from 100° to 170° C. under stirring to obtain a mixture. The mixture thereby obtained was thoroughly washed with about 50 ml of distilled water and dried. The dried products was presintered in an oxygen stream at 900° C. for 4 hours to obtain a porous presintered product. The presintered product was pulverized in a mortar and formed into a pellet having a diameter of 10 mm and a thickness of 1.5 mm by means of a pelletizer. This pellet was sintered again in an oxygen stream at 900° C. for 8 hours to obtain a densely sintered product (Example 21).

For the purpose of comparison, a mixture of La$_2$O$_3$, BaCO$_3$, Eu$_2$O$_3$ and CuO powders which were all guaranteed reagents, was presintered and sintered in the same manner as above, to obtain a sintered product by the conventional dry method.

With respect to each of the two types of samples, the temperature dependency of the resistivity was measured by a four terminal method. The results are shown in FIG. 16.

Figure 16:
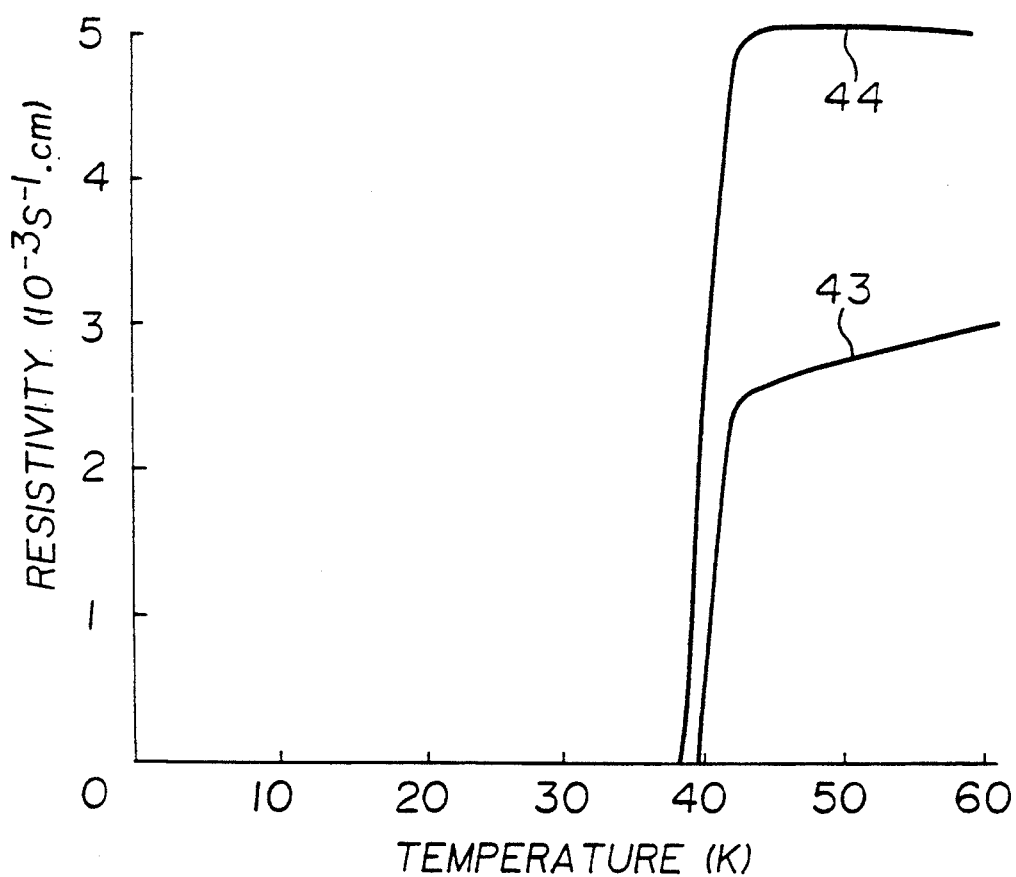
FIG. 16 is a graph showing the relation between the resistivity and the temperature of superconductors of an oxide system obtained in Example 21 (curve 43) and Comparative Example 25 (curve 44).

In FIG. 16, curve 43 shows the characteristics of the sample prepared by the process of the present invention and curve 44 shows the characteristics of the sample by the conventional dry method.

From FIG. 16, it is evident that as compared with the product by the conventional dry method, the superconductor of an oxide system prepared by the process of the present invention undergoes a sharp transition to a superconducting state with the resistivity abruptly dropping to 0 when cooled. With respect to each sample, the onset temperature, the offset temperature and the transition temperature range are shown in Table 18. Further, the critical current density of each sample in the superconducting state (4.3 K) was obtained and shown in Table 18.

TABLE 18

| Example No. | Method for the preparation of the sample | Onset temp. (K.) | Offset temp. (K.) | Transition temperature range (K.) | Critical current density (A/cm$^2$) |
|---|---|---|---|---|---|
| Example 21 | Process of the present invention | 42.1 | 39.9 | 2.2 | 60 |
| Comparative Example 25 | Dry method | 41.5 | 38.5 | 3.0 | 20.1 |

From the results of Table 18, it is evident that the superconductor of an oxide system prepared by the process of the present invention has practically excellent superconducting characteristics such that as compared with the product obtained by the conventional dry method, not only the critical temperature at which the resistivity becomes 0 is high, but also the range for transition from the normal conducting state to the superconducting state is narrow, and the critical current density is high.

With respect to the two types of the sintered samples, the structural analysis was conducted by e.g. the X-ray diffraction, whereby the sample by the process of the present invention was found to be a sintered product comprising a substantially uniform single phase of so-called K$_2$NiF$_4$ type (La$_{0.9}$Sr$_{0.1}$)$_2$CuO$_4$. On the other hand, the sample prepared by the conventional dry method was found to contain relatively many other phases in addition to the $K_2NiF_4$ type phase. The poor characteristics of the superconductor of an oxide system according to the conventional dry method were found to be attributable to relatively many other phases present in addition to the high temperature superconductive phase, as shown in FIG. 16 and Table 18.

The hydrolyzate composed mainly of a mixture of hydroxides of the respective metal elements formed by the hydrolysis of the metal alkoxides according to the process of the present invention, the mixture containing the hydrolyzate formed by the hydrolysis of the metal acetylacetates and the sintered product thereof obtained by sintering the mixture at a temperature of from 200° to 500° C., were found to be composed of pure and uniform super fine particles at a level of from a few tens to few hundreds Å, respectively, by the analysis (observation by means of a scanning type electron microscope). Namely, such a nature is considered to effectively serve to obtain the sintered product of the desired composition.

EXAMPLES 22 and 23 and COMPARATIVE EXAMPLE 26

A superconductor was prepared in the following manner by using yttrium acetylacetonate, barium acetylacetonate and $Cu(OCH_3)_2$ (each having a purity of at least 99.999%) to bring the composition of the desired superconductor of an oxide system to $YBa_2Cu_3O_7$.

Ten mmol of yttrium acetylacetonate and 20 mmol of barium acetylacetonate were added to 200 ml of methanol and uniformly dispersed (partly dissolved). This dispersion was adjusted to 80° C. and then hydrolyzed by a dropwise addition of a large excess amount of deionized water (50 ml) containing 1 ml of 0.1N NaOH over a period of one hour, whereby a blackish gel was formed. Separately, 30 mmol of $Cu(OCH_3)_2$ was added to 100 ml of methanol and uniformly dispersed (partly dissolved). This dispersion was adjusted to 80° C. and then hydrolyzed by a dropwise addition of a large excess amount of deionized water (50 ml) containing 1 ml of 0.1N HCl over a period of one hour, whereby a blackish brown gel was formed. The fluids containing the respective hydrolyzates thus obtained were uniformly mixed. .Then, methanol and water were distilled off by heating at about 100° C. under stirring to obtain a mixture. The mixture thereby obtained was thoroughly washed with about 30 ml of distilled water and dried. The dried product was preliminarily calcined in air at 500° C. for 2 hours. Then, the calcined product was presintered in an oxygen stream at 950° C. for 3 hours to obtain a coarse presintered product. The presintered product was pulverized and formed into a pellet in the same manner as in Example 21. This pellet was sintered in an oxygen stream at 950° C. for 8 hours to obtain a densely sintered product (Example 22).

Further, as Example 23, a superconductor was prepared in the following manner by using $Y(n-OC_4H_9)_3$, $Ba(n-OC_4H_9)$ and copper acetylacetonate (each having a purity of at least 99.999%) to bring the composition of the desired superconductor of an oxide system to $YBa_2Cu_3O_7$.

Ten mmol of $Y(n-OC_4H_9)_3$ and 20 mmol of $Ba(n-OC_4H_9)_2$ were added to 200 ml of butanol and uniformly dispersed (partly dissolved). The dispersion was adjusted to 80° C. and then hydrolyzed by a dropwise addition of a large excess amount of deionized water (50 ml) containing 1 ml of 0.1N HCl over a period of one hour, whereby a blackish brown gel was formed. Separately, copper acetylacetonate was added to 100 ml of butanol and uniformly dispersed (partly dissolved). This dispersion was adjusted to 80° C. and then hydrolyzed by a dropwise addition of a large excess amount of deionized water (50 ml) containing 1 ml of 0.1N KOH over a period of one hour, wherein a blackish brown gel was formed.

These fluids containing respective hydrolyzates thus obtained were uniformly mixed, and then, butanol and water were distilled off under heating at from 100° to 170° C. under stirring to obtain a mixture.

The mixture thereby obtained was thoroughly washed with about 30 ml of deionized water and dried. The dried product was preliminarily calcined in air at 500° C. for 2 hours. Then, the calcined product was presintered in an oxygen stream at 950° C. for 3 hours to obtain a coarse presintered product. The presintered product thus obtained was pulverized and formed into a pellet in the same manner as in Example 21. This pellet was sintered in an oxygen stream at 950° C. for 8 hours to obtain a densely sintered product (Example 23).

For the purpose of comparison, a sample was prepared by using $Y_2O_3$, $BaCO_3$ and $CuO$ powders in the same manner as in Example 21 and subjected to the presintering and the sintering in the same manner as above to obtain a sintered product according to the conventional dry method (Comparative Example 26).

With respect to the three types of samples, the temperature dependency of the resistivity and the critical current density were measured in the same manner as in Example 21. The results are shown in FIGS. 17 and 18 and Table 19.

Figure 17:
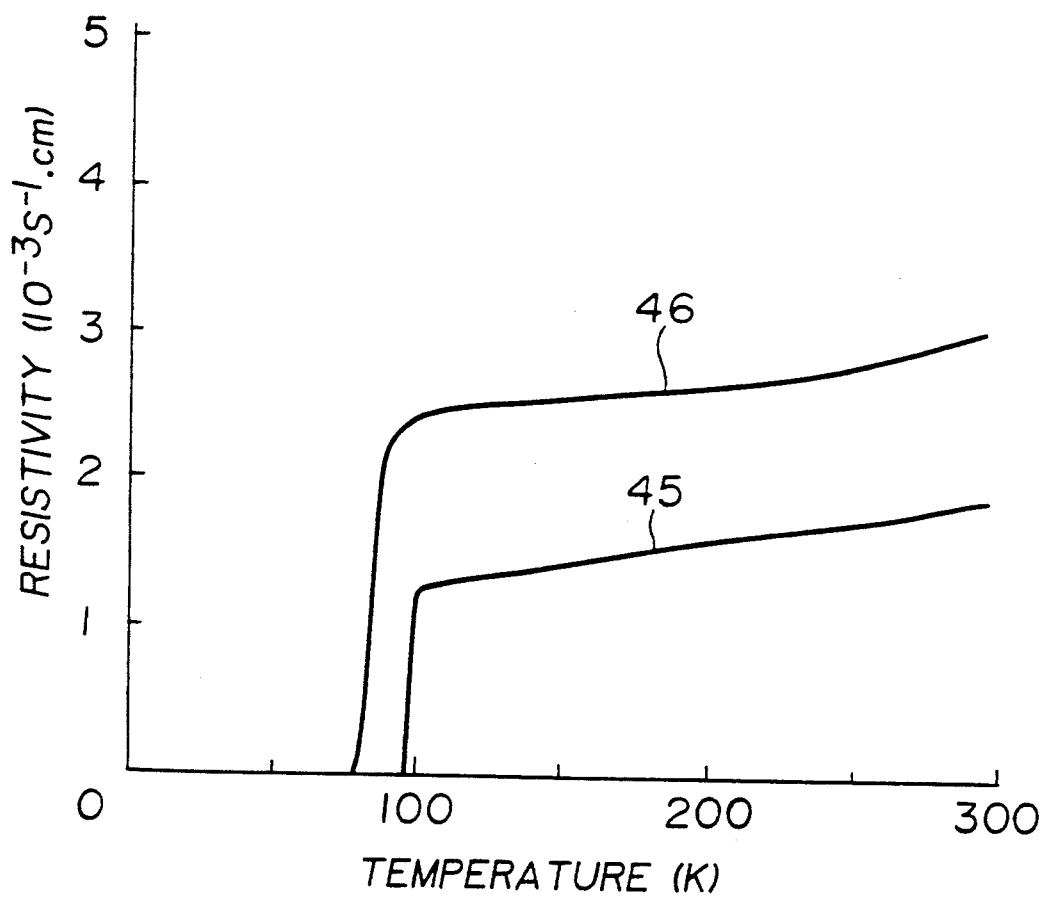
FIG. 17 is a graph showing the relation between the resistivity and the temperature of superconductors of an oxide system obtained in Examples 22 and 23 (curves 45 and 46).
Figure 18:
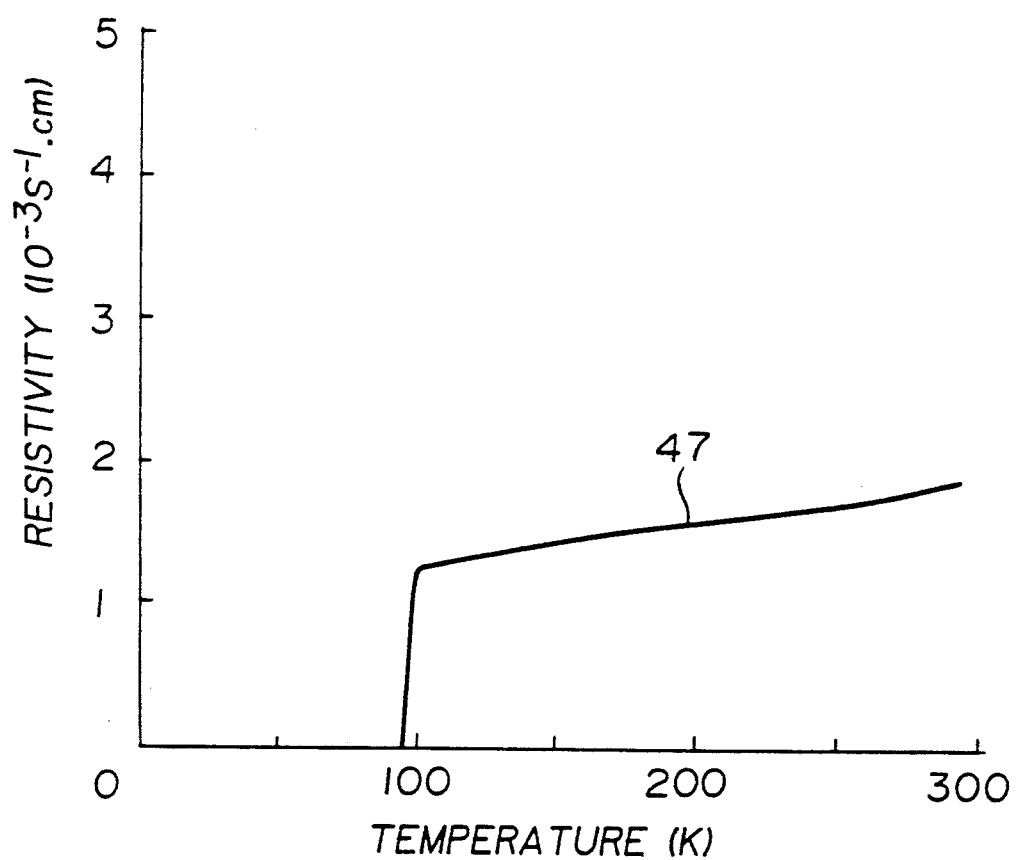
FIG. 18 is a graph showing the relation between the resistivity and the temperature of superconductors of an oxide system obtained in Comparative Example 26 (curve 47).

In FIGS. 17 and 18, curves 45 and 47 show the characteristics by the process of the present invention and curve 46 shows the characteristics by the conventional dry method. The critical current density is the value measured at liquefied nitrogen temperature (77.4 K).

TABLE 19

| Example No. | Method for the preparation of the sample | Onset temp. (K.) | Offset temp. (K.) | Transition temperature range (K.) | Critical current density (A/cm$^2$) |
| --- | --- | --- | --- | --- | --- |
| Example 22 | Process of the present invention | 98.6 | 97.5 | 1.1 | 80.2 |
| Example 23 | Process of the present invention | 98.4 | 96.9 | 1.5 | 77.6 |
| Comparative Example 26 | Dry method | 91.6 | 84.8 | 6.8 | 20.9 | sintered product was pulverized and formed into a pellet in the same manner as in Example 21. This pellet was From the results in FIGS. 17 and 18 and Table 19, it is evident that as compared with the product by the conventional dry method, the superconductors of an oxide system prepared by the process of the present invention have practically excellent superconducting characteristics such that the critical temperature is high, the transition temperature range is narrow and the critical current density is high. Whereas, with the product prepared by the conventional dry method, the critical temperature, the transition temperature range and the critical current density are all inadequate for practical application.

The poor characteristics of the superconductor of an oxide system prepared by the conventional dry method have been found to be attributable to the relatively large content of unwanted phases other than the high temperature superconductive phase, as a result of the analysis by e.g. the same X-ray diffraction method as used in Example 21.

Further, with respect to each of the samples obtained in Examples 21 to 23, the susceptibility was measured, whereby in each case Meissner effects were observed at a temperature of not higher than the temperature at which the resistivity became 0.

EXAMPLE 24 and COMPARATIVE EXAMPLES 27 and 28

So as to bring the composition of the desired (superconductor of an oxide system to $YBa_2Cu_3O_{7-x}$, copper ethoxide, barium acetate and yttrium butanoate were added in a predetermined ratio in the total amount of 30 g to 1 liter of ethanol and uniformly dissolved (partly dispersed). To this solution, 200 ml of distilled water was added, and the mixture was heated at 80° C. for 1 hour to hydrolyze the copper ethoxide, whereby a gelled mixture was obtained.

The gelled mixture was presintered in air at 900° C. for hours to obtain a porous presintered product. The presintered product was pulverized in a mortar and formed into a pellet having a diameter of 10 mm and a thickness of 2.0 mm by means of a pelletizer. This pellet was sintered in an oxygen stream at 950° C. for 6 hours to obtain a densely sintered product.

For the purpose of comparison, a mixture of $Y_2O_3$, $BaCO_3$ and $CuO$ powders and a precipitate formed by adding small amounts of ammonia and oxalic acid to an aqueous solution of nitrates of Y, Ba and Cu, each prepared by using guaranteed reagents, were, respectively, presintered and sintered in the same manner as above, to obtain sintered products by the conventional dry method and the coprecipitation method. With respect to each of the three types of samples, the temperature dependency of the resistivity was measured by a four terminal method. The results are shown in FIG. 19.

Figure 19:
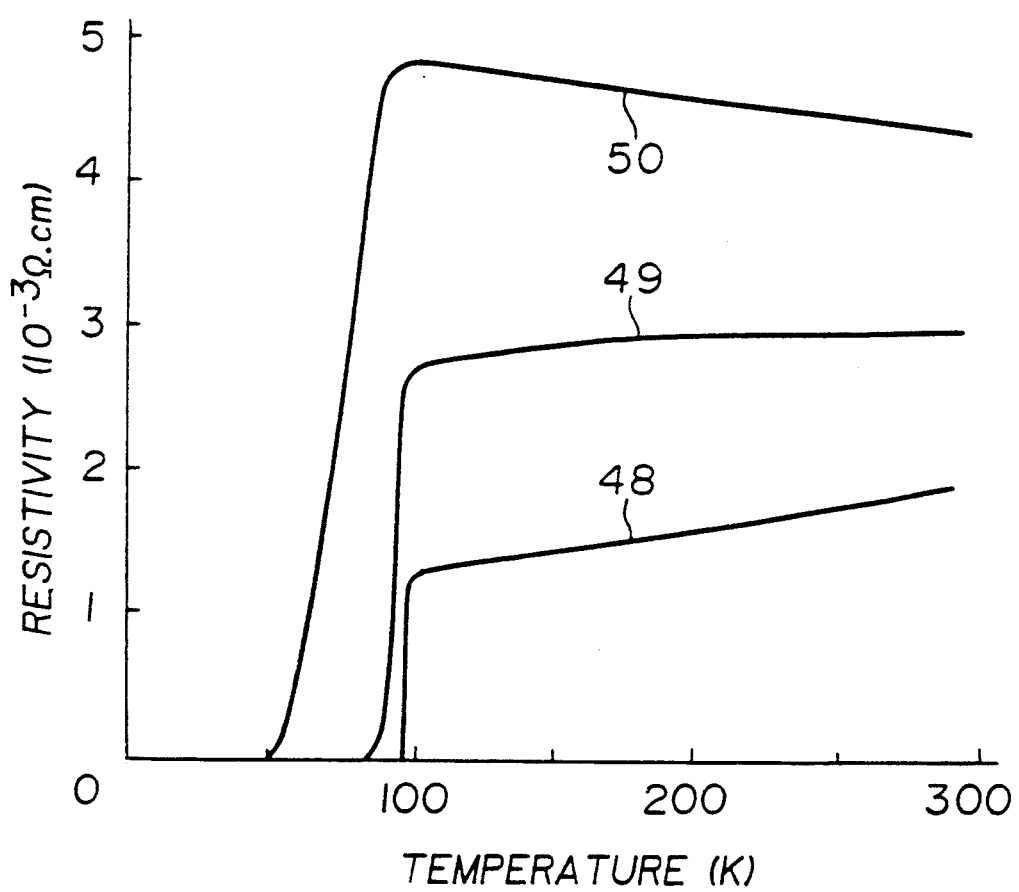
FIG. 19 is a graph showing the relation between the resistivity and the temperature of superconductors of an oxide system obtained in Example 24 (curve 48) and Comparative Examples 27 and 28 (curves 49 and 50).

In FIG. 19, curve 48 shows the characteristics of the sample prepared by the process of the present invention, curve 49 shows the characteristics of the sample by the conventional dry method, and curve 50 shows the characteristics of the sample by the conventional coprecipitation method.

From FIG. 19, it is evident that as compared with the products by the conventional methods, the superconductor of an oxide system prepared by the process of the present invention undergoes a sharp transition to a superconducting state with the resistivity abruptly dropping to 0 when cooled. With respect to each sample, the onset temperature, the offset temperature and the transition temperature range are shown in Table 20. Further, the critical current density of each sample in the superconducting state (77.4 K) was obtained and shown in Table 20.

TABLE 20

| Example No. | Method for the preparation of the sample | Onset temp. (K.) | Offset temp. (K.) | Transition temperature range (K.) | Critical current density (A/cm$^2$) |
|---|---|---|---|---|---|
| Example 24 | Process of the present invention | 98.2 | 96.5 | 1.7 | 89.2 |
| Comparative Example 27 | Dry method | 97.0 | 93.6 | 3.4 | 42.5 |
| Comparative Example 28 | Coprecipitation method | 92.6 | 53.0 | 39.6 | — |

From the results in Table 20, it is evident that as compared with the products by the conventional methods, the superconductors of an oxide system prepared by the process of the present invention have practically excellent superconducting characteristics such that not only the temperature at which the resistivity drops completely to 0 is high, but also the range for the transition from the normal conducting state to the superconducting state is narrow, and the critical current density is very high. Whereas, with the products prepared by the conventional methods, particularly by the coprecipitation method, the offset temperature, the transition temperature range and the critical current density are all inadequate for practical application.

With respect to each of the three types of sintered product samples, the structural analysis was conducted by e.g. the X-ray diffraction method, whereby each of the products obtained by the process of the present invention was found to be a sintered product composed of a substantially uniform single phase of a so-called three-layer oxygen-deficient type perovskite structure. On the other hand, the products by the conventional dry method and the coprecipitation method were found to contain relatively large proportions of other phases in addition to the three-layer oxygen-deficient type perovskite structure. Especially the product by the coprecipitation method was found to have the ratio of elements deviated from the desired composition. Thus, the poor characteristics of the superconductors of an oxide system according to the conventional methods as shown in FIG. 19 and Table 20, are considered to be attributable to the deviation of the composition and the presence of other phases than the high temperature superconductive phase.

It has been found by the analysis (observation by means of a scanning type electron microscope) that in the process of the present invention, the gelled hydrolyzate composed mainly of a mixture containing the carboxylates of Y and Ba in the hydroxide of Cu and the sintered product thereof obtained by sintering at a temperature of from 200° to 500° C., are composed of pure unifom super fine particles of a few tens to a few hundreds Å. Namely, such a nature is considered to effectively serve to obtain the sintered product of the desired composition.

EXAMPLE 25 and COMPARATIVE EXAMPLES 29 and 30

So as to bring the composition of the desired superconductor of an oxide system to $(La_{0.92}Sr_{0.08})_2CuO_4$, lanthanum isopropoxide, copper ethoxide and yttrium stearate were added in a total amount of 50 g in 1,000 ml of ethanol and uniformly dissolved (partly dispersed). This solution was left to stand at room temperature for 10 days for gradual hydrolysis by the moisture in air to obtain a viscous gel. The gel was dried at 200° C. for one hour and then presintered at 900° C. for 2 hours. The presintered product thus obtained was pulverized and formed into a pellet in the same manner as in Example 24. The pellet was sintered in an oxygen stream at 950° C. for 6 hours to obtain a densely sintered product.

For the purpose of comparison, samples by the conventional dry method and the precipitation method were prepared by using $La_2O_3$, $SrCO_3$ and $CuO$ powders and nitrates of La, Sr and Cu, respectively, in the same manner as in Example 24 and presintered and sintered in the same manner as above to obtain sintered products.

With respect to the three types of samples, the temperature dependency of the resistivity and the critical current density were measured in the same manner as in Example 24. The results are shown in FIG. 20 and Table 21.

Figure 20:
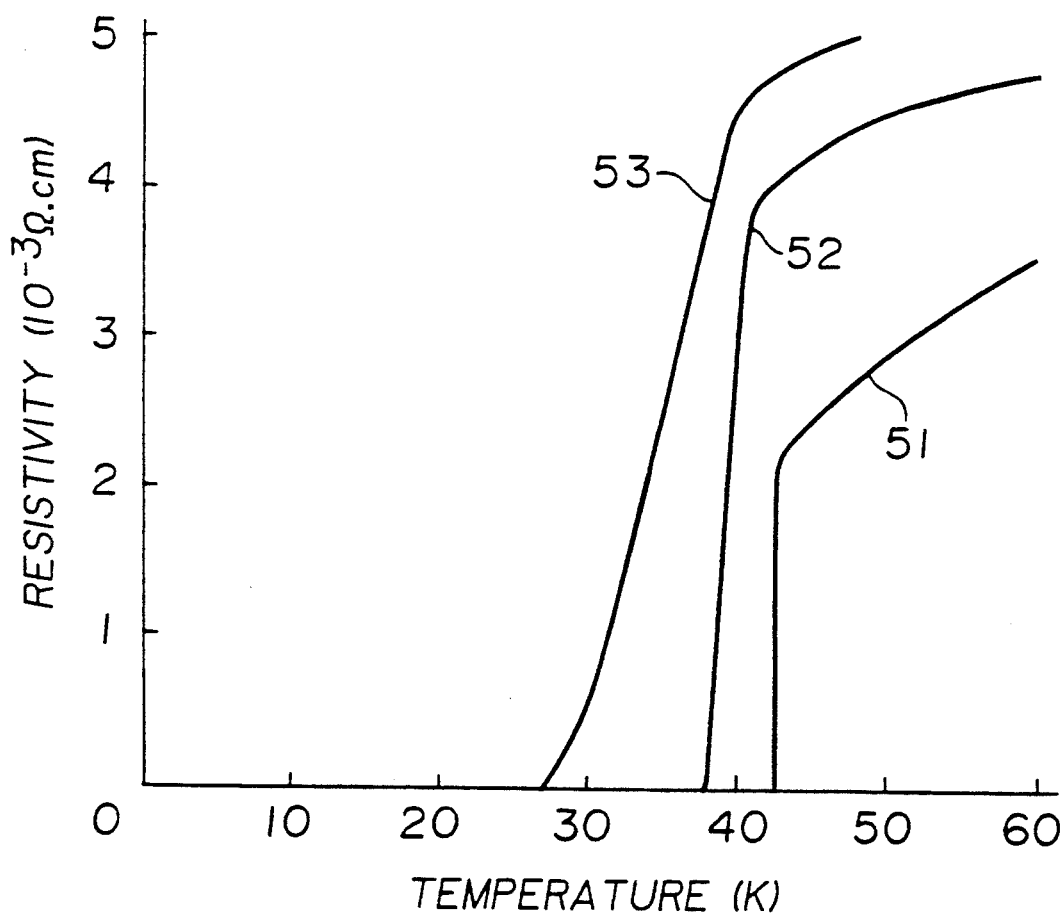
FIG. 20 is a graph showing the relation between the resistivity and the temperature of superconductors of an oxide system obtained in Example 25 (curve 51) and Comparative Examples 29 and 30 (curves 52 and 53).

In FIG. 20, curve 51 shows the characteristics by the process of the present invention, curve 52 shows the characteristics by the conventional dry method and curve 53 shows the characteristics by the conventional precipitation method. The critical current density is the value measured at the liquefied helium temperature (4.2 K).

by e.g. the same X-ray diffraction as used in Example 24.

EXAMPLE 26 and COMPARATIVE EXAMPLE 31

By using metal elements of at least one element selected from the group consisting of Mg, Ca, Sr and Ba of Group IIa of the Periodic Table, at least one element selected from the group consisting of Sc, Y and lanthanoids (lanthanum series) of Group IIIa of the Periodic Table and Cu, at least one metal element being in the form of alkoxides with the rest, if any, being in the form of carboxylates, experiments were conducted in the same manner as in Examples 24 and 25. The combinations used include, for example, La-Ba-Cu, Ho-Ba-Cu (Ho is holmium) and Y-La-Ba-Ca-Cu.

At the same time, for the purpose of the comparison, samples of sintered products having the same intended compositions as above were prepared by the conventional dry method and the coprecipitation method and evaluated.

As a result, it has been found that in each of the above combinations, a superconductor of an oxide system having a critical temperature of from 25 to 95 K can be prepared by the process of the present invention. In each case, the product by the process of the present invention had superior superconductivity as compared with the products by the conventional methods, as shown by the comparison between Examples 24 and 25 and Comparative Examples 27 to 30.

With respect to each of the samples used in Examples 24 to 26, the susceptibility was measured, whereby in each case, Meissner effects were observed at a temperature of not higher than the temperature at which the resistivity became 0.

EXAMPLE 27 and COMPARATIVE EXAMPLES 32 and 33

So as to bring the composition of the desired super-

TABLE 21

| Example No. | Method for the preparation of the sample | Onset temp. (K.) | Offset temp. (K.) | Transition temperature range (K.) | Critical current density (A/cm$^2$) |
|---|---|---|---|---|---|
| Example 25 | Process of the present invention | 43.7 | 42.6 | 1.1 | 127.0 |
| Comparative Example 29 | Dry method | 41.0 | 37.3 | 3.7 | 27.4 |
| Comparative Example 30 | Coprecipitation method | 40.0 | 26.9 | 13.1 | 15.1 |

From the results in FIG. 20 and Table 21, it is evident that as compared with the product by the conventional method, the superconductors of an oxide system prepared by the process of the present invention have practically excellent superconducting characteristics such that the critical temperature is high, the transition temperature range is narrow and the critical current density is high. Whereas, with the products prepared by the conventional two methods, the critical temperature, the transition temperature range and the critical current density are all inadequate for practical application.

The poor characteristics of the superconductors of an oxide system prepared by the conventional methods have been found to be attributable to the relatively large content of unwanted phases other than the high temperature superconductive phase, as a result of the analysis conductor of an oxide system to $(La_{0.9}Sr_{0.1})_2CuO_4$ lanthanum nitrate, strontium nitrate and copper dimethoxide (each having a purity of at least 99.999%) were used in a predetermined ratio. 3 g of copper dimethoxide was added to one liter of methyl alcohol and uniformly dispersed (partly dissolved). This dispersion was adjusted to 80° C. and then, hydrolyzed by a dropwise addition of a excess amount of deionized water (200 ml) over a period of one hour, whereby a brown gel was formed. To this solution containing the gel, lanthanum nitrate and strontium nitrate were added in predetermined amounts and uniformly mixed. Then, alcohol and water were evaporated by heating at 60° C. under stirring to obtain a mixture.

The mixture thus obtained was presintered in an oxygen stream at 900° C. for 4 hours to obtain a porous presintered product. The presintered product was pulverized in a mortar and formed into a pellet having a diameter of 10 mm and a thickness of 1.5 mm by means of a pelletizer. This pellet was sintered in an oxygen atmosphere at 900° C. for 8 hours to obtain a densely sintered product.

For the purpose of comparison, a mixture of $La_2O_3$, $SrCO_3$ and CuO powders and a precipitate formed by adding small amounts of ammonia and oxalic acid to an aqueous solution of nitrates of La, Sr and Cu, each prepared by using guaranteed reagents, were, respectively, presintered and sintered in the same manner as above, to obtain sintered products by the conventional dry method and the coprecipitation method.

With respect to each of the four types of samples, the temperature dependency of the resistivity was measured by a four terminal method. The results are shown in FIG. 21.

Figure 21:
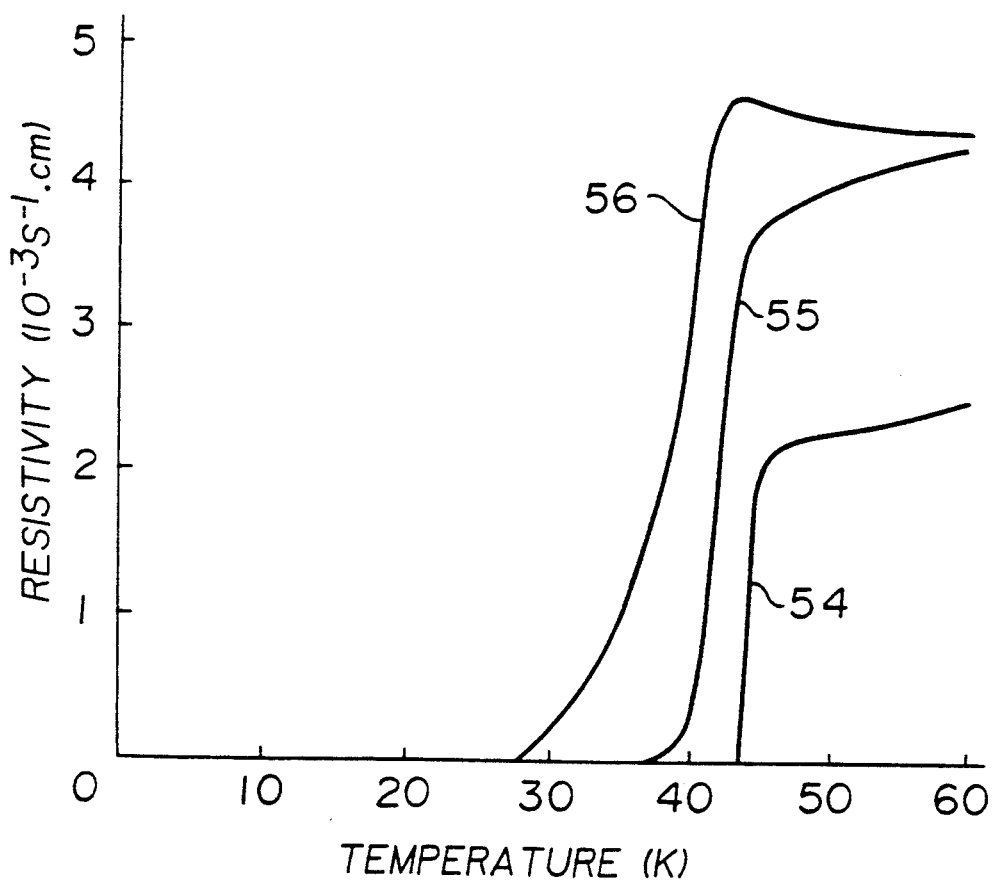
FIG. 21 is a graph showing the relation between the resistivity and the temperature of superconductors of an oxide system obtained in Example 27 (curve 54) and Comparative Examples 32 and 33 (curves 55 and 56).

In FIG. 21, curve 54 shows the characteristics of the sample prepared by the process of the present invention, curve 55 shows the characteristics of the sample by the conventional dry method and curve 56 shows the characteristics of the sample by the conventional coprecipitation method.

From FIG. 21, it is evident that as compared with the products by the conventional methods, the superconductor of an oxide system prepared by the process of the present invention undergoes a sharp transition to a superconducting state with an abrupt drop of the resistivity to 0 when cooled. With respect to each sample, the onset temperature, the offset temperature and the transition temperature range are shown in Table 22. Further, the critical current density of each sample in the liquefied helium temperature (4.3 K) was obtained and shown in Table 22.

contain perovskite structures of $ABO_3$ type (wherein A and B are metal elements) and relatively many other phases in addition to the $K_2NiF_4$ type phase. Especially the product by the coprecipitation method was found to have the ratio of elements deviated from the desired composition. Thus, the poor characteristics of the superconductors of an oxide system according to the conventional methods as shown in FIG. 21 and Table 22, are considered to be attributable to the deviation of the composition and the presence of other phases than the high temperature superconductive phase.

It has been found by the analysis (observation by means of a scanning type electron microscope) that in the process of the present invention, the gelled hydrolyzate composed mainly of copper hydroxide, lanthanum nitrate, and strontium nitrate formed by the hydrolysis and the sintered product thereof are composed of pure unifom super fine particles of a few tens to a few hundreds Å. Namely, such a nature is considered to effectively serve to obtain the sintered product of the desired composition.

EXAMPLE 28 and COMPARATIVE EXAMPLES 34 and 35

So as to bring the composition of the desired superconductor of an oxide system to $YBa_2Cu_3O_7$, $Y(n\text{-}OC_4H_9)_3$, $Ba(n\text{-}OC_5H_{11})_2$ and copper chloride were used in a predetermined ratio. $Y(n\text{-}OC_4H_9)_3$ and $Ba(n\text{-}OC_5H_{11})_2$ were added in a total amount of 20 g in 500 ml of butyl alcohol, and uniformly dispersed (partly dissolved) at 80° C. To this dispersion, 500 ml of distilled water containing 5 ml of ammonia was dropwise added over a period of one hour for hydrolysis, whereby a white gel was formed.

TABLE 22

| Example No. | Method for the preparation of the sample | Onset temp. (K.) | Offset temp. (K.) | Transition temperature range (K.) | Critical current density (A/cm$^2$) |
|---|---|---|---|---|---|
| Example 27 | Process of the present invention | 46.2 | 43.3 | 2.9 | 114.7 |
| Comparative Example 32 | Dry method | 43.6 | 37.3 | 6.3 | 27.4 |
| Comparative Example 33 | Coprecipitation method | 42.7 | 26.9 | 15.8 | 15.1 |

From the results in Table 22, it is evident that as compared with the products by the conventional methods, the superconductors of an oxide system prepared by the process of the present invention have practically excellent superconducting characteristics such that not only the temperature at which the resistivity drops completely to 0 is high, but also the range for the transition from the normal conducting state to the superconducting state is narrow, and the critical current density is very high. Whereas, with the products prepared by the conventional methods, particularly by the coprecipitation method, the offset temperature, the transition temperature range and the critical current density are all inadequate for practical application.

With respect to the three types of the sintered samples, the structural analysis was conducted by e.g. the X-ray diffraction, whereby the sample by the process of the present invention was found to be a sintered product comprising a substantially uniform single phase of so-called $K_2NiF_4$ type $(La_{0.9}Sr_{0.1})_2CuO_4$. On the other hand, the samples prepared by the conventional dry method and the coprecipitation method was found to To this fluid, copper chloride was added in a predetermined amount and uniformly mixed. Then, the mixture was left to stand at room temperature and in an atmosphere at 80° C. to evaporate water and alcohol. The dried product thus obtained, was preliminarily calcined in air at 500° C. for 2 hours and then presintered in an oxygen stream at 950° C. for 3 hours to obtain a coarse presintered product. The presintered product was pulverized and formed into a pellet in the same manner as in Example 27. This pellet was sintered in the same manner as in Example 27 in an oxygen stream at 950° C. for 8 hours to obtain a densely sintered product.

For the purpose of comparison, samples by the conventional dry method and by the coprecipitation method were prepared by using a mixture of $Y_2O_3$, $BaCO_3$ and CuO powders and nitrates of Y, Ba and Cu, which were all guaranteed reagents, respectively, and they were, respectively, presintered and sintered in the same manner as above to obtain two types of sintered products.

With respect to the three types of samples, the temperature dependency of the resistivity and the critical current density were measured in the same manner as in Example 27. The results are shown in FIG. 22 and Table 23.

Figure 22:
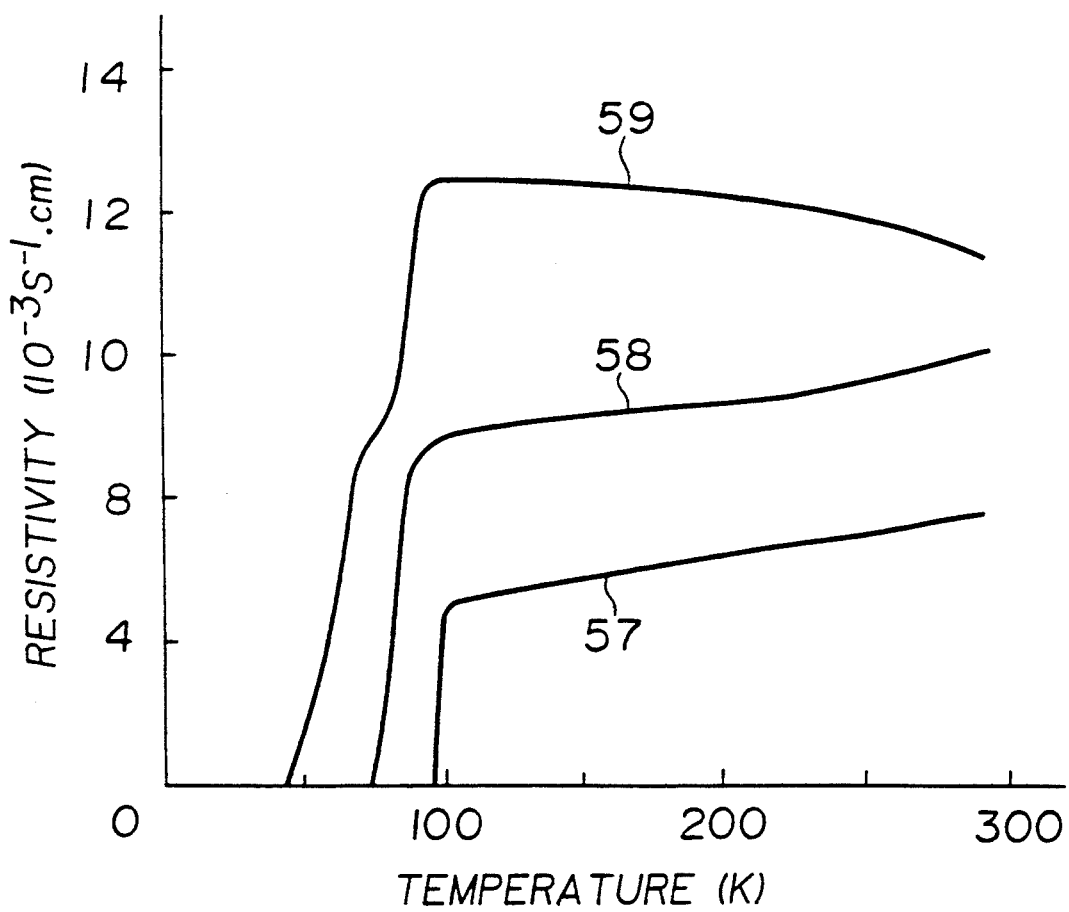
FIG. 22 is a graph showing the relation between the resistivity and the temperature of superconductors of an oxide system obtained in Example 28 (curve 57) and Comparative Examples 34 and 35 (curves 58 and 59).

In FIG. 22, curve 57 shows the characteristics by the process of the present invention, curve 58 shows the characteristics by the conventional dry method, and curve 59 shows the characteristics by the conventional coprecipitation method. Further the critical current density is a value measured at the liquefied nitrogen temperature (77.4 K).

TABLE 23

| Example No. | Method for the preparation of the sample | Onset temp. (K.) | Offset temp. (K.) | Transition temperature range (K.) | Critical current density (A/cm$^2$) |
|---|---|---|---|---|---|
| Example 28 | Process of the present invention | 99.2 | 95.9 | 3.3 | 102.7 |
| Comparative Example 34 | Dry method | 97.5 | 78.0 | 19.5 | 31.0 |
| Comparative Example 35 | Coprecipitation method | 92.5 | 41.9 | 50.6 | — |

From the results in FIG. 22 and Table 23, it is evident that as compared with the products by the conventional methods, the superconductors of an oxide system prepared by the process of the present invention have practically excellent superconducting characteristics such that the critical temperature is high, the transition temperature range is narrow and the critical current density is high. Whereas, with the products prepared by the conventional two methods, the critical temperature, the transition temperature range and the critical current density are all inadequate for practical application. Especially the product by the coprecipitation method did not show superconductivity at the liquefied nitrogen temperature (77.4 K) although the composition was the same as the other two samples.

The poor characteristics of the superconductor of an oxide system prepared by the conventional dry method have been found to be attributable to the relatively large content of unwanted phases other than the high temperature superconductive phase, as a result of the analysis by e.g. the same X-ray diffraction method as used in Example 27.

Further, with respect to each of the samples obtained in Examples 27 and 28, the susceptibility was measured, whereby in each case Meissner effects were observed at a temperature of not higher than the temperature at which the resistivity became 0.

EXAMPLE 29

Figure 23:
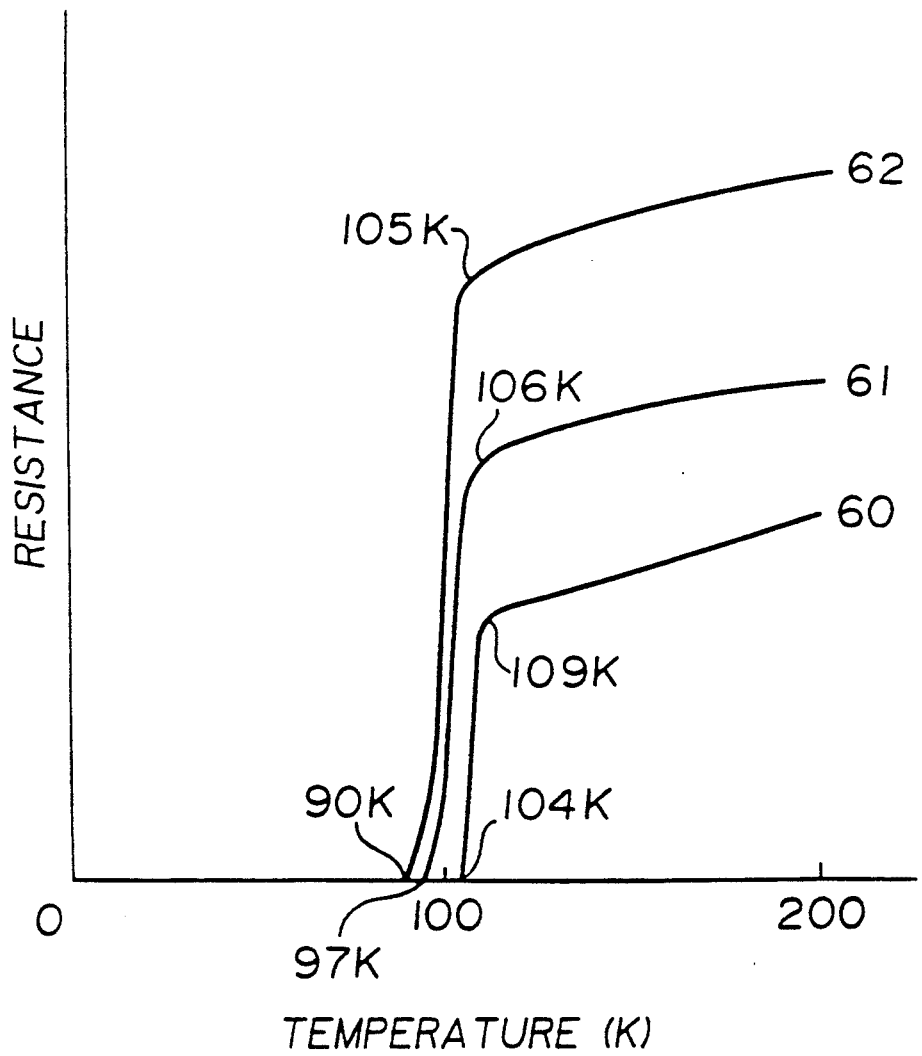
FIG. 23 is a graph showing the relation between the resistivity and the temperature of superconductors of an oxide system obtained in Examples 29 and 30 (curves 60 and 61) and Comparative Example 36 (curve 62).

So as to bring the composition of the desired Tl-Ca-Ba-Cu-O superconductor to $Tl_2Ca_2Ba_2Cu_3O_y$, thallium ethoxide TlOEt and butoxides of calcium, barium and copper i.e. $Ca(OC_4H_9)_2$, $Ba(OC_4H_9)_2$ and $cu(OC_4H_9)_2$ were added in a predetermined molar ratio in a total amount of 5 g in 500 ml of butanol, and uniformly suspended (partly dissolved) to obtain a mixed solution. The solution was refluxed for 24 hours. Then, 10 ml of distilled water was slowly added thereto, and the mixture was refluxed for 24 hours for hydrolysis, whereby an amorphous mixture of Tl, Ca, Ba and Cu was formed. Butanol was removed, and the mixture was dried at 300° C. and formed into a pellet by means of a pelletizer. This pellet was sintered in an oxygen stream at 850° C. for 30 minutes to obtain a densely sintered product. The temperature dependency of the resistance of this sintered product was measured by a DC four terminal method, whereby the results shown by the characteristic curve 60 in FIG. 23 (which is the characteristic figure showing the temperature dependency of the resistance) were obtained. In FIG. 23, the vertical axis indicates the resistance and the transverse axle indicates the temperature. It was found that the resistance became 0 at 104 K.

A study was made by changing the sintering temperature to 500° C., 600° C., 700° C. and 800° C., whereby it was found that even at 700° C., the crystallization proceeded adequately.

EXAMPLE 30

A small amount of butanol was added to the amorphous mixture comprising Tl, Ca, Ba and Cu obtained in Example 29. The mixture was coated on a single crystal substrate of magnesia, and sintered in an oxygen at 900° C. for one minute to obtain a coating film having a thickness of about 5 µm. The temperature dependency of this memebrane was measured, whereby the result shown by the characteristics curve 62 in FIG. 23 was obtained. It was found that the resistance became 0 at 97 K.

COMPARATIVE EXAMPLE 36

For the purpose of comparison, a mixture of $Tl_2O$, CaO, BaO and CuO powders which are all guaranteed reagents, was sintered in the same manner as in Example 29 to obtain a sintered product.

The temperature dependency of the resistance of the sintered product was as shown by characteristic curve 62 in FIG. 23. It was found that the resistance became 0 at 90 K.

From the above comparison, it is evident that as compared with the product of the conventional dry method, the superconductor of an oxide system obtained by the present invention is excellent not only in the superconducting characteristics but also in that the sintering can be conducted at a relatively low temperature. From the X-ray diffraction intensity, it was found that when the same sintering process was employed, the crystallization proceeded further by the present invention as compared with the conventional dry method.

In the above Example, the preparation of a superconductor of an oxide system was described with respect to a case wherein the molar ratio of Tl, Ca, Ba and Cu was 2:2:2:3. However, the present invention is not limited to a such specific molar ratio, and similar effects can be obtained with other molar ratios.

What is claimed is:

1. A process for producing an oxide superconductor, which comprises uniformly mixing metal elements for constituting the oxide superconductor in the form of alkoxides, at least a part of the alkoxides having $CN^-$, $X^-$, wherein X is a halogen atom and/or an amine, with the rest, if any, being in the form selected from the group consisting of acetylacetonates, carboxylates, carbonates, sulfates, hydroxides, sulfides and mixtures thereof, to obtain a homogeneous mixture, dissolving the alkoxides to form a solution of said alkoxides, hydrolyzing the alkoxides in said solution and sintering the resulting hydrolyzate, wherein the metal elements for constituting the oxide superconductor are at least one element selected from the group consisting of Mg, Ca, Sr and Ba of Group IIa of the Periodic Table, at least one element selected from the group consisting of Sc, Y and lanthanoids of Group IIIa of the Periodic Table, and Cu.

2. The process according to claim 1 wherein the alkoxide of said at least one element selected from the group consisting of Sc, Y and lanthanoids is an alkoxide having an alkoxy group with at least 3 carbon atoms.

3. The process according to claim 1, which comprises completely dissolving the alkoxides by adding a member selected from the group consisting of a carboxylic acid, sulfuric acid, carbonic acid, hydrochloric acid and nitric acid to the mixture, hydrolyzing the dissolved alkoxides by adding an alkali to the solution, washing the resulting mixture, and sintering the washed mixture.

4. The process according to claim 1, wherein at least a part of the alkoxides are alkoxides having $X^-$ wherein X is a halogen atom, hydrolyzing the alkoxides by adding an alkali and neutralizing the resulting hydrolyzate mixture by adding a member selected from the group consisting of a carboxylic acid, sulfinic acid, carbonic acid, hydrochloric acid and nitric acid, washing the resulting mixture, and sintering the washed mixture.

5. The process according to claim 4, wherein the carboxylic acid is acetic acid.

6. The process according to claim 1, which comprises hydrolyzing the dissolved alkoxides by adding at least one member selected from the group consisting of amines, ammonia and aminoalcohols to the solution to such an extent that the pH of the solution does not exceed 10, and then sintering the resulting hydrolyzate mixture.

7. The process according to claim 6, wherein the hydrolyzate mixture is washed prior to the sintering.

8. The process according to claim 1, wherein a fluid containing a hydrolyzate obtained by hydrolyzing alkoxides of at least one of said metal elements and a fluid containing a hydrolyzate obtained by hydrolyzing acetylacetonates of metal elements of at least the rest of said metal elements, are uniformly mixed to form the homogeneous mixture.

9. The process according to claim 8, wherein the hydrolysis of either said alkoxides or said acetylacetonates is conducted in the presence of a member selected from the group consisting of a carboxylic acid, sulfinic acid, carbonic acid, hydrochloric acid and nitric acid and the hydrolysis of the other metal elements is conducted in the presence of an alkali, and the fluids containing the respective hydrolyzates are mixed for neutralization, followed by washing.

10. The process according to claim 1, wherein a part of the metal elements are dissolved, dispersed or suspended in the form of the alkoxides with the rest of the metal elements being in the form of carboxylates, and the alkoxides in the solution, dispersion or suspension are hydrolyzed to obtain the homogeneous mixture.

* * * * *